United States Patent
Morikawa et al.

(10) Patent No.: US 7,009,892 B2
(45) Date of Patent: Mar. 7, 2006

(54) SEMICONDUCTOR MEMORY DEVICE AND PORTABLE ELECTRONIC APPARATUS

(75) Inventors: Yoshinao Morikawa, Ikoma (JP); Masaru Nawaki, Nara (JP); Hiroshi Iwata, Ikoma-gun (JP); Akihide Shibata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/850,896

(22) Filed: May 20, 2004

(65) Prior Publication Data

US 2004/0233714 A1  Nov. 25, 2004

(30) Foreign Application Priority Data

May 20, 2003  (JP) .............................. 2003-141750

(51) Int. Cl.
*G11C 7/00* (2006.01)
(52) U.S. Cl. .......................... 365/189.04; 365/189.01; 365/185.25
(58) Field of Classification Search ........... 365/189.01, 365/189.04, 185.25, 185.26
See application file for complete search history.

(56) References Cited

U.S. PATENT DOCUMENTS 5,424,979 A   6/1995  Morii
5,509,134 A   4/1996  Fandrich et al.
6,240,040 B1 * 5/2001  Akaogi et al.
6,740,927 B1 * 5/2004  Jeng ............................ 257/315

FOREIGN PATENT DOCUMENTS

JP          5-304277       * 11/1993

OTHER PUBLICATIONS

Office Action mailed Jun. 1, 2005 for U.S. Patent Application No. 10/851,709 filed May 20, 2004.

* cited by examiner

*Primary Examiner*—Gene N. Auduong
(74) *Attorney, Agent, or Firm*—Morrison & Foerster LLP

(57) ABSTRACT

A semiconductor memory device includes a control logic circuit for generating read selection signals each selecting one plane for reading and write selection signals each selecting one plane for writing from a plurality of planes in which memory cells are arranged in an array, an address selection circuit disposed for each of the planes, and an address buffer circuit for simultaneously providing a write address and a read address. Each of the address selection circuits is configured so as to be able to receive one of the read selection signals and one of the write selection signals from the control logic circuit. The memory cell includes a gate electrode formed over a semiconductor layer via a gate insulating film, a channel region disposed below the gate electrode, diffusion regions disposed on both sides of the channel region and having a conductive type opposite to that of the channel region, and memory functional units formed on both sides of the gate electrode and having the function of retaining charges.

15 Claims, 31 Drawing Sheets

SEMICONDUCTOR MEMORY DEVICE AND PORTABLE ELECTRONIC APPARATUS

BACKGROUND OF THE INVENTION

1. Field of the Invention

The present invention relates to a semiconductor memory device, a display and a portable electronic apparatus. More specifically, the present invention relates to a semiconductor memory device in which field-effect transistors each including a memory functional element having the function of retaining charges or polarization are arranged, and to a display and a portable electronic apparatus each having such a semiconductor memory device.

2. Description of the Related Art

Conventionally, a flash memory is typically used as a nonvolatile memory.

In a flash memory, as shown in FIG. 30, a floating gate 902, an insulating film 907 and a word line (control gate) 903 are formed in this order on a semiconductor substrate 901 via a gate insulating film. On both sides of the floating gate 902, a source line 904 and a bit line 905 are formed by a diffusion region, thereby configuring a memory cell. A device isolation region 906 is formed around the memory cell (see, for example, JP-A 05-304277 (1993)).

The memory cell stores information in accordance with an amount of charges in the floating gate 902. In a memory cell array configured by arranging memory cells, by selecting a specific word line and a specific bit line and applying a predetermined voltage, an operation of rewriting/reading a desired memory cell can be performed.

In such a flash memory, when the amount of charges in the floating gate changes, a drain current (Id)-gate voltage (Vg) characteristic as shown in FIG. 31 is exhibited. When the amount of negative charges in the floating gate increases, the threshold increases and the Id-Vg curve shifts almost in parallel in the Vg increasing direction.

In such a flash memory, however, the insulting film 907 which separates the floating gate 902 from the word line 903 is necessary from the viewpoint of functions and, in order to prevent leakage of charges from the floating gate 902, it is difficult to reduce the thickness of the gate insulating film. Consequently, it is difficult to effectively reduce the thickness of the insulating film 907 and the gate insulating film, and it disturbs reduction in the size of the memory cell.

SUMMARY OF THE INVENTION

The present invention has been achieved in consideration of the problems, and its object is to provide a finer semiconductor memory device and a portable electronic apparatus.

In order to achieve the above object, a semiconductor memory device according to the present invention comprises: N planes of a memory cell array in which memory cells are arranged in a matrix; and an address processing mechanism for providing simultaneous execution of reading and writing on the N planes, wherein in the simultaneous execution, in a period of the reading operation on only one of the N planes, the writing operation can be performed on only arbitrary one of the other N-1 planes, in a period of the writing operation on one of the N planes, the reading operation can be performed on only arbitrary one of the other N-1 planes, the address processing mechanism has: a control logic circuit for generating N read selection signals each selecting one of the N planes for the reading operation and N write selection signals each selecting one of the N planes for the writing operation; an address selection circuit disposed in each of the N planes; and an address buffer circuit for simultaneously providing a write address and a read address in order to access the memory cell array, each of the address selection circuits is configured so as to be able to receive one of the N read selection signals and one of the N write selection signals from the control logic circuit, a first part of each of the read address and the write address is supplied to the control logic circuit in order to generate the N read selection signals and the N write selection signals, a second part of each of the read address and the write address is supplied to each of the address selection circuits, and the memory cell includes a gate electrode formed over a semiconductor layer via a gate insulating film, a channel region disposed below the gate electrode, diffusion regions disposed on both sides of the channel region and having a conductive type opposite to that of the channel region, and memory functional units formed on both sides of the gate electrode and having the function of retaining charges. Herein, "writing" is a writing operation in contrast to "reading" and may include erasing operation.

In the semiconductor memory device according to the present invention, the memory cell includes a gate electrode formed over a semiconductor layer via a gate insulating film, a channel region disposed below the gate electrode, diffusion regions disposed on both sides of the channel region and having a conductive type opposite to that of the channel region, and memory functional elements formed on both sides of the gate electrode and having the function of retaining charges. A memory function of the memory functional element and a transistor operation function of the gate insulating film are separated from each other. Consequently, it is easy to suppress the short channel effect by thinning the gate insulating film while maintaining the sufficient memory function. Further, a value of current flowing between the diffusion regions changes by rewriting more largely than that in the case of an EEPROM. Therefore, it facilitates discrimination between the programming state and the erasing state of the semiconductor memory device.

Further, the memory cell in the semiconductor memory device according to the present invention can be formed by a process which is very compatible with a normal transistor forming process on the basis of the configuration. Therefore, as compared with the case of using a conventional flash memory as a nonvolatile memory cell and configuring the semiconductor memory device having a peripheral circuit which is usually made by a transistor, the number of masks and the number of processes can be dramatically reduced. Consequently, the yield in manufacturing of the semiconductor memory device having both the memory cell and the peripheral circuit can be improved. Accordingly, the manufacturing cost is reduced and a very-reliable, cheap semiconductor memory device can be obtained.

Further, since the semiconductor memory device according to the present invention has the address processing mechanism which provides simultaneous execution of reading and writing on the N planes, in a period of the reading operation on one of the N planes, the writing operation can be performed on only arbitrary one of the other N-1 planes and, in a period of the writing operation on one of the N planes, the reading operation can be performed on only arbitrary one of the other N-1 planes. Thus, restrictions on the writing operation during the reading operation period and restrictions on the reading operation during the writing operation period are largely eased, and an application range of the semiconductor memory device is much widened.

The present invention also provides a display and a portable electronic apparatus each having the semiconductor memory device.

With such a configuration, in the case of using the semiconductor memory device of the present invention for storing information for correcting variations in display after a display panel is manufactured, uniform picture quality can be obtained in products of the displays. Moreover, the process of simultaneously forming the memory cell and the logic circuit is simple, so that the manufacturing cost can be suppressed and the operation speed can be improved by high-speed reading operation. Thus, the cheap and high-performance display and the portable electronic apparatus can be obtained.

DETAILED DESCRIPTION OF THE INVENTION

Figure 1:
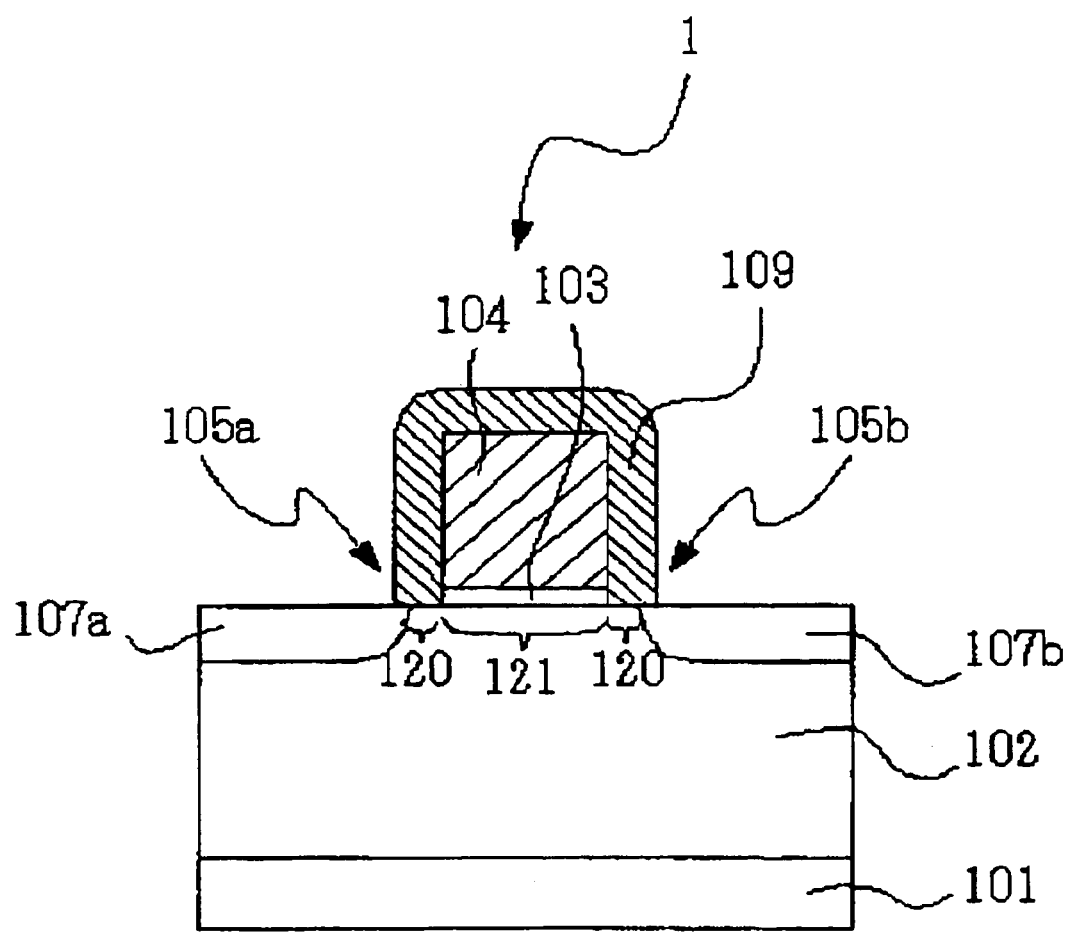
FIG. 1 is a schematic sectional view showing a main part of a memory cell (first embodiment) in a semiconductor memory device of the present invention.

A semiconductor memory device according to the present invention is mainly configured by a memory cell array in which memory cells are arranged in a matrix, a user interface circuit for receiving a command issued by an external user, and an array control circuit for executing an operation on the memory cell array.

A memory cell is mainly configured by a semiconductor layer, a gate insulating film, a gate electrode, a channel region, a diffusion region and a memory functional element.

Herein, the channel region is usually a region having the same conductive type as that of the semiconductor layer and denotes a region immediately below the gate electrode. The diffusion region denotes a region having a conductive type opposite to that of the channel region.

Specifically, although the memory cell of the present invention may be configured by a region of a first conductive type as a diffusion region, a region of a second conductive type as a channel region, a memory functional element disposed across the boundary of the regions of the first and second conductive types, and an electrode provided via a gate insulating film, it is proper that the nonvolatile memory cell of the present invention is configured by a gate electrode formed on a gate insulating film, two memory functional elements formed on both sides of the gate electrode, two diffusion regions disposed on the sides of the gate electrode opposite to the memory functional elements, and a channel region disposed below the gate electrode.

Preferably, the semiconductor device of the present invention is formed as the semiconductor layer on the semiconductor substrate, more preferably, on a well region of the first conductive type formed in the semiconductor substrate.

The semiconductor substrate is not particularly limited as long as it can be used for a semiconductor device. For example, a bulk substrate made of an element semiconductor such as silicon or germanium or a compound semiconductor such as silicon germanium, GaAs, InGaAs, ZnSe, or GaN can be mentioned. As a substrate having a semiconductor layer on its surface, various substrates such as an SOI (Silicon on Insulator) substrate, an SOS substrate and a multilayer SOI substrate, or a glass or plastic substrate having thereon a semiconductor layer may be used. In particular, a silicon substrate and an SOI substrate having a silicon layer on its surface are preferable. The semiconductor substrate or semiconductor layer may be single crystal (formed by, for example, epitaxial growth), polycrystal, or amorphous although an amount of current flowing therein varies a little.

On the semiconductor layer, preferably, a device isolation region is formed. Further, a single layer or multilayer structure may be formed by a combination of devices such as a transistor, a capacitor and a resistor, a circuit formed by the devices, a semiconductor device, and an interlayer insulating film. The device isolation region can be formed by any of various device isolation films such as an LOCOS film, a trench oxide film and an STI film. The semiconductor layer may be of the P or N conductive type. In the semiconductor layer, preferably, at least one well region of the first conductive type (P or N type) is formed. As impurity concentration in the semiconductor layer and the well region, impurity concentration which is within a known range in this field can be used. In the case of using the SOI substrate as the semiconductor layer, the well region may be formed in the surface semiconductor layer or a body region may be provided below a channel region.

The gate insulating film is not particularly limited as long as it can be usually used for a semiconductor device. For example, a single-layer film or a multilayer film of an insulating film such as a silicon oxide film or a silicon nitride film, and a high-dielectric-constant film such as an aluminum oxide film, a titanium oxide film, a tantalum oxide film, or a hafnium oxide film can be used. Particularly, a silicon oxide film is preferred. A proper thickness of the gate insulating film is, for example, about 1 to 20 nm, preferably, about 1 to 6 nm. The gate insulating film may be formed only immediately below the gate electrode or formed so as to be larger (wider) than the gate electrode.

The gate electrode is formed in a shape which is usually used for a semiconductor device or a shape having a recess in a lower end on the gate insulating film. Although it is preferable that the gate electrode be formed in an integral form without being separated by a single-layer or multilayer conductive film, the gate electrode may be also disposed in a state where it is separated by a single-layered or multilayer conductive film. The gate electrode may have a sidewall insulating film on its sidewalls. The gate electrode is not particularly limited as long as it is used for a semiconductor device. The gate electrode is formed by a single-layer or multilayer film made by a conductive film, for example, polysilicon, a metal such as copper or aluminum, a high-refractory metal such as tungsten, titanium or tantalum, and a silicide or the like with the high refractory metal. A proper film thickness of the gate electrode is, for example, about 50 to 400 nm. Under the gate electrode, a channel region is formed.

Preferably, the gate electrode is formed only on the sidewalls of the memory functional element or does not cover the top portion of the memory functional element. By such arrangement, a contact plug can be disposed closer to the gate electrode, so that reduction in the size of the memory cell is facilitated. It is easy to manufacture the memory cell having such simple arrangement, so that the yield in manufacturing can be improved.

The memory functional element has at least the function of retaining charges (hereinafter, described as "charge retaining function"). In other words, the memory functional element has the function of accumulating and retaining charges, the function of trapping charges, or the function of holding a charge polarization state. The function is exhibited, for example, when the memory functional element includes a film or region having the charge retaining function. Elements having the function are: silicon nitride; silicon; a silicate glass including impurity such as phosphorus or boron; silicon carbide; alumina; a high dielectric material such as hafnium oxide, zirconium oxide or tantalum oxide; zinc oxide; ferroelectric; metals, and the like. Therefore, the memory functional element can be formed by, for example, a single-layer or multilayer structure of: an insulating film including a silicon nitride film; an insulating film having therein a conductive film or a semiconductor layer; an insulating film including at least one conductor or semiconductor dot; or an insulating film including a ferroelectric film of which inner charge is polarized by an electric field and in which the polarized state is held. Particularly, the silicon nitride film is preferable for the reasons that the silicon nitride film can obtain a large hysteretic characteristic since a number of levels of trapping charges exist. In addition, the charge retention time is long and a problem of charge leakage due to occurrence of a leak path does not occur, so that the retaining characteristics are good. Further, silicon nitride is a material which is normally used in an LSI process.

By using the insulating film including a film having the charge retaining function such as a silicon nitride film as the memory functional element, reliability of retention of information can be increased. Since the silicon nitride film is an insulator, even in the case where a charge leak occurs in part of the silicon nitride film, the charges in the whole silicon nitride film are not lost immediately. In the case of arranging a plurality of sidewall memory cells, even if the distance between the memory cells is shortened and neighboring memory functional elements come into contact with each other, unlike the case where the memory functional elements are made of conductors, information stored in the memory functional elements is not lost. Further, a contact plug can be disposed closer to the memory functional element. In some cases, the contact plug can be disposed so as to overlap with the memory functional element. Thus, reduction in the size of the memory cell is facilitated.

In order to increase the reliability of retention of information, the film having the charge retaining function does not always have to have a film shape. Preferably, films having the charge retaining function exist discretely in an insulating film. Specifically, it is preferable that the films having the charge retaining function in the shape of dots be spread in a material which is hard to retain charges, for example, in a silicon oxide.

In the case of using a conductive film or semiconductor layer as the charge retaining film, preferably, the conductive film or semiconductor layer is disposed via an insulating film so that the charge retaining film is not in direct contact with the semiconductor layer (semiconductor substrate, well region, body region, source/drain regions or diffusion region) or a gate electrode. For example, a lamination structure of the conductive film and the insulating film, a structure in which conductive films in the form of dots are spread in the insulating film, a structure in which the conductive film is disposed in a part of a sidewall insulating film formed on sidewalls of the gate, and the like can be mentioned.

It is preferable to use the insulating film having therein the conductive film or semiconductor layer as a memory functional element for the reason that an injection amount of charges into the conductor or semiconductor can be freely controlled and multiple values can be easily obtained.

Further, it is preferable to use the insulating film including at least one conductor or semiconductor dot as the memory functional element for the reason that it becomes easier to perform programming and erasing by direct tunneling of charges, and reduction in power consumption can be achieved.

Alternatively, as a memory functional element, a ferroelectric film such as PZT or PLZT in which the polarization direction changes according to the electric field may be used. In this case, charges are substantially generated in the surface of the ferroelectric film by the polarization and are held in that state. It is therefore preferable since the ferroelectric film can obtain a hysteresis characteristic similar to that of a film to which charges are supplied from the outside of the film having the memory function and which traps charges. In addition, it is unnecessary to inject charges from the outside of the film in order to retain charges in the ferroelectric film, and the hysteresis characteristic can be obtained only by the polarization of the charge in the film, so that programming/erasing can be performed at high speed.

As the insulating film configuring the memory functional element, a film having a region of suppressing escape of charges or the function of suppressing escape of charges is appropriate. One of films having the function of suppressing escape of charges is a silicon oxide film.

The charge retaining film included in the memory functional element is disposed on both sides of the gate electrode directly or via an insulating film, and is disposed on the semiconductor layer (semiconductor substrate, well region, body region or source/drain region or diffusion region) directly or via a gate insulating film. Preferably, the charge retaining film on both sides of the gate electrode is formed so as to cover all or part of the sidewalls of the gate electrode directly or via the insulating film. In an application example, in the case where the gate electrode has a recess in its lower end, the charge retaining film may be formed so as to completely or partially bury the recess directly or via an insulating film.

The diffusion regions can function as source and drain regions and have the conductive type opposite to that of the semiconductor layer or well region. In the junction between the diffusion region and the semiconductor layer or well region, preferably, impurity concentration is high for the reason that hot electrons or hot holes are generated efficiently with low voltage, and high-speed operation can be performed with lower voltage. The junction depth of the diffusion region is not particularly limited but can be properly adjusted in accordance with the performance or the like of a semiconductor memory device to be obtained. In the case of using an SOI substrate as a semiconductor substrate, the diffusion region may have a junction depth smaller than the thickness of the surface semiconductor layer. Preferably, the diffusion region has junction depth almost the same as the thickness of the surface semiconductor layer.

The diffusion region may be disposed so as to overlap an end of the gate electrode, so as to match an end of the gate electrode, or so as to be offset from the gate electrode end. The case where the diffusion region is offset is particularly preferable because easiness of inversion of the offset region below the charge retaining film largely changes in accordance with an amount of charges accumulated in the memory functional element when voltage is applied to the gate electrode, the memory effect increases, and a short channel effect is reduced. However, when the diffusion region is offset too much, drive current between the diffusion regions (source and drain) decreases conspicuously. Therefore, it is preferable that the offset amount, that is, the distance from one of the gate electrode terminals to the closer diffusion area in the gate length direction be shorter than the thickness of the charge retaining film extending in the direction parallel with the gate length direction. It is particularly important that at least a part of the film or region having the charge retaining function in the memory functional element overlaps with a part of the diffusion region. This is because the essence of the memory cell as a component of the semiconductor memory device of the present invention is to rewrite stored information by an electric field which is applied across the memory functional element in accordance with the voltage difference between the gate electrode which exists only in the sidewall portion of the memory functional element and the diffusion region.

Apart of the diffusion region may extend at a level higher than the surface of the channel region, that is, the lower face of the gate insulating film. In this case, it is proper that, on the diffusion region formed in the semiconductor substrate, the conductive film is laminated so as to be integrated with the diffusion region. The conductive film is made of a semiconductor such as polysilicon or amorphous silicon, silicide, the above-mentioned metals, high-refractory metals, or the like. In particular, polysilicon is preferred. Since impurity diffusion speed of polysilicon is much faster than that of the semiconductor layer, it is easy to make the junction depth of the diffusion region in the semiconductor layer shallow and to suppress the short channel effect. In this case, preferably, a part of the diffusion region is disposed so as to sandwich at least a part of the memory functional element in cooperation with the gate electrode.

The memory cell of the present invention can be formed by a normal semiconductor process in accordance with, for example, a method similar to the method of forming the sidewall spacer having the single-layer or multilayer structure on the sidewalls of the gate electrode. Specific examples are: a method of forming the gate electrode, after that, forming a single-layer film or multilayer film including the charge retaining film such as a film having the function of retaining charges (hereinafter, described as "charge retaining film"), charge retaining film/insulating film, insulating film/charge retaining film, or insulating film/charge retaining film/insulating film, and etching back the formed film under proper conditions so as to leave the films in a sidewall spacer shape; a method of forming an insulating film or charge retaining film, etching back the film under proper conditions so as to leave the film in the sidewall spacer shape, further forming the charge retaining film or insulating film, and similarly etching back the film so as to leave the film in the sidewall spacer shape; a method of applying or depositing an insulating film material in which particles made of a charge retaining material are spread on the semiconductor layer including the gate electrode, and etching back the material under proper conditions so as to leave the insulating film material in a sidewall spacer shape; and a method of forming a gate electrode, after that, forming the single-layer film or multilayer film, and patterning the film with a mask. According to another method, before the gate electrode is formed, the charge retaining film, charge retaining film/insulating film, insulating film/charge retaining film, insulating film/charge retaining film/insulating film, or the like is formed. An opening is formed in a region which becomes the channel region of the films, a gate electrode material film is formed on the entire surface, and the gate electrode material film is patterned in a shape including the opening and larger than the opening.

In the case of configuring the memory cell array by arranging memory cells of the present invention, the best mode of the memory cell satisfies all of the following requirements: (1) the gate electrodes of a plurality of memory cells are integrated and have the function of a word line, (2) the memory functional elements are formed on both sides of the word line, (3) an insulator, particularly, a silicon nitride film retains charges in the memory functional element, (4) the memory functional element is configured by an ONO (Oxide Nitride Oxide) film and the silicon nitride film has a surface almost parallel with the surface of the gate insulating film, (5) a silicon nitride film in the memory functional element is isolated from a word line and a channel region by a silicon oxide film, (6) the silicon nitride film in the memory functional element and a diffusion region overlap with each other, (7) the thickness of the insulating film separating the silicon nitride film having the surface which is almost parallel with the surface of the gate insulating film from the channel region or semiconductor layer and the thickness of the gate insulating film are different from each other, (8) an operation of programming/erasing one memory cell is performed by a single word line, (9) there is no electrode (word line) having the function of assisting the programming/erasing operation on the memory functional element, and (10) in a portion in contact with the diffusion region immediately below the memory functional element, a region of high concentration of impurity whose conductive type is opposite to that of the diffusion region is provided. It may be sufficient for the memory cell to satisfy at least one of the requirements.

A particularly preferable combination of the requirements is that, for example, (3) an insulator, particularly, a silicon nitride film holds charges in the memory functional element, (6) the insulating film (silicon nitride film) in the memory functional element and the diffusion region overlap with each other, and (9) there is no electrode (word line) having the function of assisting the programming/erasing operation on the memory functional element.

In the case where the memory cell satisfies the requirements (3) and (9), it is very useful for the following reasons. First, the bit line contact can be disposed closer to the memory functional element on the word line sidewall or even when the distance between memory cells is shortened, a plurality of memory functional elements do not interfere with each other, and stored information can be held. Therefore, reduction in the size of the memory cell is facilitated. In the case where the charge retaining region in the memory functional element is made of a conductor, as the distance between memory cells decreases, interference occurs between the charge retaining regions due to capacitive coupling, so that stored information cannot be held.

In the case where the charge retaining region in the memory functional element is made of an insulator (for example, a silicon nitride film), it becomes unnecessary to make the memory functional element independent for each memory cell. For example, the memory functional elements formed on both sides of a single word line shared by a plurality of sidewall memory cells do not have to be isolated for each memory cell. The memory functional elements formed on both sides of one word line can be shared by a plurality of memory cells sharing the word line. Consequently, a photo etching process for isolating the memory functional element becomes unnecessary, and the manufacturing process is simplified. Further, a margin for positioning in the photolithography process and a margin for film reduction by etching become unnecessary, so that the margin between neighboring memory cells can be reduced. Therefore, as compared with the case where the charge retaining region in the memory functional element is made of a conductor (for example, polysilicon film), even when the memory functional element is formed at the same microfabrication level, a memory cell occupied area can be reduced. In the case where the charge retaining region in the memory functional element is made of a conductor, the photo etching process for isolating the memory functional element for each memory cell is necessary, and a margin for positioning in the photolithography process and a margin for film reduction by etching are necessary.

Moreover, since the electrode having the function of assisting the programming and erasing operations does not exist on the memory functional element and the device structure is simple, the number of processes decreases, so that the yield in manufacturing can be increased. Therefore, it facilitates formation with a transistor as a component of a logic circuit or an analog circuit, and a cheap semiconductor memory device can be obtained.

The present invention is more useful in the case where not only the requirements (3) and (9) but also the requirement (6) are satisfied. Specifically, by overlapping the charge retaining region in the memory functional element with the diffusion region, programming and erasing can be performed with a very low voltage. Specifically, with a low voltage of 5 V or less, the programming and erasing operations can be performed. The action produces a very large effect also from the viewpoint of circuit designing. Since it becomes unnecessary to generate a high voltage in a chip unlike a flash memory, a charge pumping circuit requiring a large occupation area can be omitted or its scale can be reduced. Particularly, when a memory of small-scale capacity is provided for adjustment in a logic LSI, as for an occupied area in a memory, an occupation area of peripheral circuits for driving a memory cell is dominant more than that of a memory cell. Consequently, omission or down sizing of the charge pumping circuit for a memory cell is most effective to reduce the chip size.

On the other hand, in the case where the requirement (3) is not satisfied, that is, in the case where a conductor retains charges in the memory functional element, even if the requirement (6) is not satisfied, specifically, even if the conductor in the memory functional element and the diffusion region do not overlap with each other, programming operation can be performed. This is because that the conductor in the memory functional element assists programming operation by capacitive coupling with the gate electrode.

In the case where the requirement (9) is not satisfied, specifically, in the case where the electrode having the function of assisting the programming and erasing operations exists on the memory functional element, even if the requirement (6) is not satisfied, specifically, even if the insulator in the memory functional element and the diffusion region do not overlap with each other, programming operation can be performed.

In the semiconductor memory device of the present invention, a transistor may be connected in series with one of or both sides of a memory cell, or the memory cell may be mounted on the same chip with a logic transistor. In such a case, the semiconductor device of the present invention, particularly, the memory cell can be formed by a process having high compatibility with a process of forming a normal standard transistor such as a transistor or a logic transistor, so that they can be formed simultaneously. Therefore, a process of forming both the memory cell and a transistor or a logic transistor is very simple and, as a result, a cheap embedding device can be obtained.

In the semiconductor memory device of the present invention, the memory cell can store information of two or more values in one memory functional element. Thus, the memory cell can function as a memory cell for storing information of four or more values. The memory cell may store binary data only. The memory cell is also allowed to function as a memory cell having the functions of both a selection transistor and a memory transistor by a variable resistance effect of the memory functional element.

The semiconductor memory device of the present invention can be widely applied by being combined with a logic device, a logic circuit or the like to: a data processing system such as a personal computer, a note-sized computer, a laptop computer, a personal assistant/transmitter, a mini computer, a workstation, a main frame computer, a multiprocessor/computer, or a computer system of any other type; an electronic component configuring the data processing system, such as a CPU, a memory or a data memory device; a communication apparatus such as a telephone, a PHS, a modem or a router; an image display apparatus such as a display panel or a projector; a business apparatus such as a printer, a scanner or a copier; an image pickup apparatus such as a video camera or a digital camera; an entertainment apparatus such as a game machine or a music player; an information apparatus such as a portable information terminal, a watch or an electronic dictionary; a vehicle-mounted apparatus such as a car navigation system or a car audio system; an AV apparatus for recording/reproducing information such as a motion picture, a still picture or music; an appliance such as a washing machine, a microwave, a refrigerator, a rice cooker, a dish washer, a vacuum cleaner or an air conditioner; a health managing apparatus such as a massage machine, a bathroom scale or a manometer; and an electronic apparatus such as a portable memory device such as an IC card or a memory card. Particularly, it is effective to apply the semiconductor memory device to portable electronic apparatuses such as portable telephone, portable information terminal, IC card, memory card, portable computer, portable game device, digital camera, portable motion picture player, portable music player, electronic dictionary and watch. The semiconductor memory device of the present invention may be provided as at least a part of a control circuit or a data storing circuit of an electronic apparatus or, if necessary, detachably assembled.

Embodiments of the semiconductor memory device, the display and the portable electronic apparatus according to the present invention will be described below with reference to the drawings.

First Embodiment

A semiconductor memory device of a first embodiment has a memory cell 1 as shown in FIG. 1.

The memory cell 1 has a gate electrode 104 formed on a P-type well region 102 formed on the surface of a semiconductor substrate 101 via a gate insulating film 103. On the top face and side faces of the gate electrode 104, a silicon nitride film 109 having a trap level of retaining charges and serving as a charge retaining film is disposed. In the silicon nitride film 109, parts of both sidewalls of the gate electrode 104 serve as memory functional elements 105a and 105b for actually retaining charges. The memory functional element refers to a part in which charges are actually accumulated by rewriting operation in the memory functional element or the charge retaining film. In the P-type well region 102 on both sides of the gate electrode 104, N-type diffusion regions 107a and 107b functioning as a source region and a drain region, respectively, are formed. Each of the diffusion regions 107a and 107b has an offset structure. Specifically, the diffusion regions 107a and 107b do not reach a region 121 below the gate electrode 104, and offset regions 120 below the charge retaining film configure a part of the channel region.

Figure 2A:
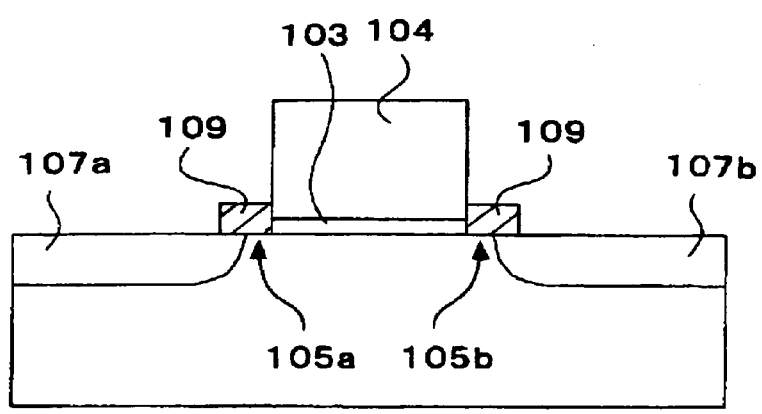
FIGS. 2A and 2B are schematic sectional views each showing a main part of a modification of the memory cell (first embodiment) in the semiconductor memory device of the present invention.
Figure 2B:
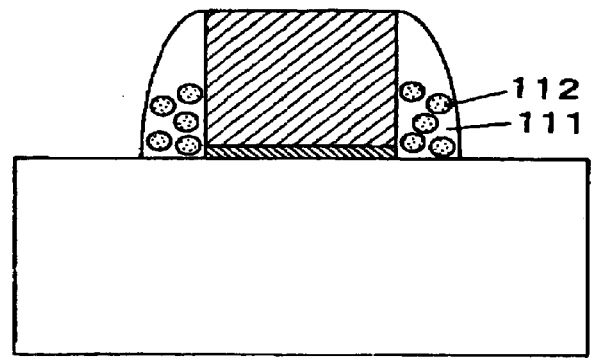

The memory functional elements 105a and 105b for substantially retaining charges are side wall parts of the gate electrode 104. Therefore, it is sufficient that the silicon nitride film 109 is formed only in regions corresponding to the parts (see FIG. 2A). The memory functional elements 105a and 105b may have a structure in which particles 111 made of conductor or semiconductor having a nanometer size are distributed in an insulating film 112 (see FIG. 2B). When the size of the particle 111 is less than 1 nm, the quantum effect is too large and it becomes difficult for charges to tunnel dots. When the size exceeds 10 nm, however, a noticeable quantum effect does not appear at room temperature. Therefore, the diameter of the particle 111 lies preferably in the range from 1 nm to 10 nm. Further, the silicon nitride film 109 serving as a charge retaining film may be formed in the side wall spacer shape on side faces of the gate electrode (see FIG. 3).

The principle of the programming operation of the memory cell will be described with reference to FIGS. 3 and 4. The case where whole memory functional elements 131a and 131b have the function of retaining charges will be described. "Programming" denotes here injection of electrons into the memory functional elements 131a and 131b when the memory cell is of the N channel type. Hereinafter, on assumption that the memory cell is of the N channel type, description will be given.

Figure 3:
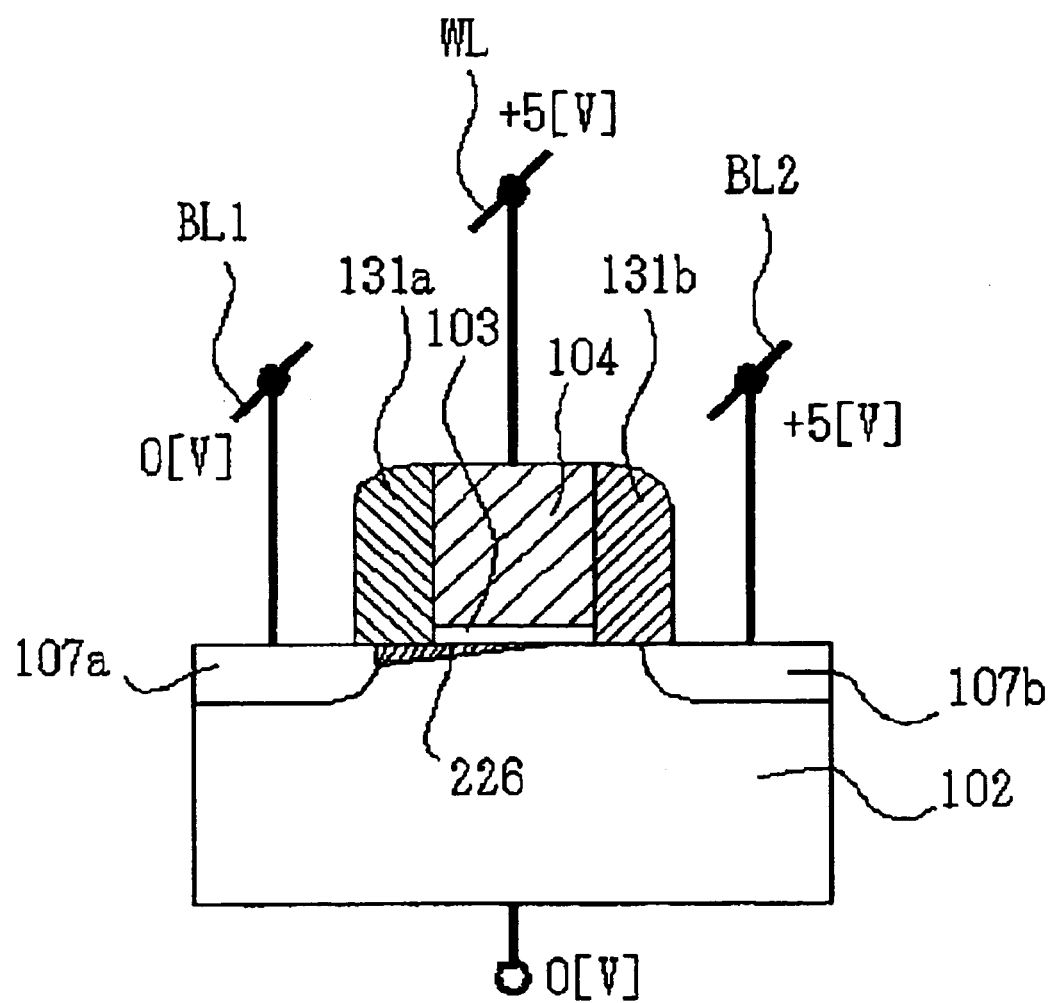
FIG. 3 is a diagram showing a programming operation of the memory cell (first embodiment) in the semiconductor memory device of the present invention.

In order to inject electrons (to program) into the second memory functional element 131b, as shown in FIG. 3, the first diffusion region 107a of the N-type is set as the source electrode, and the second diffusion region 107b of the N-type is set as the drain electrode. For example, 0 V is applied to the first diffusion region 107a and the P-type well region 102, +5 V is applied to the second diffusion region 107b, and +5 V is applied to the gate electrode 104. With such voltage parameters, an inversion layer 226 extends from the first diffusion region 107a (source electrode), but does not reach the second diffusion region 107b (drain electrode), so that a pinch-off point is generated. Electrons are accelerated from the pinch-off point to the second diffusion region 107b (drain electrode) by high electric field and become so-called hot electrons (conductive electrons of high energy). The hot electrons are injected into the second memory functional element 131b, thereby performing programming. Since hot electrons are not generated in the vicinity of the first memory functional element 131a, programming is not performed.

Figure 4:
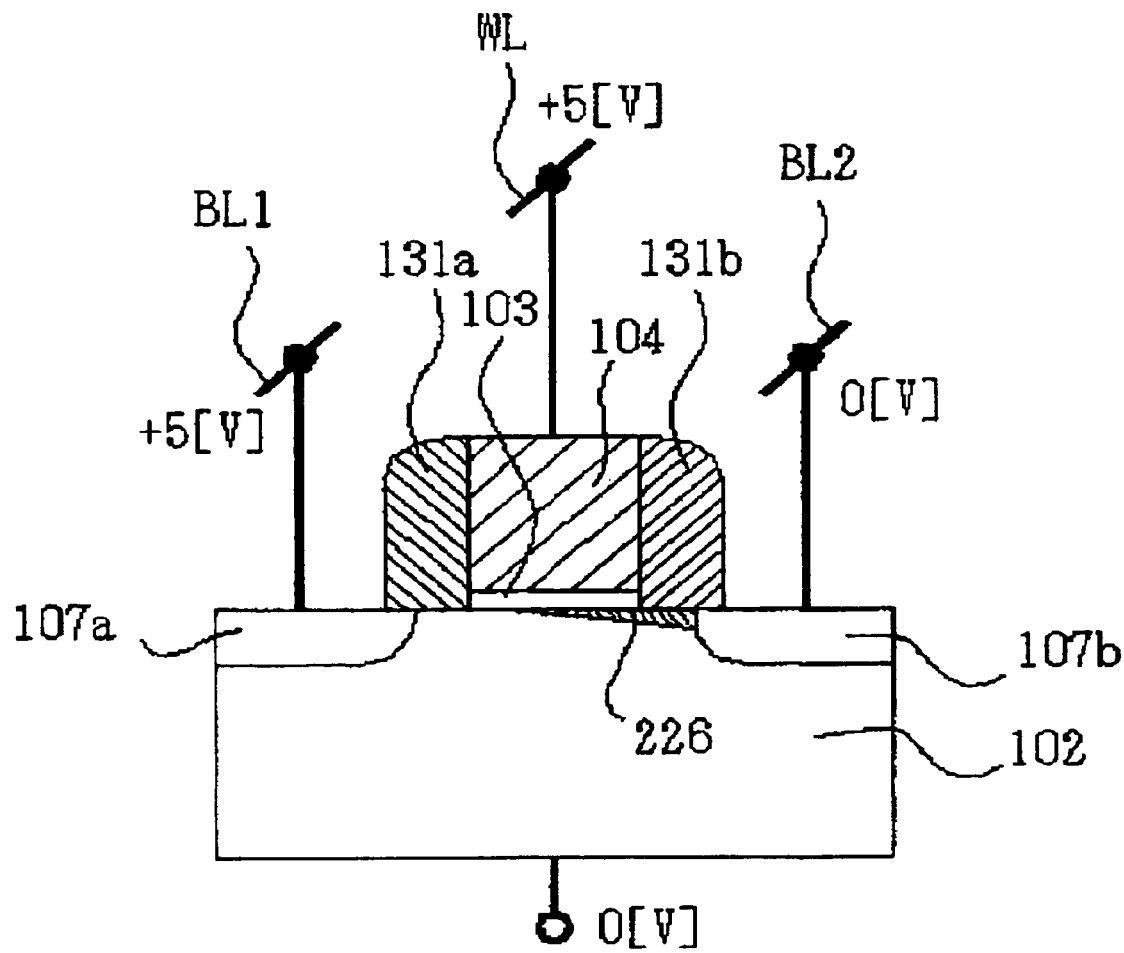
FIG. 4 is a diagram showing the programming operation of the memory cell (first embodiment) in the semiconductor memory device of the present invention.

On the other hand, in order to inject electrons (to program) into the first memory part 131a, as shown in FIG. 4, the second diffusion region 107b is set as the source electrode, and the first diffusion region 107a is set as the drain electrode. For example, 0 V is applied to the second diffusion region 107b and the P-type well region 102, +5 V is applied to the first diffusion region 107a, and +5 V is applied to the gate electrode 104. As described above, by interchanging the source and drain regions in the case of injecting electrons into the second memory functional element 131b, programming can be performed by injecting electrons into the first memory functional element 131a.

The principle of erasing operation of the memory cell will now be described with reference to FIGS. 5 and 6.

Figure 5:
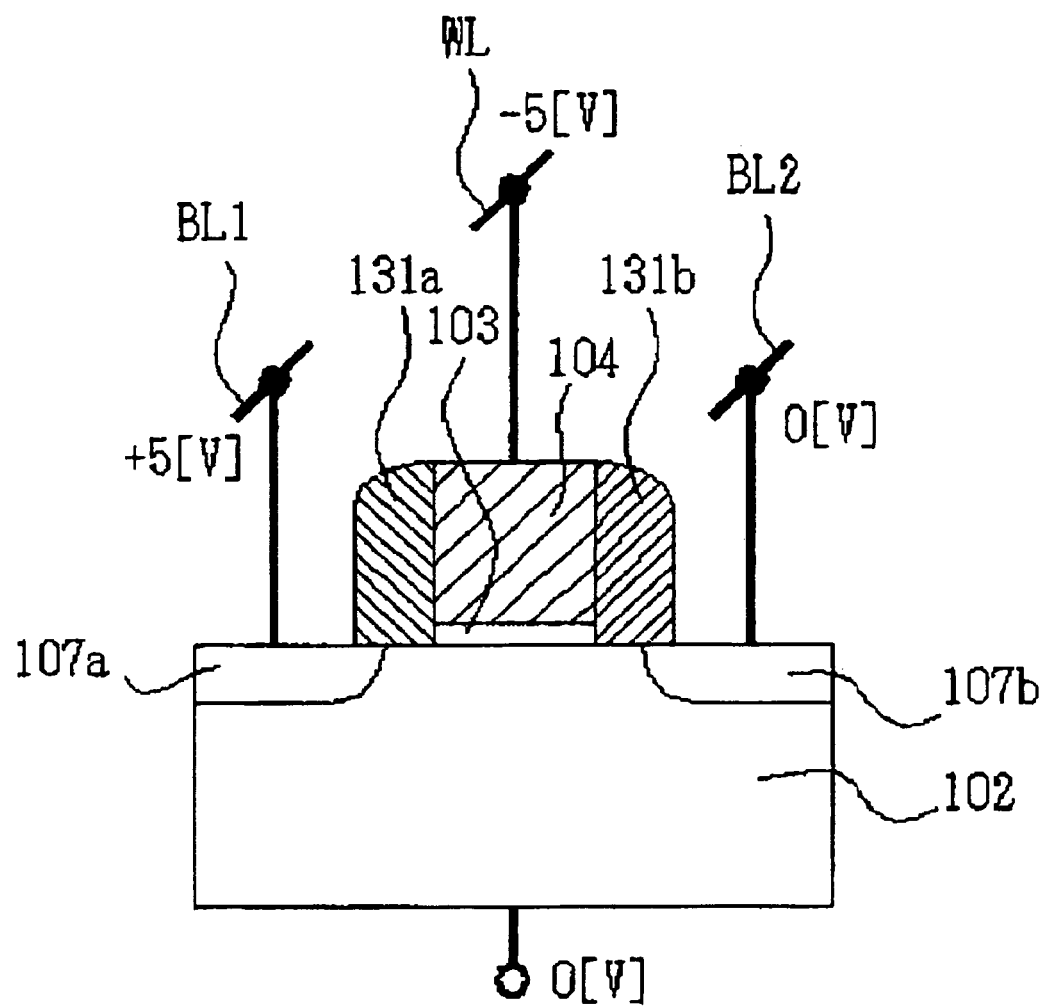
FIG. 5 is a diagram showing an erasing operation of the memory cell (first embodiment) in the semiconductor memory device of the present invention.

In a first method of erasing information stored in the first memory functional element 131a, as shown in FIG. 5, a positive voltage (for example, +5 V) is applied to the first diffusion region 107a, 0 V is applied to the P-type well region 102, a backward bias is applied to the PN junction between the first diffusion region 107a and the P-type well region 102, and a negative voltage (for example, −5 V) is applied to the gate electrode 104. At this time, in the vicinity of the gate electrode 104 in the PN junction, due to the influence of the gate electrode to which the negative electrode is applied, the gradient of potential becomes particularly sharp. Due to this, hot holes (positive holes of high energy) are generated on the side of the P-type well region 102 in the PN junction by interband tunneling. The hot holes are attracted by the gate electrode 104 having the negative potential and, as a result, holes are injected into the first memory functional element 131a. In such a manner, information in the first memory functional element 131a is erased. At this time, it is sufficient to apply 0 V to the second diffusion region 107b.

In the case of erasing information stored in the second memory functional element 131b, it is sufficient to interchange the potential in the first diffusion region and the potential in the second diffusion region in the above example.

Figure 6:
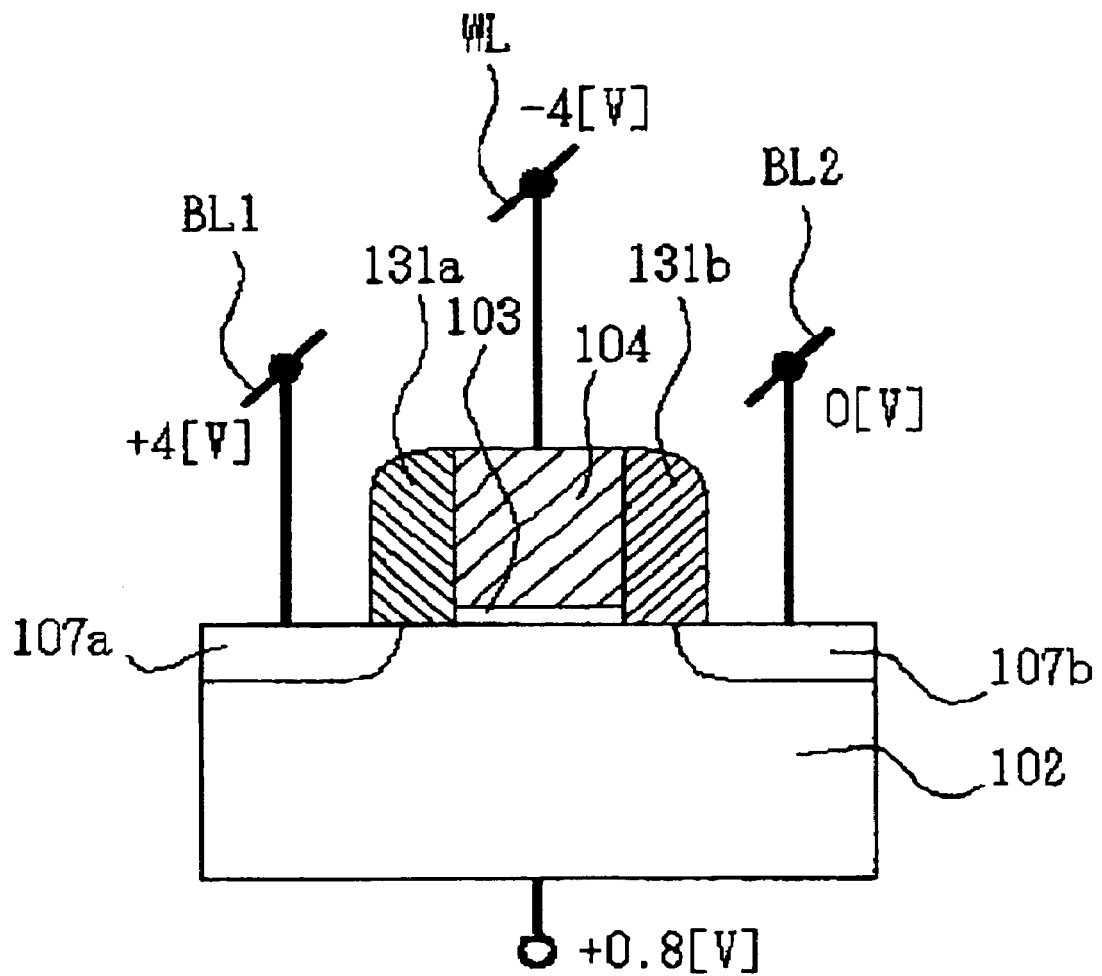
FIG. 6 is a diagram showing the erasing operation of the memory cell (first embodiment) in the semiconductor memory device of the present invention.

According to a second method of erasing information stored in the first memory functional element 131a, as shown in FIG. 6, a positive voltage (for example, +4 V) is applied to the first diffusion region 107a, 0 V is applied to the second diffusion region 107b, a negative voltage (for example, −4 V) is applied to the gate electrode 104, and a positive voltage (for example, +0.8 V) is applied to the P-type well region 102. At this time, a forward voltage is applied between the P-type well region 102 and the second diffusion region 107b, and electrons are injected into the P-type well region 102. The injected electrons are diffused to the PN junction between the P-type well region 102 and the first diffusion region 107a and accelerated by the high electric field, thereby becoming hot electrons. The hot electrons generate electron-hole pairs in the PN junction. To be specific, by applying a forward voltage between the P-type well region 102 and the second diffusion region 107b, electrons injected in the P-type well region 102 become a trigger and hot holes are generated in the PN junction positioned on the opposite side. The hot holes generated in the PN junction are attracted by the gate electrode 104 and, as a result, positive holes are injected into the first memory functional element 131a.

According to the method, also in the case where only a voltage insufficient to generate hot holes by interband tunneling is applied in the PN junction between the P-type well region and the first diffusion region 107a, electrons injected in the second diffusion region 107b become a trigger of generating the electron-hole pairs in the PN junction, and hot holes can be generated. Therefore, a voltage in the erasing operation can be decreased. Particularly, when the offset region 120 (see FIG. 1) exists, an effect that the gradient of potential in the PN junction becomes sharp by the gate electrode to which a negative potential is applied is small. Consequently, it is difficult to generate hot holes by the interband tunneling. The second method overcomes the drawback and can realize the erasing operation with a low voltage.

In the case of erasing information stored in the first memory functional element 131a, according to the first erasing method, +5 V has to be applied to the first diffusion region 107a. According to the second erasing method, +4 V is sufficient. As described above, according to the second method, the voltage in the erasing operation can be decreased, so that power consumption can be reduced and deterioration in the memory cell due to hot carriers can be suppressed.

In any of the erasing methods, over-erasure does not occur easily in the memory cell. The over-erasure here denotes a phenomenon that as the amount of positive holes accumulated in the memory functional element increases, the threshold decreases without saturation. The over-erasure is a big issue in an EEPROM typified by a flash memory. Particularly, in the case where the threshold becomes negative, critical malfunctioning that selection of a memory cell becomes impossible occurs. On the other hand, in the memory cell in the semiconductor memory device of the present invention, also in the case where a large amount of positive holes are accumulated in the memory functional element, only electrons are induced below the memory functional element, but an influence is hardly exerted to the potential in the channel region below the gate insulating film. Since the threshold at the time of erasing is determined by the potential below the gate insulating film, occurrence of over-erasure is suppressed.

Figure 7:
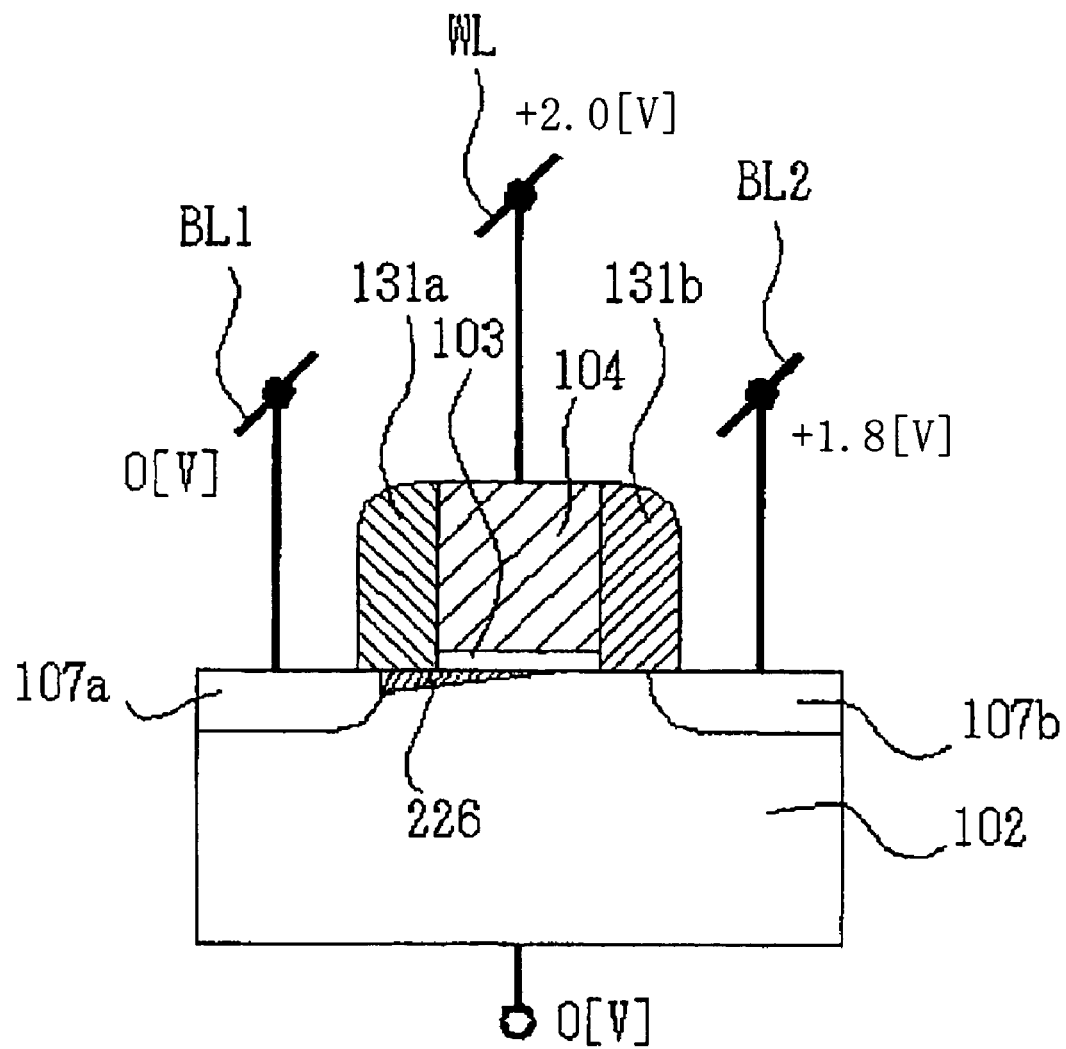
FIG. 7 is a diagram showing a reading operation of the memory cell (first embodiment) in the semiconductor memory device of the present invention.

Further, the principle of reading operation of the memory cell will be described with reference to FIG. 7.

In the case of reading information stored in the first memory functional element 131a, a transistor is operated in a saturation region by using the first diffusion region 107a as a source electrode and using the second diffusion region 107b as a drain electrode. For example, 0 V is applied to the first diffusion region 107a and the P-type well region 102, +1.8 V is applied to the second diffusion region 107b, and +2 V is applied to the gate electrode 104. In the case where no electrons are accumulated in the first memory functional element 131a at this time, drain current tends to flow. On the other hand, in the case where electrons are accumulated in the first memory functional element 131a, an inversion layer is not easily formed in the vicinity of the first memory functional element 131a, so that the drain current does not easily flow. Therefore, by detecting the drain current, information stored in the first memory functional element 131a can be read. Since the pinch off occurs in the vicinity of the drain at this time, whether charges are accumulated in the second memory functional element 131b or not does not exert an influence on the drain current.

In the case of reading information stored in the second memory functional element 131b, the transistor is operated in a saturation region by using the second diffusion region 107b as a source electrode and using the first diffusion region 107a as a drain electrode. It is sufficient to apply, for example, 0 V to the second diffusion region 107b and the P-type well region 102, +1.8 V to the first diffusion region 107a, and +2 V to the gate electrode 104. By interchanging the source and drain regions of the case of reading information stored in the first memory functional element 131a, information stored in the second memory functional element 131b can be read.

In the case where there is a channel region (offset region 120) which is not covered with the gate electrode 104, an inversion layer is dissipated or formed according to the presence/absence of excessive charges in the memory functional elements 131a and 131b in the channel region which is not covered with the gate electrode 104. As a result, a large hysteresis (change in the threshold) can be obtained. However, if the offset region 120 is too wide, the drain current largely decreases and the reading speed becomes much lower. Therefore, it is preferable to determine the width of the offset region 120 so that a sufficient hysteresis and reading speed can be obtained.

Even in the case where the diffusion regions 107a and 107b extend to the ends of the gate electrode 104, that is, the diffusion regions 107a and 107b overlap with the gate electrode 104, the threshold of the transistor is hardly changed by the programming operation. However, parasitic resistance at ends of the source and drain largely changes and the drain current greatly decreases (by one digit or more). Therefore, the reading operation can be performed by detecting the drain current, and the function of a memory can be obtained. In the case where a larger memory hysteresis effect is necessary, preferably, the diffusion regions 107a and 107b do not overlap with the gate electrode 104 (the offset region 120 exists).

By the above operating method, selective programming/erasing of two bits per one transistor can be realized. By connecting a word line WL to the gate electrode 104 of the memory cell, connecting a first bit line BL1 to the first diffusion region 107a, connecting a second bit line BL2 to the second diffusion region 107b, and arranging memory cells, a memory cell array can be configured.

In the above-described operating method, by interchanging the source electrode and the drain electrode, programming and erasing of two bits per one transistor is performed. Alternatively, the memory cell can also operate as a 1-bit memory by fixing the source electrode and the drain electrode. In this case, a common fixed voltage can be applied to one of the source and drain regions and the number of bit lines connected to the source and drain regions can be reduced to the half.

As obvious from the above description, in the memory cell in the semiconductor memory device of the present invention, the memory functional element is formed independently of the gate insulating film, and is formed on both sides of the gate electrode, so that 2-bit operation is possible. Since each memory functional element is isolated by the gate electrode, interference at the time of rewriting is effectively suppressed. Further, since the gate insulating film is isolated from the memory functional element, the memory cell can be formed thinly and a short channel effect can be suppressed. Therefore, reduction in size of the memory cell and, accordingly, the semiconductor memory device can be achieved easily.

Second Embodiment

Figure 8:
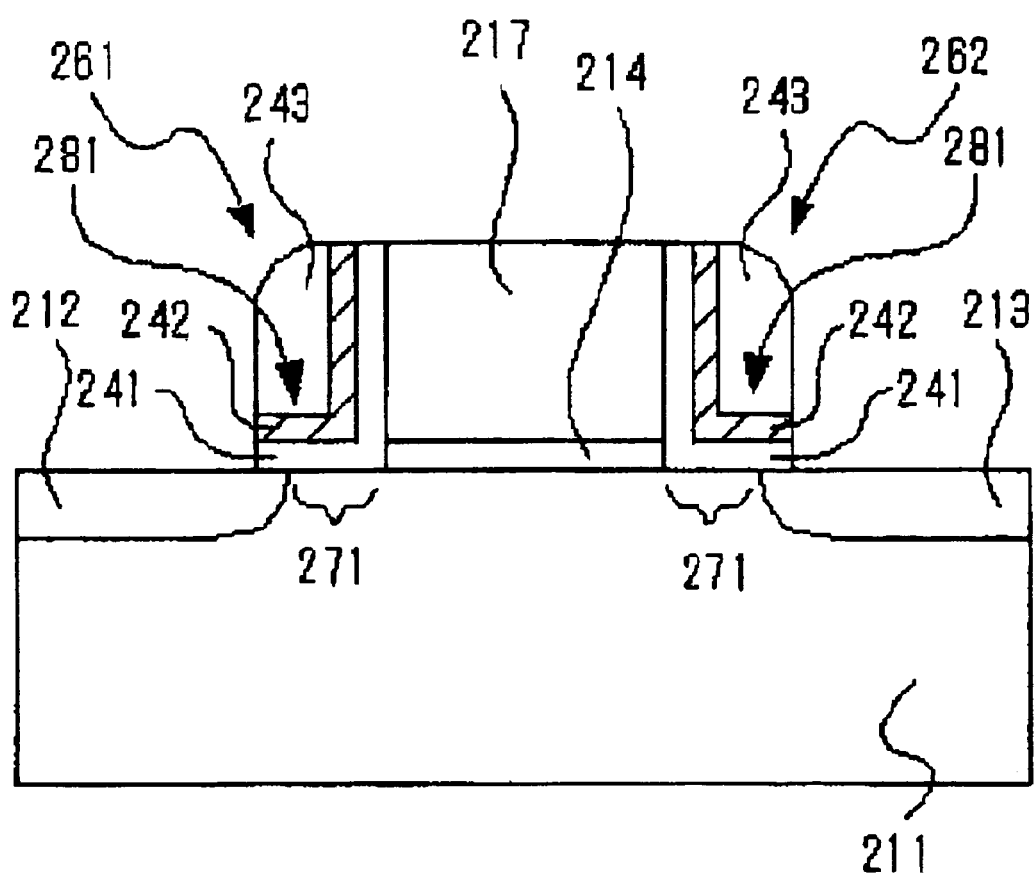
FIG. 8 is a schematic sectional view showing a main part of a memory cell (second embodiment) in the semiconductor memory device of the present invention.

A memory cell in a semiconductor memory device according to a second embodiment has a configuration substantially similar to that of the memory cell 1 of FIG. 1 except that, as shown in FIG. 8, each of memory functional elements 261 and 262 is configured by a charge retaining region (which is a charge accumulating region and may be a film having the function of retaining charges) and a region for suppressing escape of charges (or a film having the function of suppressing escape of charges).

Preferably, from the viewpoint of improving the retaining characteristic of the memory, the memory functional element includes a charge retaining film having the function of retaining charges and an insulating film. In the embodiment, a silicon nitride film 242 having a level of trapping charges is used as the charge retaining film and silicon oxide films 241 and 243 having the function of preventing escape of charges accumulated in the charge retaining film are used as the insulating films. When the memory functional element includes the charge retaining film and the insulating film, escape of charges is prevented and the retaining characteristic can be improved. As compared with the case where the memory functional element is configured only by the charge retaining film, the volume of the charge retaining film can be reduced properly and, by regulating movement of charges in the charge retaining film, occurrence of a change in the characteristics due to movement of charges during retention of information can be suppressed. Further, by employing the structure in which the silicon nitride film 242 is sandwiched by the silicon oxide films 241 and 243, the charge injection efficiency at the time of rewriting operation becomes high and the operation can be performed at higher speed. In the memory cell, the silicon nitride film 242 may be replaced with a ferroelectric.

The regions of retaining charges (silicon nitride film 242) in the memory functional elements 261 and 262 overlap with diffusion regions 212 and 213. Overlap means here that at least a part of the charge retaining region (silicon nitride film 242) exists over at least a part of the diffusion regions 212 and 213. 211 denotes a semiconductor substrate, 214 denotes a gate insulating film, 217 indicates a gate electrode, and 271 expresses offset regions between the gate electrode 217 and the diffusion regions 212 and 213. Although not shown, the uppermost surface of the semiconductor substrate 211 below the gate insulating film 214 is a channel region.

A method of forming a memory cell of the present invention will now be described by using the memory cell shown in FIG. 8 as an example. First, the gate insulating film 214 and the gate electrode 217 are formed over the semiconductor substrate 211 by a known procedure. Subsequently, on the entire surface of the semiconductor substrate 211, the silicon oxide film 241 having a thickness of 0.8 to 20 nm, more preferably 3 to 10 nm is formed by thermal oxidation or deposited by CVD (Chemical Vapor Deposition). Next, on the entire surface of the silicon oxide film 241, the silicon nitride film 242 having a thickness of 2 to 15 nm, more preferably 3 to 10 nm is deposited by CVD.

Further, on the entire surface of the silicon nitride film, the silicon oxide film 243 having a thickness of 20 to 70 nm is deposited by CVD.

Subsequently, by etching back the silicon oxide film/silicon nitride film/silicon oxide film by anisotropic etching, a memory functional element which is optimum to store information is formed in a sidewall spacer shape on side walls of the gate electrode.

After that, ions are implanted by using the gate electrode 217 and the memory functional element having the sidewall spacer shape as a mask, thereby forming the diffusion layer regions (source and drain regions) 212 and 213. After that, a silicide process and an upper wiring process may be performed by a known procedure.

Effects produced by the overlap between the silicon nitride films 242 as the charge retaining regions in the memory functional elements 261 and 262 and the diffusion regions 212 and 213 will now be described.

Figure 9:
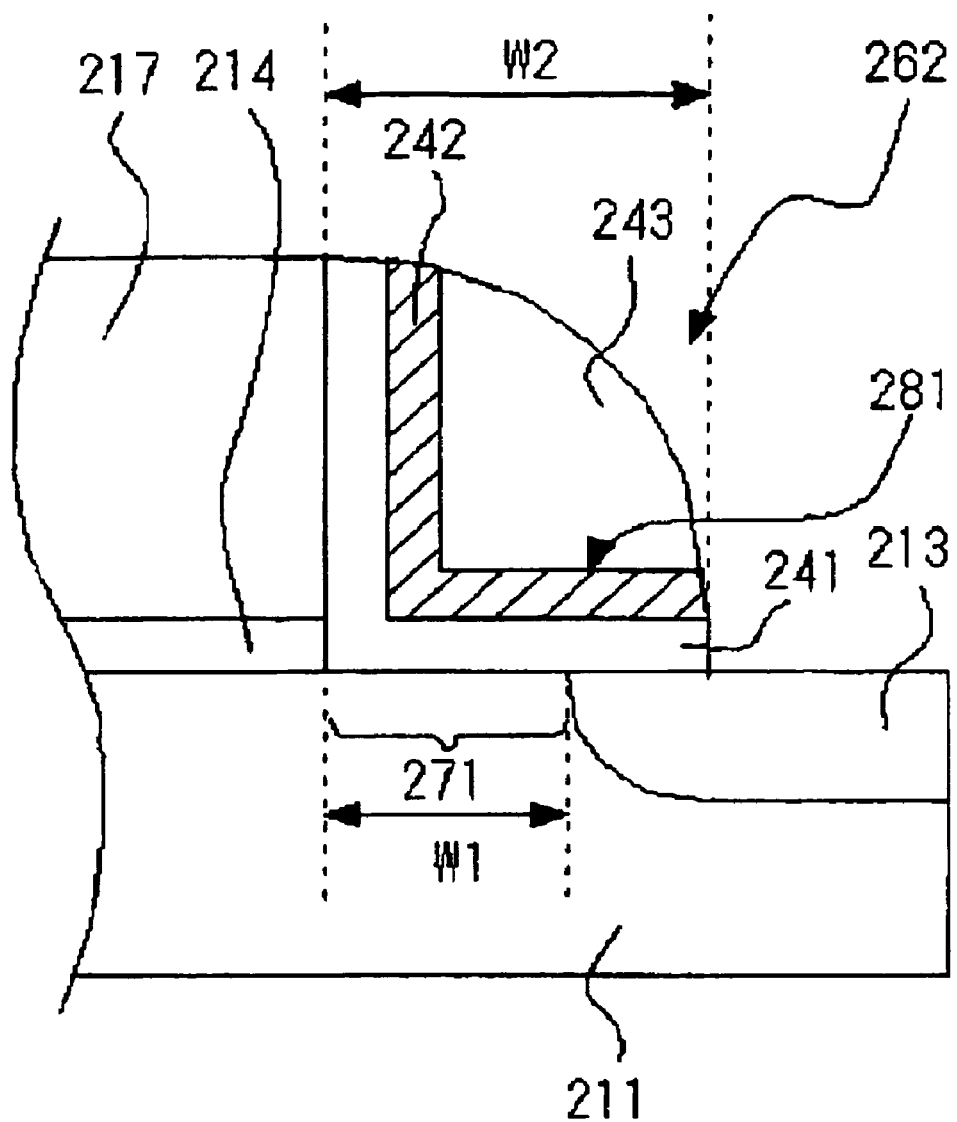
FIG. 9 is an enlarged schematic sectional view showing a main part of FIG. 8.

As shown in FIG. 9, in the area around the memory functional element 262, when an offset amount between the gate electrode 217 and the diffusion region 213 is W1 and the width of the memory functional element 262 in a cutting plane in the channel length direction of the gate electrode is W2, an overlap amount between the memory functional element 262 and the diffusion region 213 is expressed by "W2−W1". It is important that the silicon nitride film 242 in the memory functional element 262 overlaps the diffusion region 213, that is, the relation of "W2>W1" is satisfied.

In FIG. 9, since the end on the side apart from the gate electrode 217, of the silicon nitride film 242 in the memory functional element 262 coincides with the end of the memory functional element 262 on the side apart from the gate electrode 217, the width of the memory functional element 262 is defined as W2.

Figure 10:
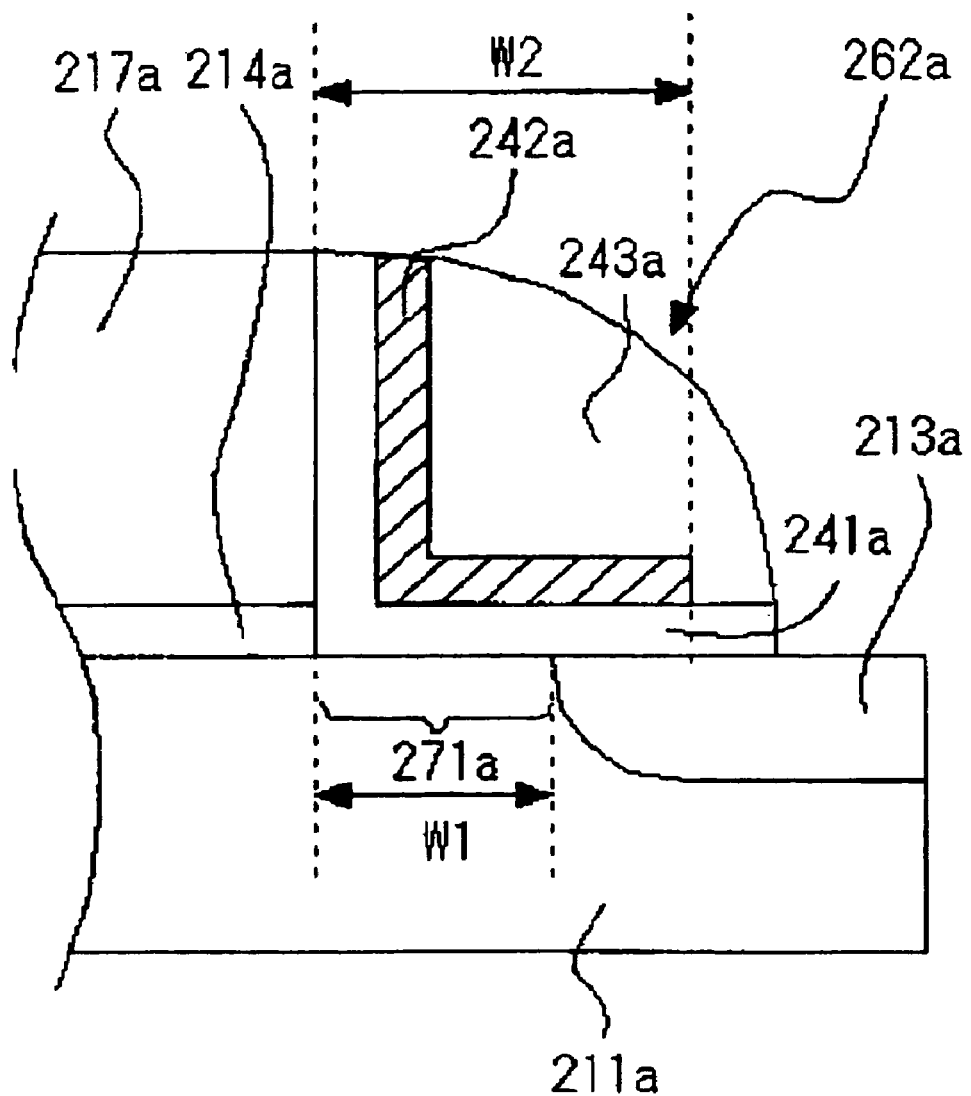
FIG. 10 is an enlarged schematic sectional view showing a main part of a modification of FIG. 8.

As shown in FIG. 10, when the end on the side apart from a gate electrode 217a, of a silicon nitride film 242a in a memory functional element 262a does not coincide with the end of the memory functional element 262a on the side apart from the gate electrode 217a, W2 may be defined as a width from the end of the gate electrode to the end on the side apart from the gate electrode of the silicon nitride film 242a.

Figure 11:
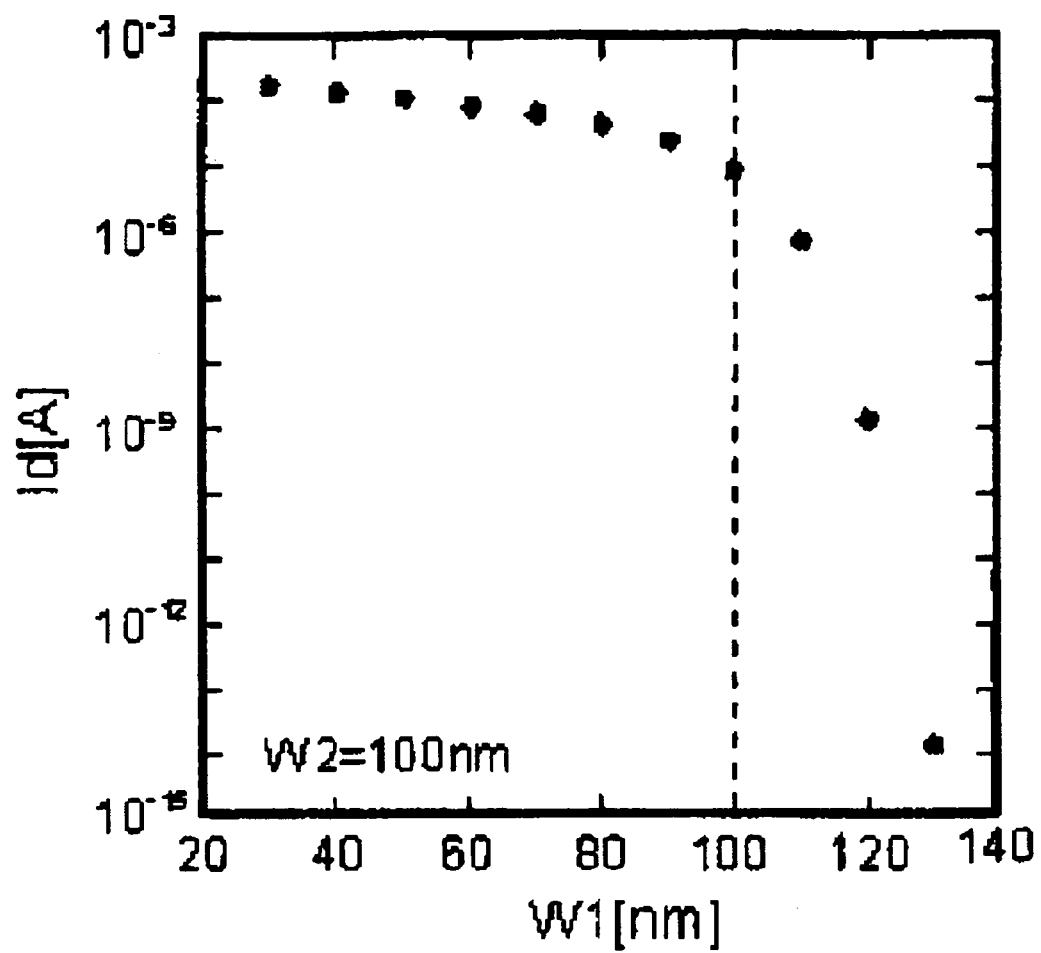
FIG. 11 is a graph showing electric characteristics of the memory cell (second embodiment) in the semiconductor memory device of the present invention.

FIG. 11 shows drain current Id when the width W2 of the memory functional element 262 is fixed to 100 nm and the offset amount W1 is changed in the structure of the memory cell of FIG. 9. The drain current was obtained by device simulation on assumption that the memory functional element 262 is in erasing state (holes are accumulated), and the diffusion regions 212 and 213 serve as the source electrode and the drain electrode, respectively.

As obvious from FIG. 11, when W1 is 100 nm or more (that is, the silicon nitride film 242 and the diffusion region 213 do not overlap with each other), the drain current sharply decreases. Since the drain current value is almost proportional to the read operation speed, the performance of the memory sharply deteriorates when W1 is 100 nm or more. On the other hand, in the range where the silicon nitride film 242 and the diffusion region 213 overlap with each other, decrease in the drain current is gentle. Therefore, in the case of considering also variations in mass production, without overlap between at least a part of the silicon nitride film 242 as the film having the function of retaining charges and the source and drain regions, it is difficult to actually obtain the memory function.

On the basis of the result of the device simulation, by fixing W2 to 100 nm and setting W1 to 60 nm and 100 nm as design values, memory cell arrays were produced. In the case where W1 is 60 nm, the silicon nitride film 242 and each of the diffusion regions 212 and 213 overlap with each other by 40 nm as a design value. In the case where W1 is 100 nm, there is no overlap as a design value. Reading time of the memory cell arrays was measured and worst cases in which variations were considered were compared with each other. In the case where W1 was set to 60 nm as a design value, read access time was 100 times as fast as that of the other case. In practice, the read access time is preferably 100 n/sec or less per one bit. When W1=W2, this condition cannot be satisfied. In the case of considering manufacture variations as well, it is more preferable that (W2−W1)>10 nm be satisfied.

In reading of information stored in the memory functional element 261 (region 281), in a manner similar to the first embodiment, it is preferable to set the diffusion region 212 as a source region, set the diffusion region 213 as a drain region, and form a pinch-off point on the side closer to the drain region in the channel region. Specifically, at the time of reading information stored in one of two memory functional elements, it is preferable to form a pinch-off point in a region close to the other memory functional element in the channel region. With the configuration, irrespective of the storage state of the memory functional element 262, information stored in the memory functional element 261 can be detected with high sensitivity, and it enables a 2-bit operation to be performed.

On the other hand, in the case of storing information in only one of two memory functional elements or in the case of using two memory functional elements in the same storage state, it is not always necessary to form a pinch-off point at the time of reading.

Although not shown in FIG. 8, it is preferable to form a well region (P-type well in the case of an N-channel device) in the surface of the semiconductor substrate 211. By forming the well region, while optimizing the impurity concentration in the channel region to memory operations (rewriting operation and reading operation), the other electric characteristics (withstand voltage, junction capacitance and short channel effect) can be controlled more easily.

Figure 12:
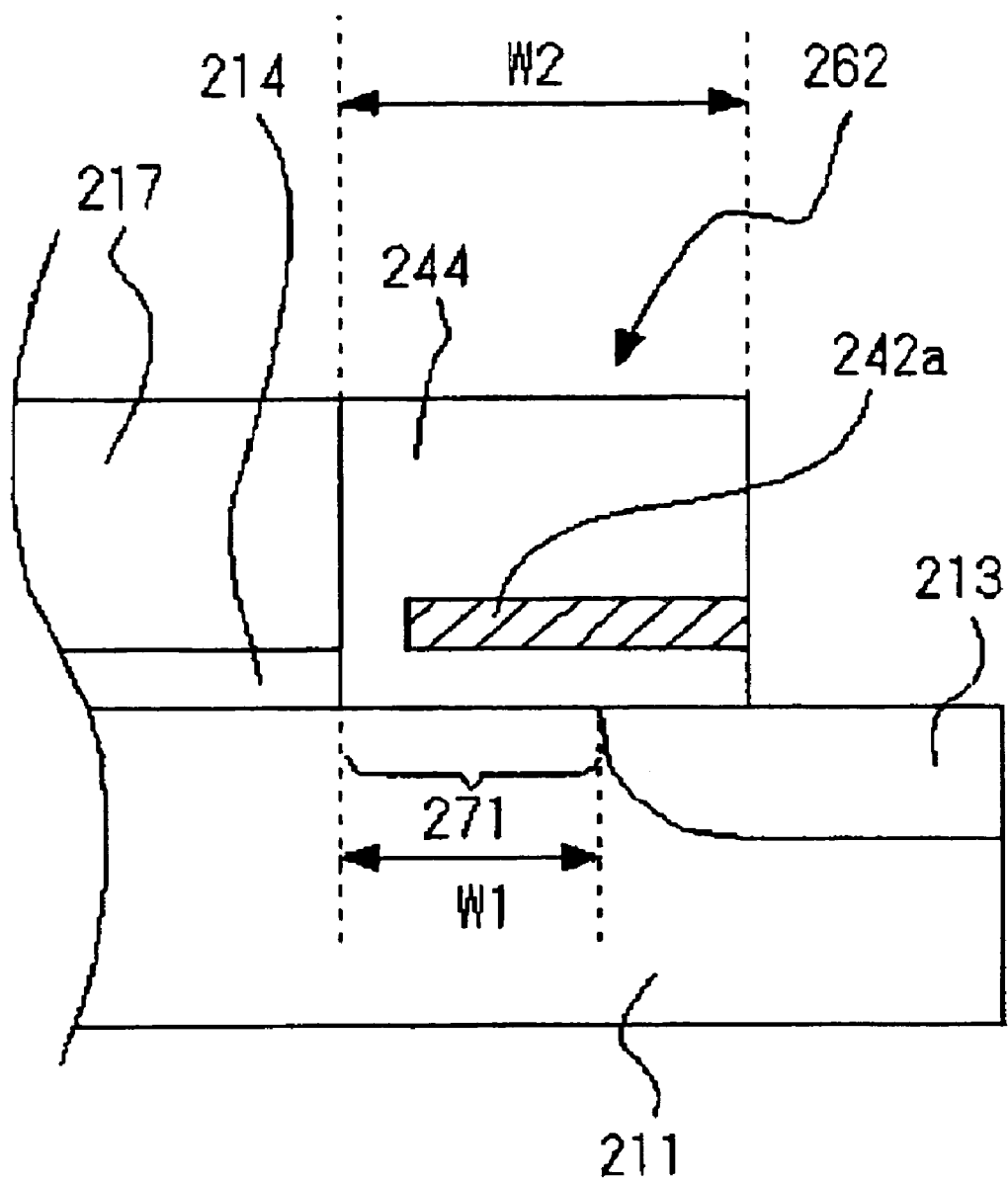
FIG. 12 is a schematic sectional view showing a main part of a modification of the memory cell (second embodiment) in the semiconductor memory device of the present invention.

Preferably, the memory functional element includes the charge retaining film which is disposed almost parallel with the surface of the gate insulating film. In other words, it is preferable to dispose the memory functional element so that the top surface of the charge retaining film in the memory functional element is positioned in a distance equal from the top surface of the gate insulating film. Specifically, as shown in FIG. 12, the silicon nitride film 242a as the charge retaining film in the memory functional element 262 has a surface almost parallel with the surface of the gate insulating film 214. In other words, it is preferable that the silicon nitride film 242a be formed at a constant level from the level of the surface of the gate insulating film 214.

Because of the existence of the silicon nitride film 242a which is almost parallel with the surface of the gate insulating film 214 in the memory functional element 262, easiness of formation of an inversion layer in the offset region 271 can be effectively controlled in accordance with the amount of charges accumulated in the silicon nitride film 242a and, moreover, the memory effect can be increased. By forming the silicon nitride film 242a almost parallel with the surface of the gate insulating film 214, even in the case where the offset amount (W1) varies, a change in the memory effect can be maintained to be relatively small and variations in the memory effect can be suppressed. Moreover, movement of charges to the upper portion in the silicon nitride film 242a is suppressed and occurrence of a characteristic change due to movement of charges during retention of information can be suppressed.

Further, it is preferable that the memory functional element 262 include an insulating film (for example, a portion over the offset region 271 in the silicon oxide film 244) for separating the silicon nitride film 242a which is almost parallel to the surface of the gate insulating film 214 from the channel region (or well region). By the insulating film, dissipation of the charges accumulated in the charge retaining film is suppressed and a memory cell having a better retaining characteristic can be obtained.

By controlling the thickness of the silicon nitride film 242a and controlling the thickness of the insulating film below the silicon nitride film 242a (portion over the offset region 271 in the silicon oxide film 244) to be constant, the distance from the surface of the semiconductor substrate to charges accumulated in the charge retaining film can be maintained almost constant. To be specific, the distance from the surface of the semiconductor substrate to the charges accumulated in the charge retaining film can be controlled to be in a range from the minimum thickness value of the insulating film under the silicon nitride film 242a to the sum of the maximum thickness value of the insulating film under the silicon nitride film 242a and the maximum thickness value of the silicon nitride film 242a. Consequently, density of electric lines of force generated by the charges accumulated in the silicon nitride film 242a can be almost controlled, and variations in the memory effect of the memory cell can be reduced very much.

Third Embodiment

Figure 13:
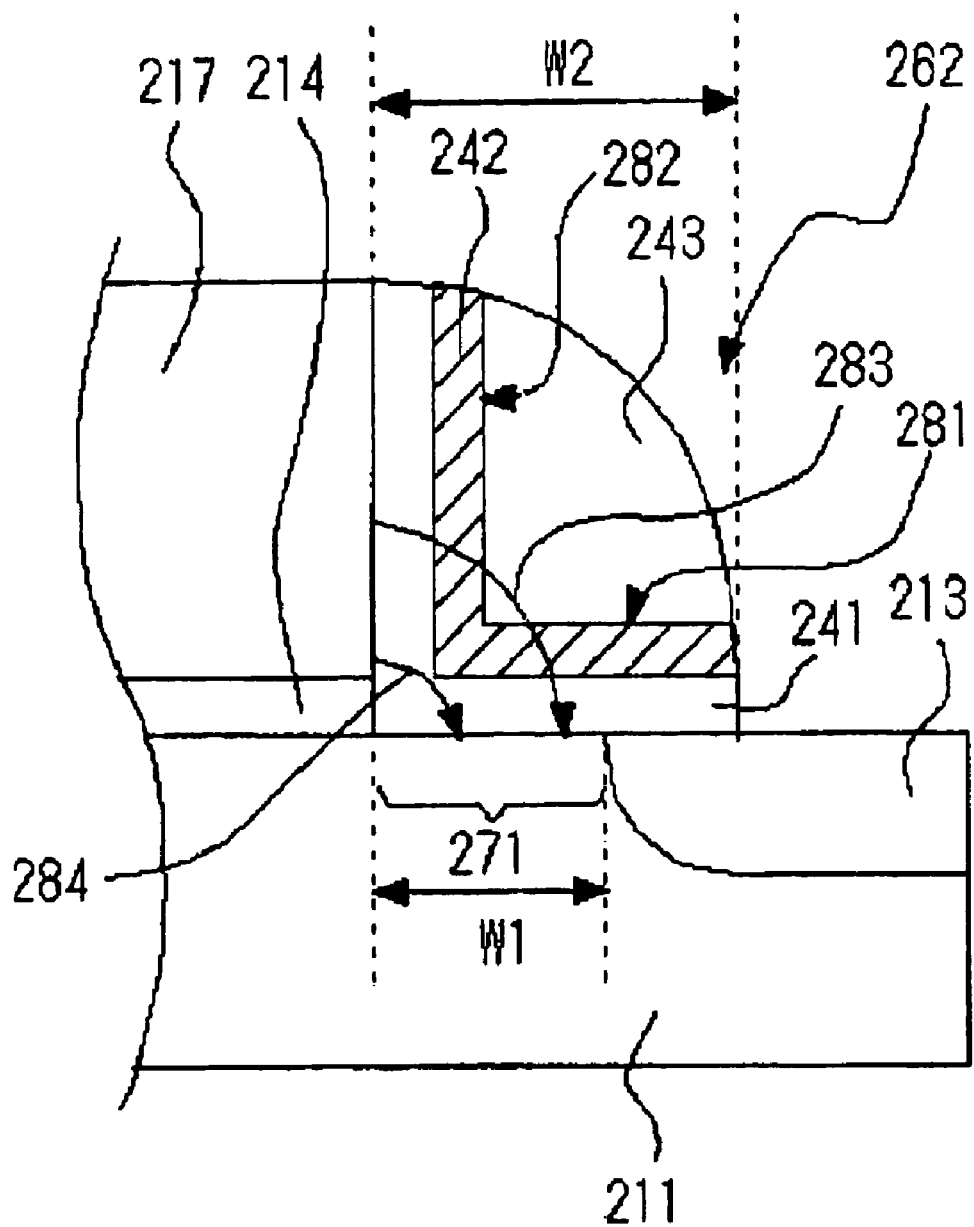
FIG. 13 is a schematic sectional view showing a main part of a memory cell (third embodiment) in the semiconductor memory device of the present invention.

The memory functional element 262 in a semiconductor memory device of a third embodiment has a shape in which, as shown in FIG. 13, the silicon nitride film 242 as the charge retaining film has an almost constant thickness and is disposed almost parallel with the surface of the gate insulating film 214 (region 281) and, further, disposed almost parallel with a side surface of the gate electrode 217 (region 282).

In the case where a positive voltage is applied to the gate electrode 217, an electric line 283 of force in the memory functional element 262 passes through the silicon nitride film 242 twice (portions corresponding to the regions 282 and 281) as shown by the arrows. When a negative voltage is applied to the gate electrode 217, the direction of the electric line of force is reversed. The dielectric constant of the silicon nitride film 242 is about 6 and the dielectric constant of the silicon oxide films 241 and 243 is about 4. Therefore, as compared with the case where only the region 281 of the charge regaining film exists, the effective dielectric constant of the memory functional element 262 in the direction of the electric line 283 of force becomes high and the potential difference at both ends of the electric line of force can be reduced. That is, the most of the voltage applied to the gate electrode 217 is used to increase the electric field in the offset region 271.

The reason why charges are injected into the silicon nitride film 242 at the time of the rewriting operation is because generated charges are attracted by the electric field in the offset region 271. Therefore, by including the charge retaining film indicated by the arrow 282, charges injected into the memory functional element 262 increases in the rewriting operation, and the rewrite speed increases.

In the case where the portion of the silicon oxide film 243 is also a silicon nitride film, specifically, when the charge retaining film is not constant with respect to the level of the surface of the gate insulating film 214, movement of charges to the upper portion of the silicon nitride film becomes conspicuous and the retaining characteristic deteriorates.

More preferably, in place of the silicon nitride film, the charge retaining film is made of a high dielectric such as hafnium oxide having a very high dielectric constant.

Preferably, the memory functional element further includes an insulating film (portion over the offset region 271 in the silicon oxide film 241) for separating the charge retaining film which is almost parallel with the surface of the gate insulating film from the channel region (or well region). By the insulating film, dissipation of charges accumulated in the charge retaining film is suppressed and the retaining characteristic can be further improved.

Preferably, the memory functional element further includes an insulating film (a portion in contact with the gate electrode 217 in the silicon oxide film 241) for separating the gate electrode from the charge retaining film extended almost parallel with the side face of the gate electrode. The insulating film prevents injection of charges from the gate electrode into the charge retaining film and, accordingly, prevents a change in the electric characteristics. Thus, the reliability of the memory cell can be improved.

Further, in a manner similar to the second embodiment, it is preferable to control the thickness of the insulating film under the silicon nitride film 242 (the portion over the offset region 271 of the silicon oxide film 241) to be constant and to control the thickness of the insulating film disposed on the side surface of the gate electrode (the portion in contact with the gate electrode 217 in the silicon oxide film 241) to be constant. By the operation, the density of electric lines of force generated by the charges accumulated in the silicon nitride film 242 can be controlled more or less and leakage of charges can be prevented.

Fourth Embodiment

In a fourth embodiment, optimization of distances among the gate electrode, the memory functional element, and the source and drain regions of a memory cell in a semiconductor memory device will be described.

Figure 14:
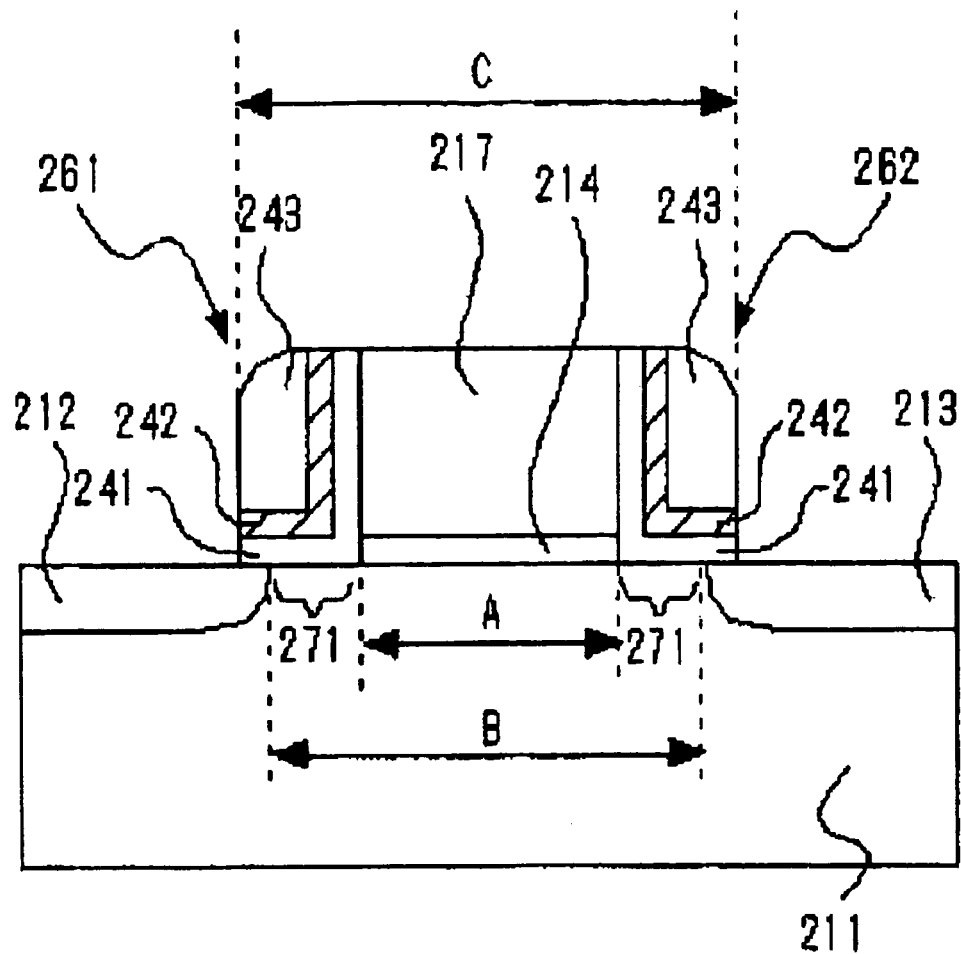
FIG. 14 is a schematic sectional view showing a main part of a memory cell (fourth embodiment) in the semiconductor memory device of the present invention.

As shown in FIG. 14, A indicates the length of the gate electrode in a cutting plane in the channel length direction, B indicates the distance from the source and drain regions (channel length), and C indicates the distance between an end of one of memory functional elements to an end of the other memory functional element, that is, the distance from an end (on the side apart from the gate electrode) of the film having the function of retaining charges in one of the memory functional elements in a cutting plane in the channel length direction to an end (on the side apart from the gate electrode) of the film having the function of retaining charges in the other memory functional element.

In such a memory cell, B<C is preferable. By satisfying such a relation, the offset regions 271 exist between the portion under the gate electrode 217 in the channel region and each of the diffusion regions 212 and 213. Consequently, easiness of inversion effectively fluctuates in the whole offset regions 271 by charges accumulated in the memory functional elements 261 and 262 (silicon nitride films 242). Therefore, the memory effect increases and, particularly, higher-speed reading operation is realized.

In the case where there is an offset between the gate electrode 217 and each of the diffusion regions 212 and 213, that is, in the case where the relation of A<B is satisfied, easiness of inversion of the offset region when a voltage is applied to the gate electrode largely changes according to an amount of charges accumulated in the memory functional element, the memory effect increases, and a short channel effect can be reduced.

As long as the memory effect is produced, the offset region 271 does not always have to exist. Even in the case where the offset region 271 does not exist, if the impurity concentration in the diffusion regions 212 and 213 is sufficiently low, the memory effect can be produced in the memory functional elements 261 and 262 (silicon nitride film 242).

Thus, A<B<C is the most preferred.

Fifth Embodiment

Figure 15:
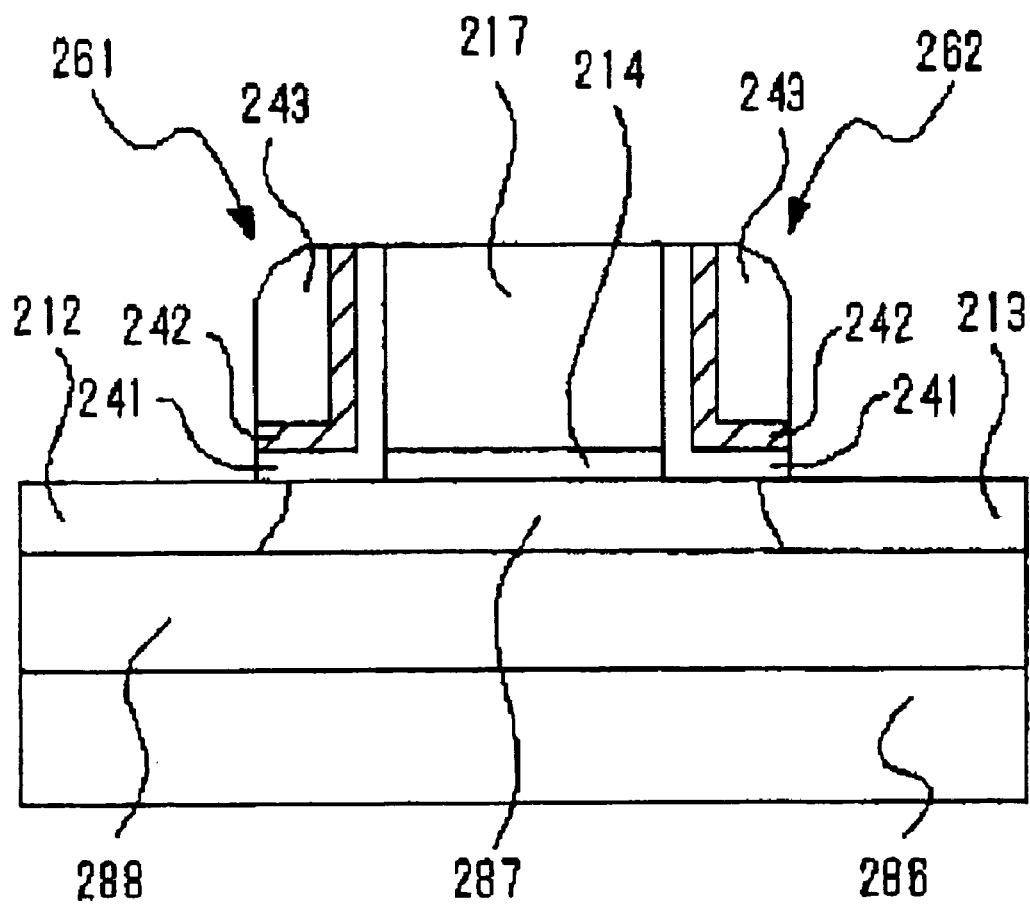
FIG. 15 is a schematic sectional view showing a main part of a memory cell (fifth embodiment) in the semiconductor memory device of the present invention.

A memory cell of a semiconductor memory device in a fifth embodiment has a substantially similar configuration to that of the second embodiment except that an SOI substrate is used as the semiconductor substrate in the second embodiment as shown in FIG. 15.

In the memory cell, a buried oxide film 288 is formed on a semiconductor substrate 286, and an SOI layer is formed on the buried oxide film 288. In the SOI layer, the diffusion regions 212 and 213 are formed and the other region serves as a body region 287.

By the memory cell as well, action and effect similar to those of the memory cell of the second embodiment are produced. Further, junction capacitance between the diffusion regions 212 and 213 and the body region 287 can be remarkably reduced, so that higher-speed operation and lower power consumption of the device can be achieved.

Sixth Embodiment

Figure 16:
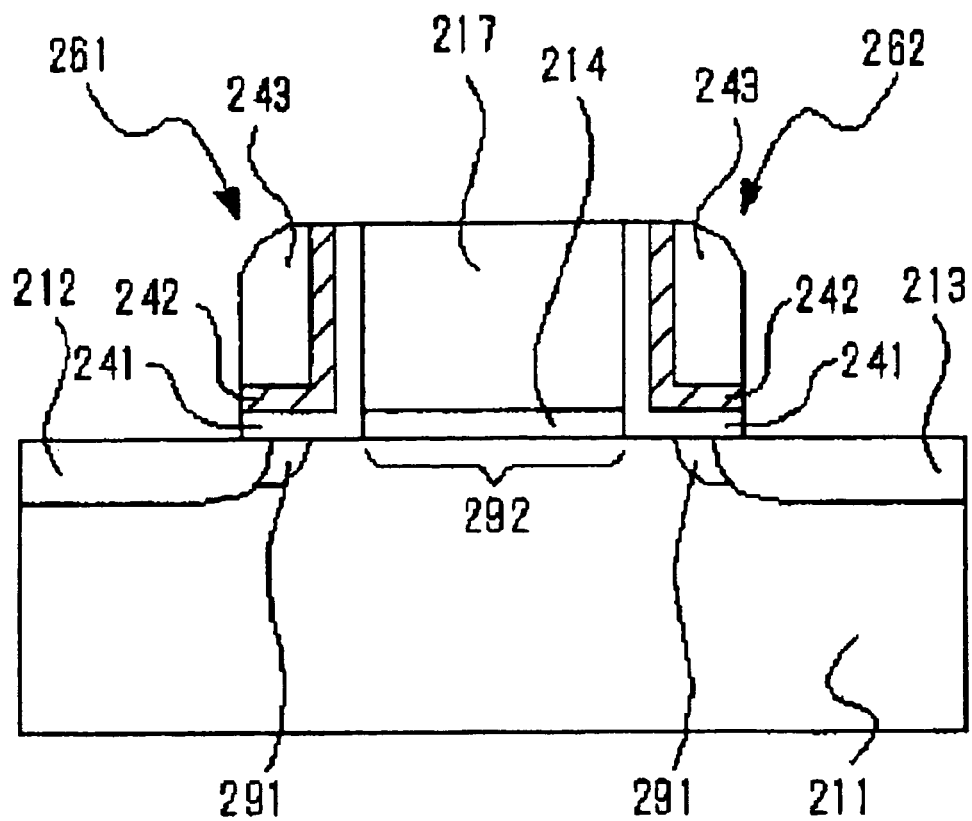
FIG. 16 is a schematic sectional view showing a main part of a memory cell (sixth embodiment) in the semiconductor memory device of the present invention.

A memory cell in a semiconductor memory device in a sixth embodiment has, as shown in FIG. 16, a configuration substantially similar to that of the memory cell of the second embodiment except that P-type high-concentration regions 291 are added adjacent to the channel sides of the N-type diffusion regions 212 and 213.

Specifically, the concentration of P-type impurity (for example, boron) in the P-type high-concentration region 291 is higher than that in a region 292. Proper P-type impurity concentration in the P-type high-concentration region 291 is, for example, about $5 \times 10^{17}$ to $1 \times 10^{19}$ cm$^{-3}$. The P-type impurity concentration in the region 292 can be, for example, $5 \times 10^{16}$ to $1 \times 10^{18}$ cm$^{-3}$.

By providing the P-type high-concentration region 291 as described above, the gradient of potential in the junction between the diffusion regions 212 and 213 and the semiconductor substrate 211 becomes sharp immediately below the memory functional elements 261 and 262. Consequently, hot carriers are easily generated in the programming and erasing operations, and voltages in the programming and erasing operations are decreased, or the programming and erasing operations can be performed at high speed. Further, the impurity concentration in the region 292 is relatively low, so that the threshold when the memory is an erased state is low, and the drain current increases. Consequently, reading speed is improved. Therefore, the memory cell in which the rewriting voltage is low or rewriting speed is high and the reading speed is high can be obtained.

In FIG. 16, by providing the P-type high-concentration region 291 in the vicinity of the source/drain region and below the memory functional element (that is, not immediately below the gate electrode), the threshold of the transistor as a whole increases noticeably. The degree of increase is much higher as compared with the case where the P-type high-concentration region 291 exists immediately below the gate electrode. In the case where program charges (electrons in the case where the transistor is of the N-channel type) are accumulated in the memory functional element, the difference becomes much larger. On the other hand, when sufficient erase charges (positive holes in the case where the transistor is of the N channel type) are accumulated in the memory functional element, the threshold of the transistor as a whole decreases to the threshold determined by the impurity concentration in the channel region (region 292) below the gate electrode. That is, the threshold at the time of erasing does not depend on the impurity concentration in the P-type high-concentration region 291. On the other hand, the threshold at the time of programming is largely influenced by the impurity concentration. Therefore, by disposing the P-type high-concentration region 291 below the memory functional element and in the vicinity of the source/drain region, only the threshold at the time of programming fluctuates very largely and the memory effect (the difference between the threshold at the time of programming and the threshold at the time of erasing) can be remarkably increased.

Seventh Embodiment

Figure 17:
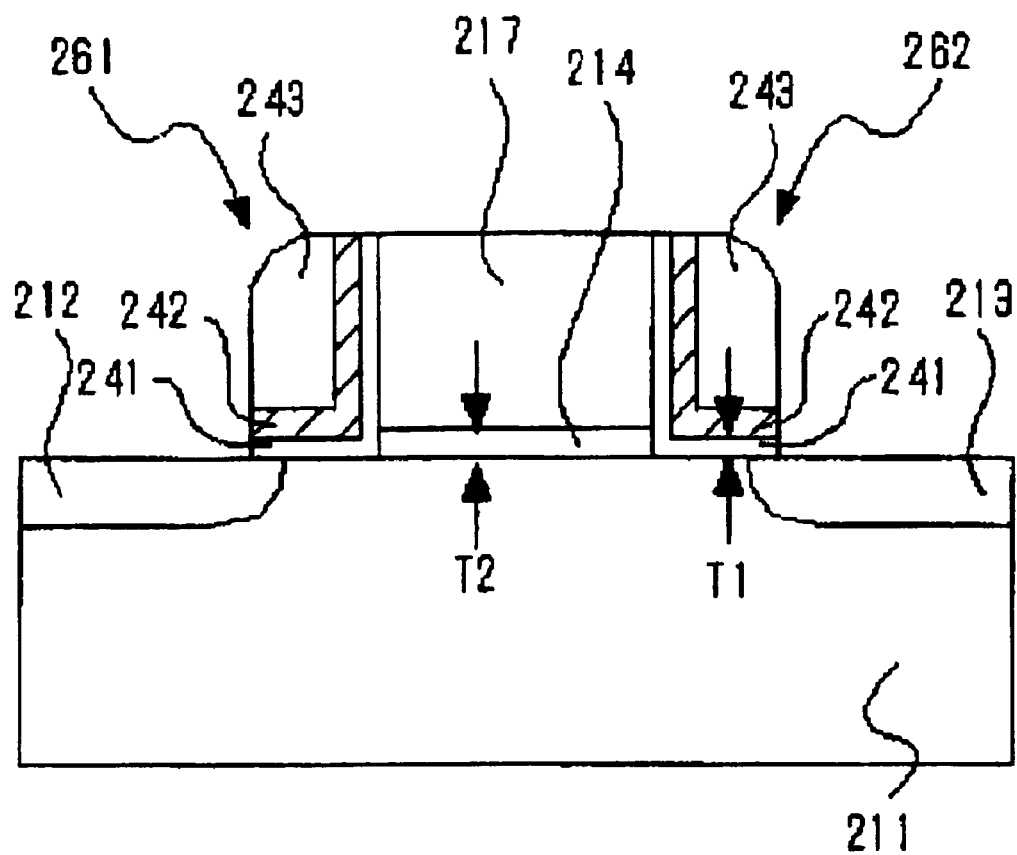
FIG. 17 is a schematic sectional view showing a main part of a memory cell (seventh embodiment) in the semiconductor memory device of the present invention.

A memory cell in a semiconductor memory device of a seventh embodiment has a configuration substantially similar to that of the second embodiment except that, as shown in FIG. 17, the thickness (T1) of an insulating film for separating the charge retaining film (silicon nitride film 242) from the channel region or well region is smaller than the thickness (T2) of the gate insulating film.

The lower limit value exists in the thickness T2 of the gate insulating film 214 due to the demand for a withstand voltage at the time of memory rewriting operation. In contrast, the thickness T1 of the insulating film can be made smaller than the thickness T2 irrespective of the demand for a withstand voltage.

The flexibility of designing with respect to T1 is high in the memory cell for the following reason.

In the memory cell, the insulating film for separating the charge retaining film from the channel region or well region is not sandwiched by the gate electrode and the channel region or well region. Consequently, to the insulating film for separating the charge retaining film from the channel region or well region, a high electric field acting between the gate electrode and the channel region or well region does not directly act, but a relatively low electric field spreading from the gate electrode in the lateral direction acts. Consequently, irrespective of the demand for a withstand voltage to the gate insulating film, T1 can be made smaller than T2.

By making T1 thinner, injection of charges into the memory functional element becomes easier, and the voltage of the programming operation and the erasing operation can be decreased or the programming operation and erasing operation can be performed at high speed. Since the amount of charges induced by the channel region or well region when charges are accumulated in the silicon nitride film 242 increases, the memory effect can be increased.

The electric lines of force in the memory functional element include a short one which does not pass through the silicon nitride film 242 as shown by an arrow 284 in FIG. 13. On the relatively short electric line of force, electric field intensity is relatively high, so that the electric field along the electric line of force plays a big role in the rewriting operation. By reducing T1, the silicon nitride film 242 is shifted downward in the diagram, and the electric line of force indicated by the arrow 283 passes through the silicon nitride film. Consequently, the effective dielectric constant in the memory functional element along the electric line 284 of force increases, and the potential difference at both ends of the electric line of force can be further decreased. Therefore, a large part of the voltage applied to the gate electrode 217 is used to increase the electric field in the offset region, and the programming operation and the erasing operation become faster.

In contrast, for example, in an EEPROM typified by a flash memory, the insulating film for separating the floating gate from the channel region or well region is sandwiched by the gate electrode (control gate) and the channel region or well region, so that a high electric field from the gate electrode directly acts. Therefore, in an EEPROM, the thickness of the insulating film for separating the floating gate from the channel region or well region is regulated, and optimization of the function of the memory cell is inhibited.

As obvious from the above, by satisfying the relation of T1<T2, without deteriorating the performance of the withstand voltage of the memory, the voltage in the programming and erasing operations can be decreased or the programming and erasing operations can be performed at high speed and, further, the memory effect can be increased. The thickness T1 of the insulating film is preferably 0.8 nm or more as a limit at which the uniformity and the film quality in the manufacturing process can maintain a predetermined level and the retaining characteristic does not deteriorate extremely.

Specifically, in the case of a liquid crystal driver LSI requiring high withstand voltage in a design rule, in order to drive the liquid crystal panel TFT, a voltage of 15 to 18 V at the maximum is required, so that the gate oxide film cannot be usually thinned. In the case of mounting a nonvolatile memory of the present invention for image adjustment on the liquid crystal driver LSI, in the memory cell of the present invention, the thickness of the insulating film for separating the charge retaining film (silicon nitride film 242) from the channel region or well region can be optimally designed independently of the thickness of the gate insulating film. For example, the thickness can be individually set as T1=20 nm and T2=10 nm for a memory cell having a gate electrode length (word line width) of 250 nm, so that a memory cell having high programming efficiency can be realized (the reason why the short channel effect is not produced when T1 is larger than the thickness of a normal logic transistor is because the source and drain regions are offset from the gate electrode).

Eighth Embodiment

Figure 18:
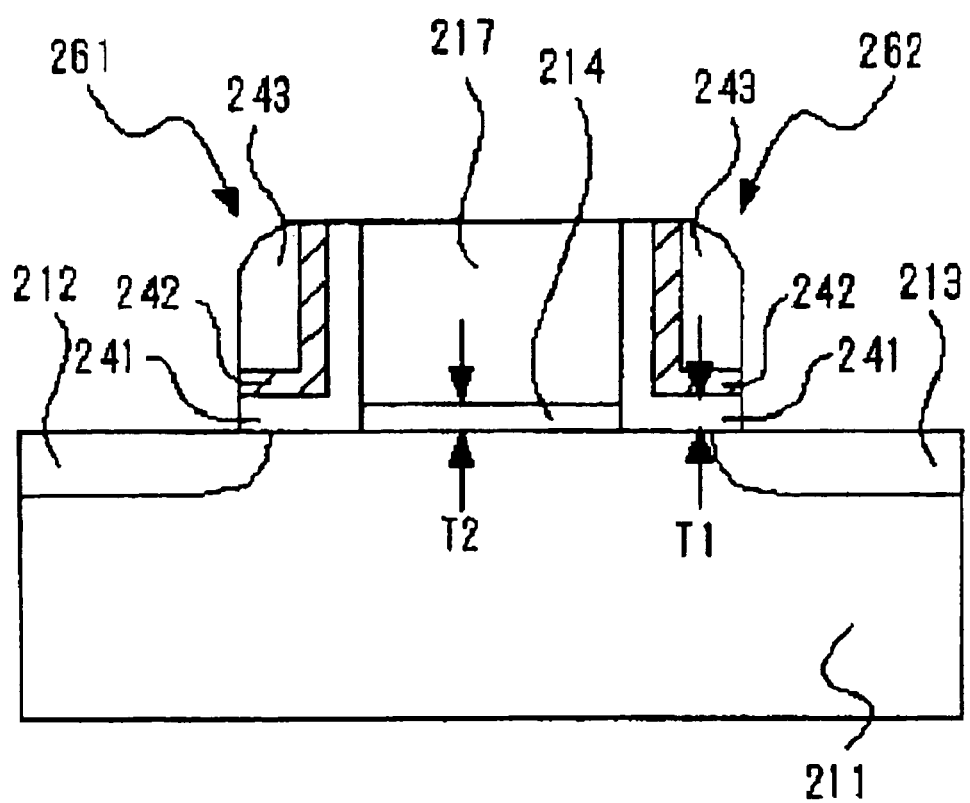
FIG. 18 is a schematic sectional view showing a main part of a memory cell (eighth embodiment) in the semiconductor memory device of the present invention.

A memory cell in a semiconductor memory device of an eighth embodiment has a configuration substantially similar to that of the second embodiment except that, as shown in FIG. 18, the thickness (T1) of the insulating film for separating the charge retaining film (silicon nitride film 242) from the channel region or well region is larger than the thickness (T2) of the gate insulating film.

The upper limit value exists in the thickness T2 of the gate insulating film 214 due to the demand for preventing a short channel effect of the device. In contrast, the thickness T1 of the insulating film can be made larger than the thickness T2 irrespective of the demand for preventing a short channel effect. Specifically, when microfabrication scaling advances (when thinning of the gate insulating film advances), the thickness of the insulating film for separating the charge retaining film (silicon nitride film 242) from the channel or well region can be optimally designed independently of the thickness of the gate insulating film. Thus, an effect that scaling is not disturbed by the memory functional element is produced.

The reason why flexibility of designing of T1 is high in the memory cell is that, as described already, the insulating film for separating the charge retaining film from the channel region or well region is not sandwiched by the gate electrode and the channel region or well region. Consequently, irrespective of the demand for preventing the short channel effect for the gate insulating film, T1 can be made larger than T2. By making T1 thicker, dissipation of charges accumulated in the memory functional element can be prevented and the retaining characteristic of the memory can be improved.

Therefore, by satisfying the relation of T1>T2, the retaining characteristic can be improved without deteriorating the short channel effect of the memory.

The thickness T1 of the insulating film is preferably 20 nm or less in consideration of decrease in the rewriting speed.

Specifically, in a conventional nonvolatile memory typified by a flash memory, a selection gate electrode serves as a program/erase gate electrode, and a gate insulating film (including a floating gate) corresponding to the program/erase gate electrode also serves as a charge accumulating film. Since a demand for size reduction (thinning of a film is indispensable to suppress short channel effect) and a demand for assuring reliability (to suppress leak of retained charges, the thickness of the insulating film for separating the floating gate from the channel region or well region cannot be reduced to about 7 nm or less) are contradictory, it is difficult to reduce the size. Actually, according to the ITRS (International Technology Roadmap for Semiconductors), there is no prospect of reduction in a physical gate length of about 0.2 micron or less. In the memory cell, since T1 and T2 can be individually designed as described above, size reduction is made possible.

For example, for a memory cell having a gate electrode length (word line width) of 45 nm, T2=4 nm and T1=7 nm are individually set, thereby enabling a memory cell in which the short channel effect is not produced to be realized. The reason why the short channel effect is not produced even when T2 is set to be larger than the thickness of a normal logic transistor is because the source/drain regions are offset from the gate electrode.

Since the source/drain regions are offset from the gate electrode in the memory cell, as compared with a normal logic transistor, reduction in size is further facilitated.

Since the electrode for assisting programming and erasing does not exist in the upper portion of the memory functional element, a high electric field acting between the electrode for assisting programming and erasing and the channel region or well region does not directly act on the insulating film for separating the charge retaining film from the channel region or well region, but only a relatively low electric field which spreads in the lateral direction from the gate electrode acts. Consequently, the memory cell having a gate length which is reduced to be equal to or less than the gate length of a logic transistor of the same process generation can be realized.

Ninth Embodiment

A ninth embodiment relates to a change in the electric characteristic at the time of rewriting a memory cell of a semiconductor memory device.

Figure 19:
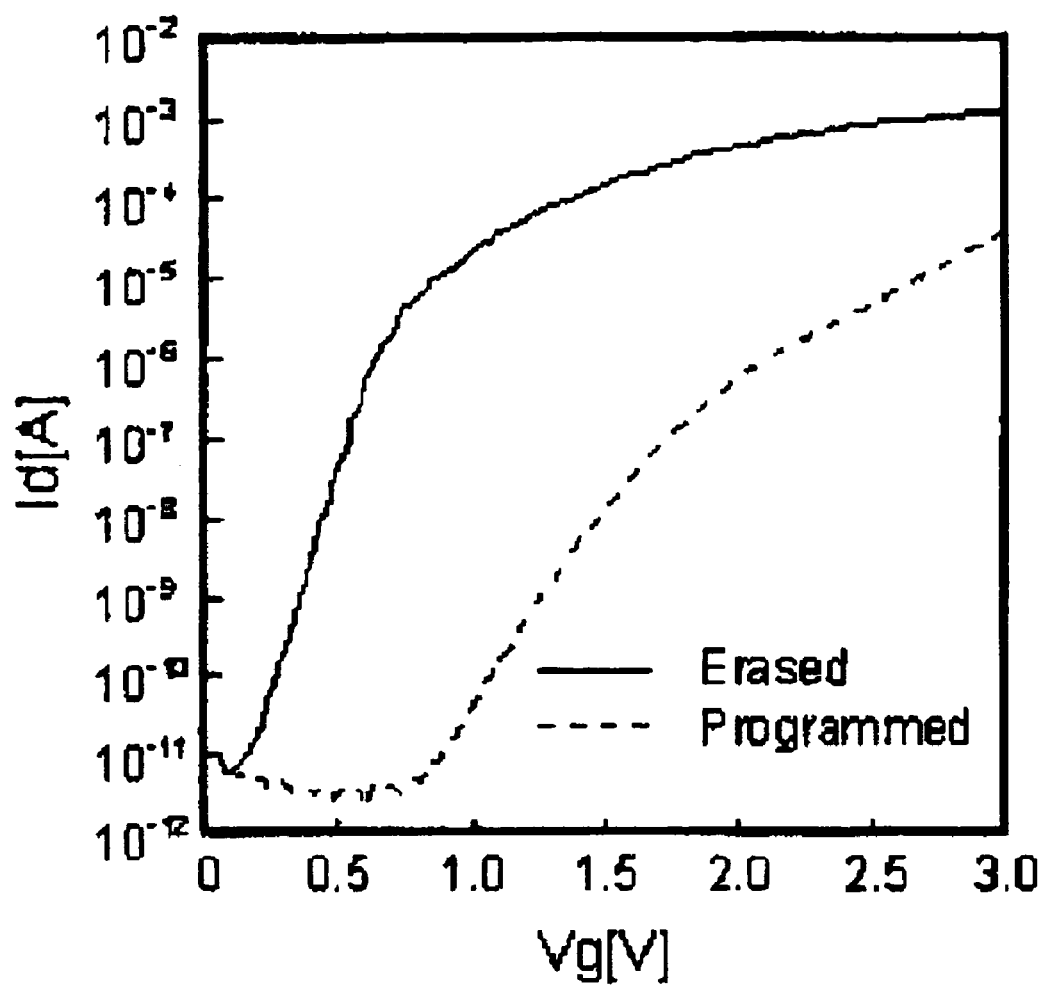
FIG. 19 is a graph showing electric characteristics of a memory cell (ninth embodiment) in the semiconductor memory device of the present invention.

In an N-channel type memory cell, when an amount of charges in a memory functional element changes, a drain current (Id)-gate voltage (Vg) characteristic (actual measurement value) as shown in FIG. 19 is exhibited.

Figure 31:
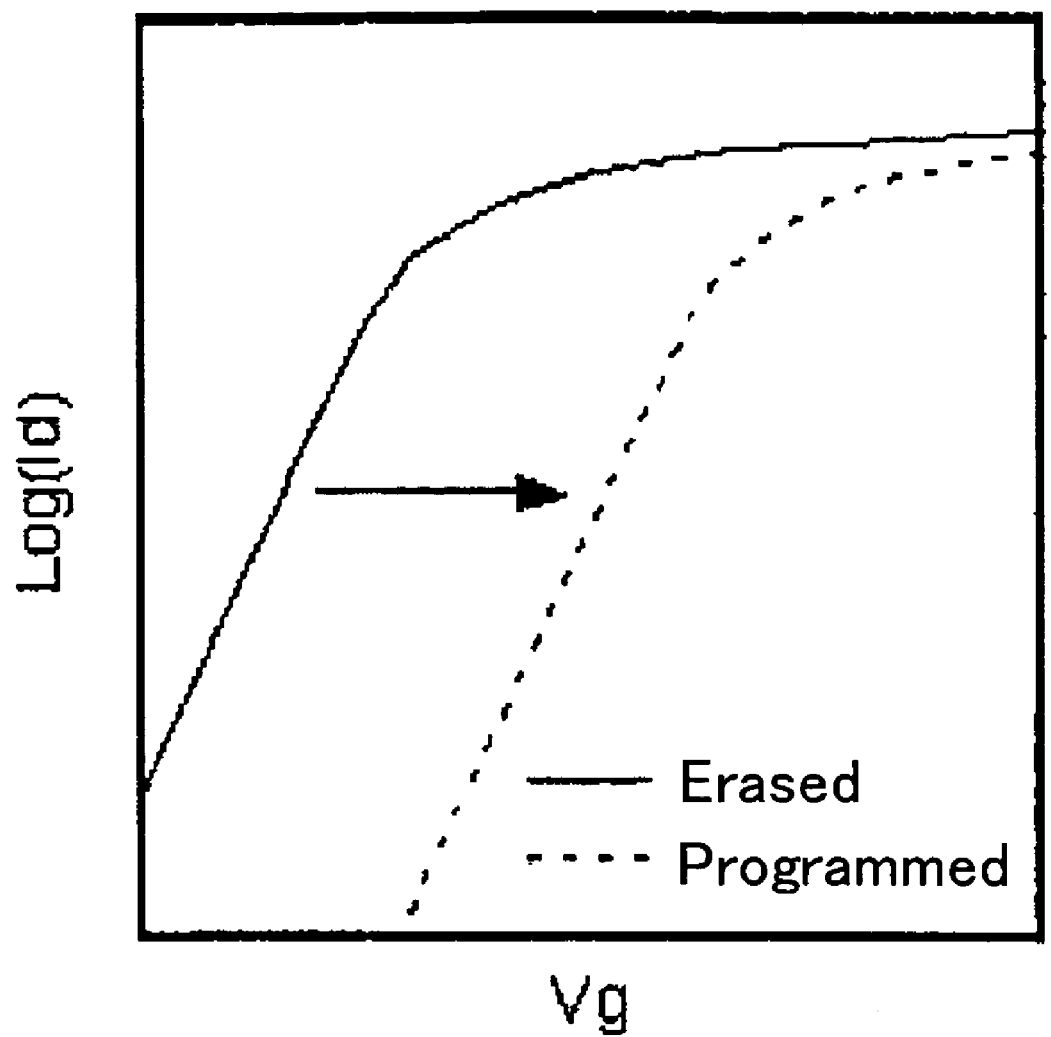
FIG. 31 is a graph showing electric characteristics of the conventional flash memory.

As obvious from FIG. 19, in the case of performing a programming operation in an erasing state (solid line), not only the threshold simply increases, but the gradient of a graph remarkably decreases in a sub-threshold region. Consequently, also in a region where a gate voltage (Vg) is relatively high, the drain current ratio between the erasing state and the programming state is high. For example, also at Vg=2.5 V, the current ratio of two digits or more is maintained. The characteristic is largely different from that in the case of a flash memory (FIG. 31).

The appearance of such a characteristic is a peculiar phenomenon which occurs when the gate electrode and the diffusion regions are offset from each other and the gate electric field hardly acts on the offset region. When the memory cell is in a programming state, even if a positive voltage is applied to the gate electrode, an inversion layer is hardly generated in the offset region below the memory functional element. This is the cause that the gradient of the Id-Vg curve in the sub-threshold region becomes gentle in the programming state.

On the other hand, when the memory cell is in the erasing state, electrons of high density are induced in the offset region. Further, when 0 V is applied to the gate electrode (that is, when the gate electrode is in an off state), no electrons are induced in the channel below the gate electrode (consequently, an off-state current is small). This is the cause that the gradient of the Id-Vg curve is sharp in the sub-threshold region in the erasing state, and current increasing rate (conductance) is high also in the region of the threshold or more.

As obviously understood from the above, in the memory cell in the semiconductor memory device of the present invention, the drain current ratio between the programming operation and the erasing operation can be particularly made high.

Tenth Embodiment

A tenth embodiment relates to a configuration of a memory cell array obtained by arranging a plurality of the memory cells of any of the first to eighth embodiments in a matrix of rows and columns.

Figure 20:
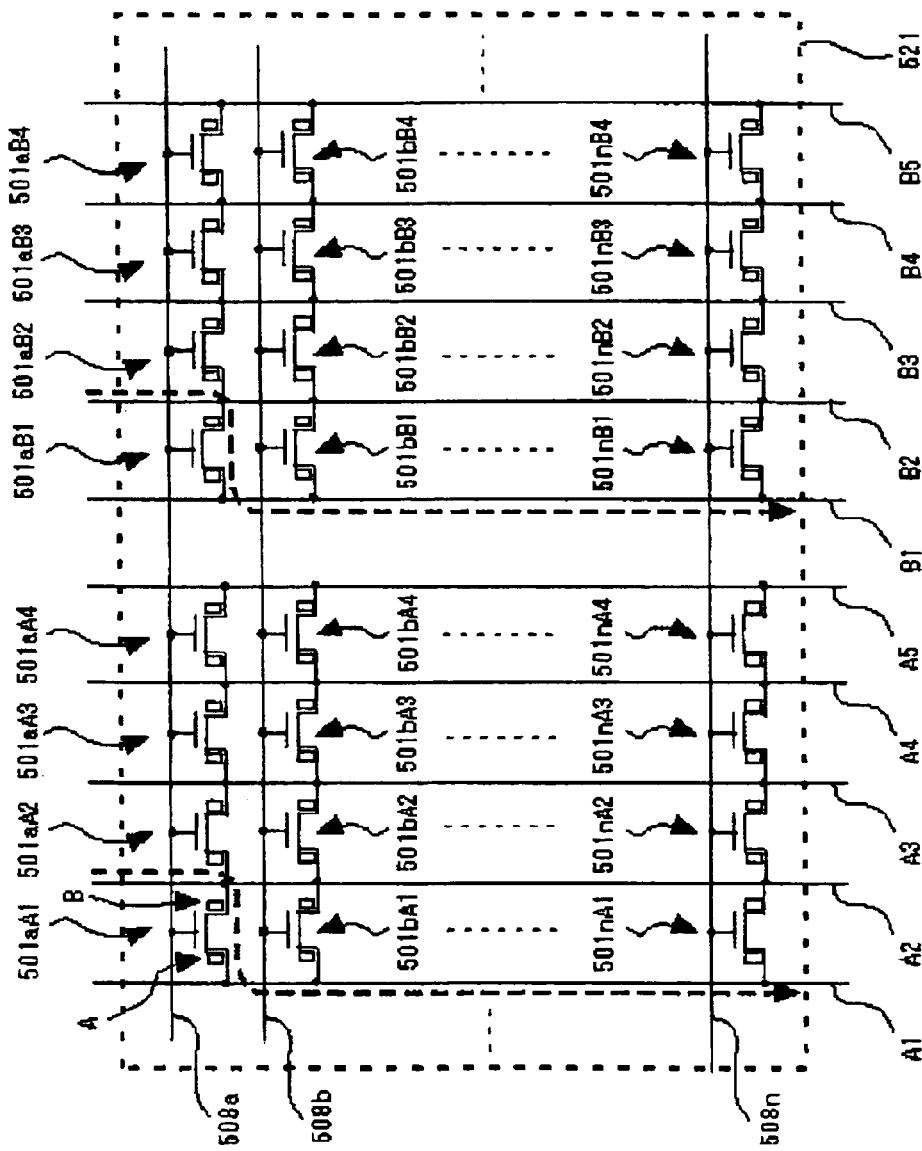
FIG. 20 is a circuit diagram showing a configuration example of a memory cell array in a semiconductor memory device (tenth embodiment) of the present invention.

FIG. 20 shows an example of the configuration of a memory cell array 521. In FIG. 20, 501aA1 to 501aA4, 501aB1 to 501aB4, . . . , and 501nB1 to 501nB4 denote memory cells, 508a to 508n denote word lines, and A1 to A5 and B1 to B5 denote bit lines. Each memory cell has two memory functional elements. In order to identify the memory functional elements, the arrows A and B are designated to the memory functional elements of only the memory cell 501aA1, but are omitted to the other memory cells.

In the memory cell array configuration of FIG. 20, a bit line is shared by memory cells belonging to neighboring columns, so that memory cells can be arranged at high packing density, and the configuration is adapted to an increase in the storage capacity. Specifically, the bit lines A2 to A4 and B2 to B4 are shared. Although memory cells in four columns construct one block in the embodiment, the present invention is not limited to the number of columns.

The bit lines correspond to first and second bit lines used for the programming, erasing and reading operations of the memory cell described with reference to FIGS. 3 to 7 in the first embodiment. Depending on the programming, erasing or reading operation performed on the two memory functional elements of a selected memory cell, one of the two bit lines connected to the selected memory cell serves as the first bit line and the other bit line serves as the second bit line. In each of the programming, erasing and reading operations, voltages applied to the word line and two bit lines connected to the selected memory cell are as described in the first embodiment and their description will not be repeated. In order to set the memory cell in a not-selected state, that is, to prevent the programming, erasing and reading operations from being performed, 0 V (the gate voltage by which a channel is not formed below the gate insulating film of the memory cell) is applied as the voltage on the word line and/or the voltage difference between the two bit lines connected to the memory cell is set to a voltage difference by which the programming, erasing and reading operations are not performed. Therefore, in the case of a not-selected memory cell connected to the same word line as the selected memory cell, a not-selected state is set by the latter method. In the case of a not-selected memory cell connected to the same bit line as the selected memory cell, a not-selected state is set by the former method. In the case of a not-selected memory cell which is not connected to the same word line and the same bit line as the selected memory cell, a not-selected state is set by both of the methods.

Although not shown, a circuit for driving a word line is connected to a word line so as to selectively apply a proper voltage to each of a selected memory cell and a not-selected memory cell in each of the programming, erasing and reading operations. To a bit line, a circuit for driving the bit line to selectively apply a proper voltage to each of the selected memory cell and the not-selected memory cell in each of the programming, erasing and reading operations, and a sense amplifier for sensing a drain current flowing in the second bit line and reading a storage state of the memory functional element in the reading operation are connected. The sense amplifier can be realized by applying a known differential amplifier or the like.

In the semiconductor memory device of the embodiment, as described above, a bit line is shared by memory cells belonging to neighboring columns, so that the packing density can be largely improved. As a result, the manufacturing cost is largely reduced and a cheap semiconductor memory device can be obtained. The configuration of the memory cell array in the semiconductor memory device of the present invention is not limited to the configuration shown in FIG. 20.

Preferably, in the semiconductor memory device of the embodiment, a logic transistor is also mounted on the same semiconductor chip.

Figure 21:
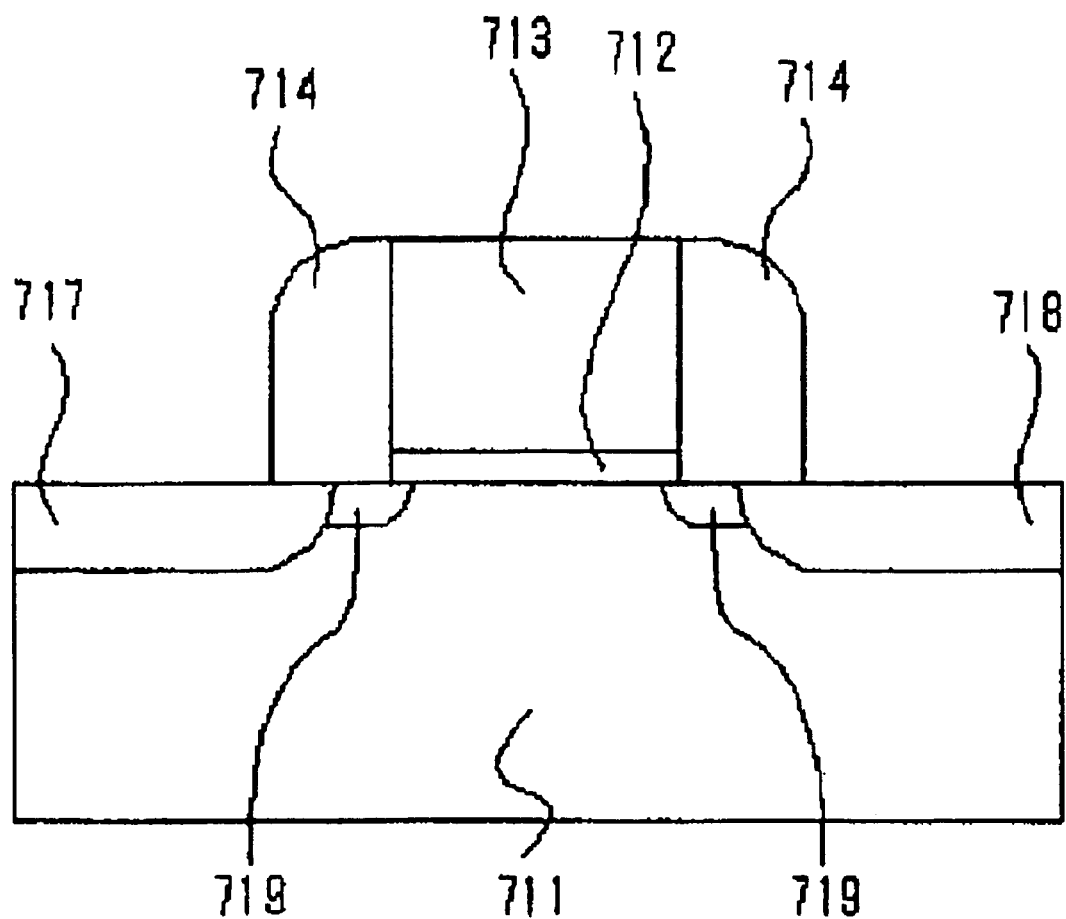
FIG. 21 is a schematic sectional view showing a main part of a normal transistor.

Since the procedure for forming the memory cell of the embodiment is very compatible with a normal standard transistor forming process, a process of forming both the semiconductor memory device or the memory cell and a logic transistor is very simple. In a standard transistor as a component of a logic circuit part and an analog circuit part, as shown in FIG. 21, usually, a gate electrode 713 having sidewall spacers 714 made by an insulating film on its side walls is formed over a semiconductor substrate 711 via a gate insulating film 712. A source region 717 and a drain region 718 are formed on both sides of the gate electrode 713. Each of the source region 717 and the drain region 718 has an LDD (Lightly Doped Drain) region 719. Therefore, the standard transistor has a configuration similar to that of a memory cell in the semiconductor memory device. In order to change the standard transistor to the memory cell, for example, the function of a memory functional element is given to the sidewall spacer 714 and it is unnecessary to form the LDD region 719.

More specifically, it is sufficient to change the sidewall spacer 714 to have a structure similar to, for example, the memory functional elements 261 and 262 in FIG. 8. At this time, the ratio of thicknesses among the silicon oxide films 241 and 243 and the silicon nitride film 242 can be properly adjusted so that the memory cell performs a proper operation. Even when the sidewall spacers of a transistor as a component of the standard logic part have a structure, for example, similar to those of the memory functional elements 261 and 262 of FIG. 8, as long as the width of the sidewall spacer (that is, the total film thickness of the silicon oxide films 241 and 243 and the silicon nitride film 242) is proper and the operation is performed in a voltage range in which the rewriting operation is not performed, the transistor performance does not deteriorate.

In order to form an LDD region in a transistor as a component of a standard logic part, it is sufficient to inject impurity for forming the LDD region after formation of a gate electrode and before formation of a memory functional element (sidewall spacer). Therefore, a memory cell and a standard transistor can be formed simultaneously and easily only by masking the memory cell with a photoresist at the time of injecting impurity for forming the LDD region.

A process of forming the conventional flash memory is largely different from that of a standard logic. Accordingly, as compared with the conventional case of using the flash memory as a nonvolatile memory and forming the flash memory simultaneously with a logic circuit and an analog circuit, in the semiconductor memory device of the present invention, the number of masks and the number of processes can be dramatically reduced. Consequently, the yield in manufacturing of a chip on which a logic circuit and an analog circuit are formed simultaneously with the nonvolatile memory cell is improved. Because of this, the manufacturing cost is reduced and, moreover, a very-reliable, cheap semiconductor memory device can be obtained.

Eleventh Embodiment

An eleventh embodiment of a semiconductor memory device according to the present invention (hereinafter, appropriately referred to as "the inventive device") will now be described. The inventive device has a plurality of planes of a memory cell array in which plural memory cells according to any of the first to eighth embodiments are arranged in a row direction and a column direction so as to form a matrix as described in the tenth embodiment, and an address process mechanism for simultaneously executing reading and writing operations on the memory cell array of the plural planes.

The inventive device 200 is a nonvolatile semiconductor memory device designed to have a high degree of freedom and high efficiency capable of simultaneously operating a plurality of planes. An address process mechanism of the inventive device 200 includes an address designation circuit, an address selection circuit, an operation control signal circuit, an operation control logic circuit and an access circuit which exist locally on each of the planes. With separate structures locally existing on each of the planes of the address process mechanism, function expansion of simultaneous operations from dual planes (two planes) to plural planes (three or more planes) can be easily used in practice.

The inventive device 200 has an expansible and very-flexible plural-plane structure capable of simultaneously operating a plurality of planes, that is, capable of simultaneously performing reading/writing on a plurality of planes. Generally, the writing operation includes not only "writing" of simply writing data to a memory cell in a data erase state ("writing" in a narrow sense) but also, in a wide sense, erasing of data written in a memory cell and, further, in the case where a memory cell is a multi-value cell for storing a multiple-value (three or more values) state, rewriting of data written in a memory cell with data of another logic value. In this embodiment, in order to distinguish the definitions of "writing", the writing in the narrow sense will be referred to as "programming". Therefore, unless otherwise specified, "writing" denotes the writing in the wide sense. Also in the case of a multi-value cell, "programming" as writing in the narrow sense exists.

Figure 22:
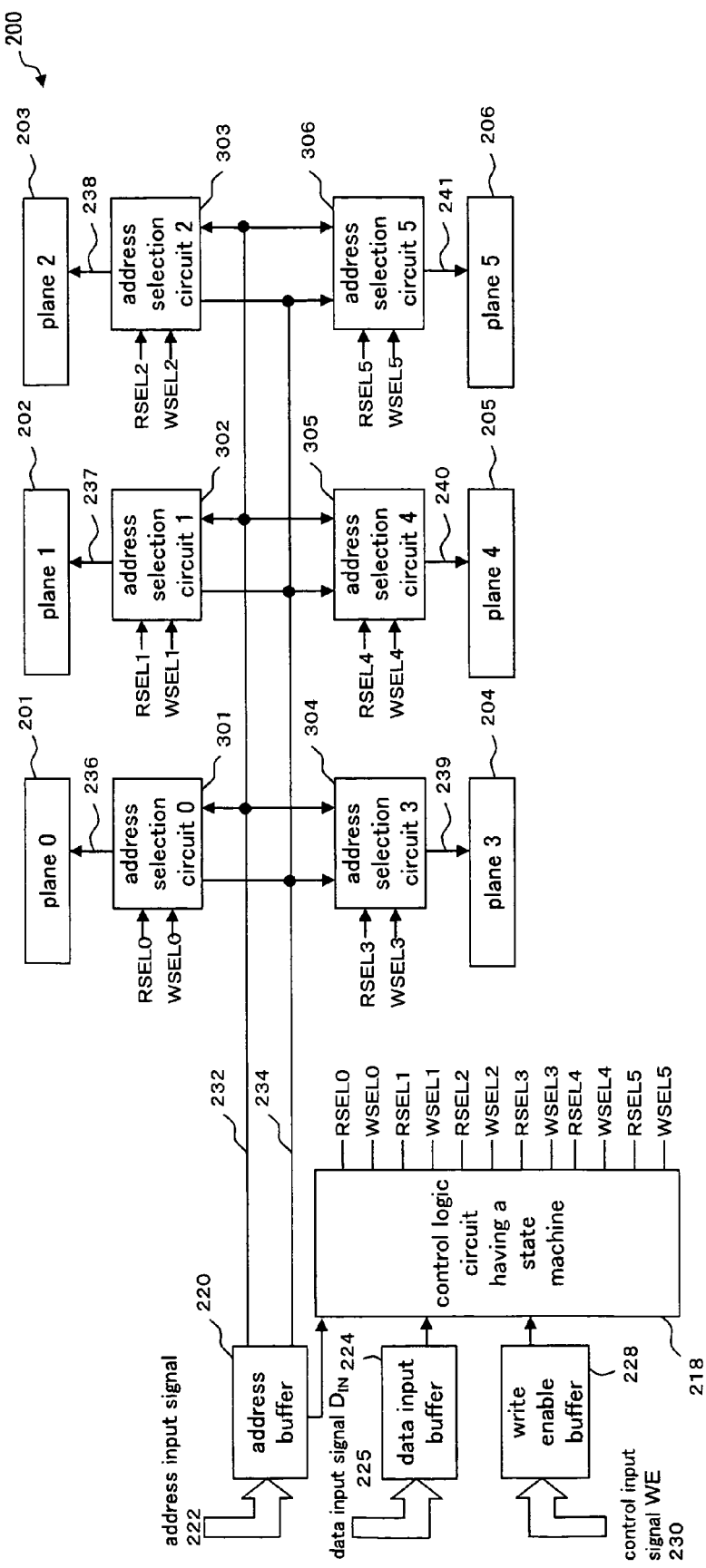
FIG. 22 is a block diagram showing, from the viewpoint of an address process, a schematic configuration of a plural-plane simultaneous operating mechanism in a semiconductor memory device (eleventh embodiment) of the present invention.

FIG. 22 is a block diagram showing a schematic configuration of an address process mechanism in the inventive device 200. A typical address process mechanism in the inventive device 200 capable of simultaneously operating a plurality of planes includes an address buffer 220, a control logic circuit 218 having a state machine, a write enable (WE) buffer 228, a data input ($D_{IN}$) buffer 224, and six planes 201 to 206 of a memory cell array to which address selection circuits 301 to 306 are attached.

The address buffer 220 provides a read address to a read address bus 232 and a write address to a write address bus 234 for selection of the address selection circuits 301 to 306. The address buffer 220 performs communication with the control logic circuit 218. Herein, each of the address buses 232 and 234 is a collection of single address bit lines. The number of bits in each of the address buses 232 and 234 for transmitting bit information to the read address and the write address generally depends on the number of address bits used for reading and writing.

Although FIG. 22 shows an embodiment where one (one set) read address and one (one set) write address are provided simultaneously, the inventive device 200 is not limited to the configuration of this embodiment. Specifically, a plurality of read addresses and/or a plurality of write addresses may be provided simultaneously to the address selection circuits 301 to 306. To provide a plurality of read addresses and a plurality of write addresses, additional addresses buses 232 and 234 are provided.

The address buffer 220 receives an address input signal 222 of a plurality of bits. Preferably, the address input signal 222 is supplied from the outside, to be specific, from an external source of the inventive device 200 to the address buffer 220. Alternatively, the address input signal 222 may be internally generated by an address generator (not shown) provided in the inventive device 200 or the address process mechanism. Preferably, the address buffer 220 has an address sequence circuit controlled by the control logic circuit 218. The address sequence circuit is used to generate a plurality of continuous addresses during a writing operation. As another form, the address sequence circuit may be a part of the control logic circuit 218.

The control logic circuit 218 supplies a plurality of signals in the inventive device 200. Preferably, signals supplied by the control logic circuit 218 include control signals related to programming and erasing, and an operation selection signal.

The data input buffer 224 receives a data input signal $D_{IN}$ 225 of a plurality of bits. Preferably, the data input signal $D_{IN}$ 225 provides a read/write operation command for a command register in the control logic circuit 218. The data input signal $D_{IN}$ 225 is stored in the data input buffer 224 and, as necessary, is supplied to the control logic circuit 218. The data input signal $D_{IN}$ 225 is also data programmed in the memory cell array of the inventive device 200 in a programming operation.

The WE buffer 228 receives a control input signal WE 230 of a plurality of bits. The control input signal WE 230 also called a write enable signal is stored in the WE buffer 228 and is provided to the control logic circuit 218. The control input signal WE 230 is used to make a writing operation function of the inventive device 200 valid.

FIG. 22 shows the configuration of the inventive device 200 from the viewpoint of address designation. FIG. 22 shows, as an example, the six planes 201 to 206 each configured by a memory cell array. The address process mechanism of the inventive device 200 capable of simultaneous operating a plurality of planes is not limited to the six planes. The locally existing address designation and address decoding mechanism have advantages in that the address process mechanism of the inventive device 200 is expansible and can correspond to the various numbers of planes of the memory cell array. In the following description, an arbitrary one plane in N planes will be appropriately referred to as a plane "n". Consequently, although FIG. 22 shows six planes, the number of planes is not limited to six but may be an arbitrary number equal to or more than two.

Each of the six planes 201 to 206 is a memory cell array in which a plurality of memory cells according to any of the first to eighth embodiments are arranged in a row direction and a column direction so as to form a matrix. As the configuration of the memory cell array forming each of the plurality of planes, the array configuration described in the tenth embodiment can be employed, but the present invention is not limited to the array configuration. The numbers of memory cells in the planes, that is, memory capacity may be uniform or non-uniform in the planes.

Each of the planes 201 to 206 has a locally existing address decode logic (not shown). For example, the address decode logic includes a row decoder and a column decoder for the memory cell array of each plane. Preferably, the row decoder includes a word line decoder and a sector decoder. The word line decoder and the sector decoder receive an address signal from corresponding one of the address selection circuits 301 to 306. The column decoder includes a bit line decoder and a column gate. The bit line decoder receives address signals from the address selection circuits 301 to 306. The row decoder and the column decoder are semiconductor memory devices such as a flash memory and known circuit techniques; therefore, their detailed description will not be given here. In the above description, a "sector" is a sub plane obtained by further dividing the memory cell array in one plane. It is assumed in this embodiment that erasure on the sector unit basis is possible. Alternatively, erasure may be performed on the plane unit basis.

In FIG. 22, the control logic circuit 218 provides a series of selection signals to the address selection circuits 301 to 306. The series of selection signals shown in FIG. 22 are RSEL0 to RSEL5 and WSEL0 to WSEL5. One of the functions of the series of selection signals is to select a read address provided from the address buffer 220 and transferred via the read address bus 232, a write address transferred via the write address bus 234, or an individual bit in the read address or write address.

For example, when a read or write address of a proper number of plural bits is selected by the address selection circuit 301 (or any of 302 to 306), the address appears on the plane 0: 201 (or any of planes 1 to 5: 202 to 206) via the interposing row and line decoders (not shown) as a signal 236 (or any of 237 to 241).

In order to select a specific memory cell in the memory cell array, the address of a corresponding digital signal of a plurality of bits is necessary. Consequently, the address in the inventive device 200 is a digital signal of a plurality of bits. In the case where a circuit is described with respect to a specific bit in an address of a plurality of bits in this embodiment, the circuit can be expanded to the plurality of bits under the same concept. Therefore, for example, a circuit for one bit in this embodiment can be expanded in parallel to a circuit for plural bits. Alternatively, in order to achieve the same result or function, it is also possible to multiplex all or a part of the address of a plurality of bits and provide the resultant.

The address input signal 222 in FIG. 22 is an external input address of a plurality of bits and includes an address input bit Ahi shown in FIG. 24 which will be described later. Preferably, an address is input from the outside to the inventive device 200. The address input signal 222 of the plurality of bits includes address information related to the reading and writing operations. Preferably, the external user provides an address to be used for the reading and writing operations. The address input signal 222 is a signal of one or more bits, for example, about 20 bits (depending on the capacity of each plane and the bit width of data) depending on the number of planes for activating a plane selection logic in the control logic circuit 218.

The address buffer 220 includes a plurality of address buffers for separate bits. Preferably, each address buffer has a dual port specification having two output ports. One of the output ports is for a read address and the other output port is for a write address. The read address output is one bit in the read address, and the write address output is one bit in the write address. As another embodiment, each separate address buffer may output a plurality of read addresses or a plurality of write addresses.

The read address and the write address from the address buffer 220 are controlled first or directly by the address input signal 222. The write address is latched into the address buffer 220 and incremented in accordance with an instruction of a specific operation.

Each plane "n" has an accompanying address selection circuit "n". Each address selection circuit "n" selects an address for reading or an address for writing in order to supply a necessary address signal to the plane "n" in accordance with the selection signals RSELn and WSELn generated by the control logic circuit 218. In the case where the signal RSELn is at the high level, the plane "n" is selected for reading operation and a read address is supplied to the plane "n". In the case where the signal WSELn is at the high level, the plane "n" is selected for writing operation and a write address is supplied to the plane "n".

Figure 23:
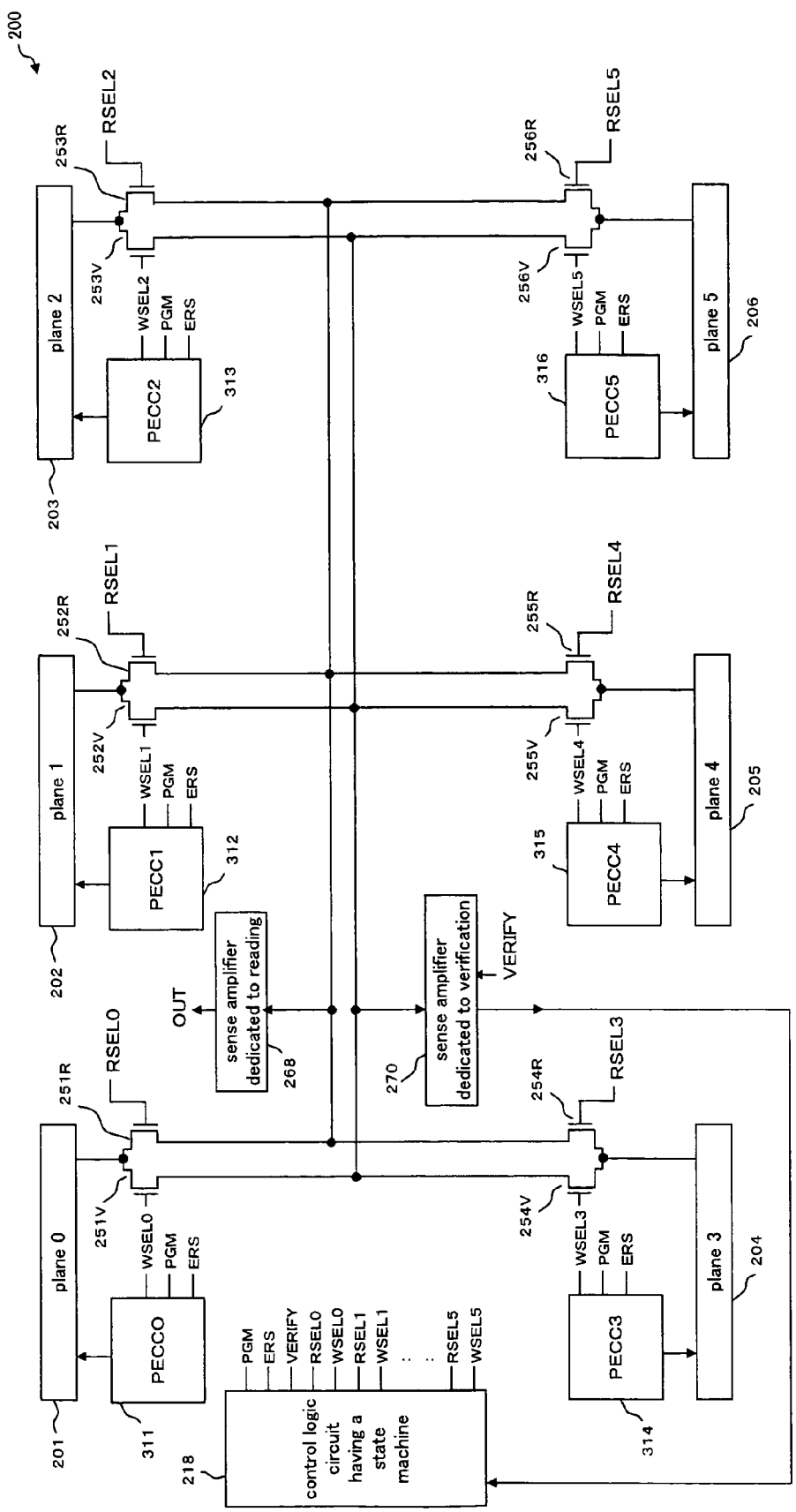
FIG. 23 is a block diagram showing, from the viewpoint of a data process, a schematic configuration of the plural-plane simultaneous operating mechanism in the semiconductor memory device (eleventh embodiment) of the present invention.

FIG. 23 is a block diagram showing the configuration from the viewpoint of data operation related to the plural-plane simultaneous operation of the inventive device 200. A model data operating mechanism of the inventive device 200 capable of simultaneously operating a plurality of planes includes the six planes 201 to 206 of the memory cell array, program/erase control circuits (PECC0 to PECC5) 311 to 316 accompanying the planes 201 to 206, respectively, N-channel MOSFETs 251R and 251V to 256R and 256V, the control logic circuit 218, a sense amplifier 268 dedicated to reading, and a sense amplifier 270 dedicated to verification. Each of the sense amplifiers 268 and 270 includes one or plural sense amplifiers for sensing data from the planes 201 to 206. Herein, "verification" denotes special reading operation for verifying a writing (programming or erasing) operation.

The sense amplifier 268 for reading is connected to the planes 201 to 206 via the N-channel MOSFETs 251R to 256R, respectively. The planes 201 to 206 have the transistors 251R to 256R dedicated to reading, respectively. Naturally, additional transistors dedicated to reading may be also included.

Each of the read transistors 251R to 256R is turned on/off when the read selection signal RSELn for each plane "n" is applied to the gate input. For example, when the read selection signal RSEL0 is at the high level and the read transistor 251R is turned on (conductive), the sense amplifier 268 dedicated to reading can read data in a memory cell in the plane 0. The sense amplifier 268 dedicated to reading reads data of the memory cell and outputs the data from the inventive device 200. For the purpose of outputting the data read by the sense amplifier 268 dedicated to reading from the inventive device 200, a processing circuit such as an output buffer, a data latch, another data reading mechanism or the like and/or the sense amplifier 268 dedicated to reading may be used. Such a processing circuit is not shown in FIG. 23, but is preferably provided in the inventive device 200. As another embodiment, a data output mechanism or the processing circuit may be provided on the outside of the inventive device 200. In this embodiment, it is unnecessary to provide each of the planes with the sense amplifier 268 dedicated to reading.

The sense amplifier 270 dedicated to verification is connected to the planes 201 to 206 via the N-channel MOSFETs 251V to 256V, respectively. The planes 201 to 206 have the transistors 251V to 256V dedicated to verification, respectively. Obviously, the planes may have additional transistors dedicated to verification. Each of the transistors 251V to 256V dedicated to verification is turned on/off when the write selection signal WSELn for each plane "n" is applied to the gate input. For example, when the write selection signal WSEL0 is at the high level and the transistor 251V dedicated to verification is turned on (conductive), the sense amplifier 270 dedicated to verification can verify data of a memory cell in the plane 0. The sense amplifier 270 dedicated to verification detects data information of the memory cell, verifies the information, and supplies the information to the control logic circuit 218 having a state machine for determining the status of the inventive device 200. In this embodiment, like the sense amplifier 268 dedicated to reading, it is unnecessary to provide the sense amplifier 270 dedicated to verification for each plane.

As shown in FIG. 23, the control logic circuit 218 having the state machine supplies the read selection signals RSEL0 to RSEL5 and the write selection signals WSEL0 to WSEL5 together with a plurality of global signals including programming, erasing, and verification signals PGM, ERS, and VERIFY to the inventive device 200. The signal VERIFY is used to control the sense amplifier 270 dedicated to verification. Herein, the "global signal" denotes a signal commonly used for the planes, that is, for the whole device 200 of the present invention, in contrast with a signal dedicated to each plane. The term "global" will be also used in a similar sense below.

The data operating mechanisms of the six planes 201 to 206 have the accompanying program/erase control circuits (PECC0 to PECC5) 311 to 316, respectively. Preferably, each of the program/erase control circuits (PECC0 to PECC5) locally existing in the planes has a power source for programming operation, a power source for erasing operation, a power source for verifying operation, circuits related to supplying, programming and erasing of program data and, as necessary, other power sources. Part or all of the various power sources and the circuits related to programming and erasing may be disposed on the outside of the program/erase control circuits (PECC0 to PECC5). The program/erase control circuits (PECC0 to PECC5) locally existing on the planes are controlled by the global signals PGM and ERS supplied by the control logic circuit 218.

The program/erase control circuits (PECC0 to PECC5) 311 to 316 include AND gate logics. When the signal PGM is input to one or plural AND gate logics and the signal PGM is at the low level (corresponding to the logic value "0"), an output of the AND gate logic(s) becomes low level. As a result, a circuit related to programming (program circuit) is controlled by the AND gate logic. In such a manner, the signal PGM from the control logic circuit 218 controls the program circuit. Similarly, the signal ERS is input to one or plural AND gate logics and the signal ERS is at the low level, an output of the AND gate logic becomes low level. As a result, a circuit related to erasing (erase circuit) is controlled by the AND gate logic. In such a manner, the signal ERS from the control logic circuit 218 controls the erase circuit.

The program circuit and the erase circuit are, preferably, activated by the AND gate logic to which, in addition to the signals PGM and ERS, the write selection signals WSEL0 to WSEL5 are input as necessary. Specifically, when both the write selection signal WSELn and the global control signal PGM are at the high level (logic value "1"), the programming operation is executed only a selected plane "n", and only the program circuit of the plane "n" operates. Similarly, when both the write selection signal WSELn and the global control signal ERS are at the high level (logic value "1"), the erasing operation is performed only on the selected plane "n" and only the erase circuit in the plane "n" operates.

The planes of the inventive device 200 and the group of circuits related to the planes described from the viewpoint of the address process and the data operation shown in FIGS. 22 and 23 operate as a single nonvolatile semiconductor memory device for performing normal conventional writing operation in a wide sense. Specifically, when it can be regarded that a locally existing plane circuit is independent of the other plane circuits, the operation of the plane circuit is similar to that of the single nonvolatile semiconductor memory device. Naturally, the address buffer 220, control logic circuit 218 and two sense amplifiers 268 and 270 common to the planes execute a command and an operation from the global viewpoint faith respect to address designation, decoding, data reading, verification, and operation control.

The transistors are controlled by using the read selection signals RSEL0 to RSEL5 and the write selection signals WSEL0 to WSEL5, and data from the six planes 201 to 206 shown in FIG. 23 is sent to any of the sense amplifier 268 dedicated to reading and the sense amplifier 270 dedicated to verification via the transistors 251R and 251V to 256R and 256V. The sense amplifiers 268 and 270 are sent to the control logic circuit 218. While data is transmitted from one plane to the sense amplifier 268 dedicated to reading, data from any of the other planes can be sent to the sense amplifier 270 dedicated to verification. Similarly, while data is transmitted from one plane to the sense amplifier 270 dedicated to verification, data from any of the other planes can be sent to the sense amplifier 268 dedicated to reading. An output of the sense amplifier 270 dedicated to verification is transferred to the control logic circuit 218 and used to verify that a predetermined-byte (collection of data bits) is programmed or erased.

Preferably, an input/output buffer is used to input/output data from/to the inventive device 200. When reading is executed on one plane, output data is sent from the sense amplifier 268 dedicated to reading to the input/output buffer.

During the programming or erasing process, the control logic circuit 218 transfers status information to the input/output buffer. It enables the external processor to poll the inventive device 200 to check the programming or erasing process state.

When the programming operation is being executed on one plane, any of the other planes can be accessed for reading. For example, during programming of 1-byte data to the plane 0, the control logic circuit 218 supplies the active write selection signal WSEL0 to the address selection circuit 0, and a write address from the address buffer 220 is selected so as to be provided to the row decoder and the column decoder of the plane 0. Further, the control logic circuit 218 stores therein a data byte (write expectation value) to be programmed, from the input/output buffer for verification performed on completion of the programming. Data from the plane 0 is transmitted to the sense amplifier 270 dedicated to verification via the transistor 251V dedicated to verification so as to be compared with the stored input data byte (write expectation value). During an operation of reading the plane 5 started simultaneously, preferably, the control logic circuit 218 stores write data therein, after that, supplies the active read selection signal RSEL5 to the address selection circuit 5, and supplies the read address from the address buffer 220 to the row decoder and the column decoder of the plane 5. Data from the plane 5 is sent to the sense amplifier 268 dedicated to reading via the transistor 251R dedicated to reading. An output of the sense amplifier 268 dedicated to reading is sent to the input/output buffer and, after that, output to an external data bus (not shown).

Similarly, at the time of erasing a sector in the plane 2, all of memory cells of the sector are simultaneously erased. After the batch erasing process, an address sequence circuit in the address buffer 220 is used to generate an address for verifying each of erase bytes in an erased sector. After the plane 2 is erased, during a period in which the address selection circuit 2 selects a write address from the address sequence circuit by an instruction of the control logic circuit 218, the reading operation can be executed in a plane other than the plane 2 by selecting a read address from the address buffer 220 not a write address from the address sequence circuit by using the read selection signal RSELn. During operation of verifying the erasing operation executed on one plane, the control logic circuit 218 verifies erased data by using the sense amplifier 270 dedicated to verification. On the other hand, read data from another plane is sent to the sense amplifier 268 dedicated to reading. In other words, in order to execute the read operation of one plane during execution of the writing operation of the other planes, each of all of the planes has a write/read address path and a read/verified output data path which can be selected by the read selection signal RSELn and the write selection signal WSELn.

Figure 24:
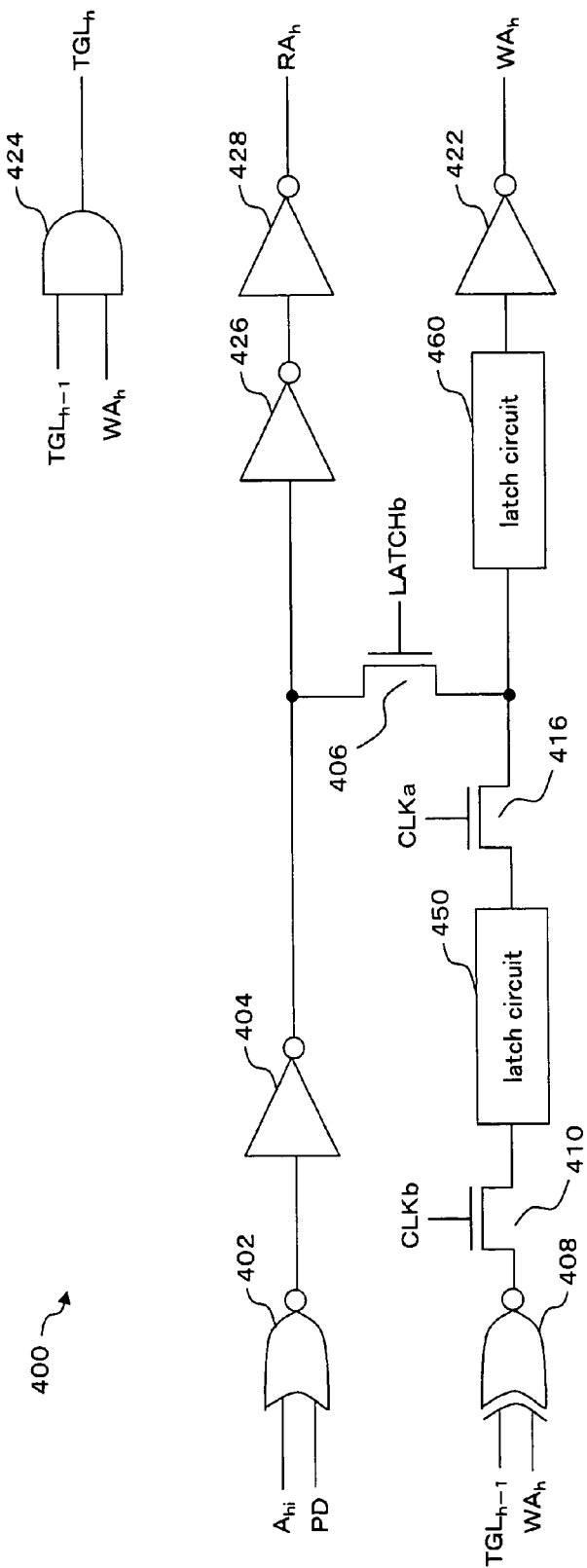
FIG. 24 is a logic circuit diagram showing a configuration example of a dual port address buffer in the semiconductor memory device (eleventh embodiment) of the present invention.

FIG. 24 is a simplified logic circuit diagram showing a dual-port address buffer (individual address buffer) 400 based on the plural-plane simultaneous operation of the inventive device 200. The address buffer 220 shown in FIG. 22 has a series of address buffers 400. An address bit RAh is output to the read address bus 232 and an address bit WAh is output to the output address bus 234. The address buffer 400 has a NOR gate 402, an exclusive NOR gate (or an equivalent circuit) 408, a first latch circuit 450, a second latch circuit 460, inverters 404, 422, 426 and 428, N-channel transistors 406, 410 and 416 as switch elements, and an AND gate 424. Each of the first and second latch circuits 450 and 460 is configured by connecting an input of one of a pair of inverters (not shown) to an output of the other inverter.

A conventional general address from the viewpoint of the plural-plane simultaneous operation of the inventive device 200 has a drawback in that address information corresponding to only one operation is output at a time. In other words, in a general address buffer, a read address is output during the reading operation and a write address is output during the writing operation.

In contrast, in the dual-port address buffer 400, a read address and a write address operate independently or simultaneously in accordance with a control signal supplied to the dual-port address buffer 400.

The dual-port address buffer 400 receives the address input bit Ahi. The address input bit Ahi is, preferably, one bit in a series of address bits supplied from the outside and is included in the address input signal 222 shown in FIG. 22. The first and second latch circuits 450 and 460 are used to store address bits and configure a part of the address sequence circuit. The address sequence circuit is configured by connecting a plurality of dual-port address buffers 400 in series.

The NOR gate 402 receives the address input bit Ahi and an input signal PD. The input signal PD is a power down signal and is used to power-down the address buffer 220. Preferably, the input signal PD is also used to make a clock buffer circuit inactive. Since an output (logic value) of the NOR gate becomes "1" when all of inputs are "0". When the signal PD shifts to the high level, that is, during power-down, an output of the NOR gate 402 is always at the low level (logic value "0") irrespective of the value of the address input bit Ahi. The address outputs RAh and WAh do not depend on the address input bit Ahi, and the address buffer 400, that is, the address buffer 220 is made inactive. An output of the NOR gate 402 is connected to the inverter 404. An output of the inverter 404 is connected to the source of the N-channel transistor 406 and an input of the train of the inverters 426 and 428. The read address bit RAh is output from the inverter 428. The gate of the transistor 406 receives an input signal LATCHb. The input signal LATCHb is used to connect or separate the output of the NOR gate 402 to/from the second latch circuit 460. Specifically, formation of a path extending from the address input bit Ahi to the write address bit WAh via the second latch circuit 460 is controlled. When the input signal LATCHb becomes the high level, the transistor 406 is turned on and the address input bit Ahi including write and read information is loaded to the second latch circuit 460. In such a manner, the write address bit WAh is controlled by the address input bit Ahi. When the input signal LATCHb is at the low level, the transistor 406 is turned off, and the read address bit RAh is controlled by the address input bit Ahi. Even if the second latch circuit 460 is separated from the address input bit Ahi when the input signal LATCHb is at the low level, a write address is stored in the address sequence circuit.

The exclusive NOR gate 408 receives an input signal $TGL_{h-1}$ and the write address bit WAh. The input signal $TGL_{h-1}$ is a toggle signal output from the immediately preceding address buffer in the address buffers 400 connected in series. An output toggle signal $TGL_h$ of the present address buffer 400 is generated from the output toggle signal $TGL_{h-1}$ of the immediately preceding address buffer 400. According to the output toggle signal $TGL_{h-1}$ of the immediately preceding address buffer 400 and the write address bit WAh of the present address buffer 400, the output signal WAh of the address buffer is toggled. If the output toggle signal $TGL_{h-1}$ of the immediately preceding address buffer 400 is at the low level, the output signal WAh is not toggled. The exclusive NOR gate 408 is connected to the source of the N-channel transistor 410, and the transistor 410 receives an input clock signal CLKb by its gate input. The drain of the N-channel transistor 410 is connected to the first latch circuit 450. The first latch circuit 450 is connected to the source of the N-channel transistor 416, and the transistor 416 receives an input clock signal CLKa by its gate input. The drain of the N-channel transistor 416 is connected to the second latch circuit 460 and the N-channel transistor 406. The second latch circuit 460 is connected to the inverter 422 for generating the write address bit WAh as a part of the write address depending on the operation of the address buffer 400. The address bit output WAh is fed back to the exclusive NOR gate 408. The input signal $TGL_{h-1}$ and the write address bit WAh are input to the AND gate 424 for generating the output toggle signal $TGL_h$.

A complementary signal (NOR signal) to the read address bit RAh can be used in the inventive device 200. For example, an output of the inverter 426 can provide a complementary signal to the read address bit RAh. In this case, it is sufficient to include a complementary signal to the read address bit of each address buffer 400 in the read address bus 232 or to separately provide a read address bus for complementary signals.

A complementary signal to the write address bit WAh can be used in the inventive device 200. For example, an output of the second latch circuit 460 can provide a complementary signal to the write address bit WAh. In this case, it is sufficient to include a complementary signal to the write address bit of each address buffer 400 in the write address bus 234 or to separately provide a write address bus for complementary signals.

During the reading operation, the read address bit RAh is used as a read address. When the reading operation is executed, the input signal LATCHb usually shifts to the low level and maintains the low level as long as a write address does not have to be loaded to the second latch circuit 460 during the reading period. When the input signal PD of the NOR gate 402 is held at the low level, an output of the NOR gate 402 becomes a complementary signal to the address input bit Ahi, and the level of an output of the inverter 404 becomes the same as that of the address input bit Ahi. As a result, the read address bit RAh is controlled so as to follow the address input bit Ahi.

In the writing operation, the write address bit WAh is used as a program or erase address bit. Once a write address is loaded or internally generated, the input signal LATCHb is held at the low level, the N-channel transistor 406 is turned off, and the second latch circuit 460 is separated from the address input bit Ahi and becomes independent. In a situation that a write address has to be loaded, the input signal LATCHb shifts to the high level. In the program operation, the write address bit WAh is latched in the address buffer 400 via the first and second latch circuits 450 and 460 and feedback of the signal WAh.

A case will now be assumed in which the address input signal 222 enters from the outside and the address input bit Ahi is a write address. When the input signal LATCHb shifts to the high level, the write address bit is latched by the first and second latch circuits 450 and 460 in the address buffer 400 and stored. The write address is output as the write address bit WAh during the writing operation. In the reading operation, the read address bit RAh is transmitted to a proper plane. Even if the input signal LATCHb shifts to the low level, the write address is latched in the address buffer 400, so that it can be still used.

An operation of verifying whether or not data in memory cells in all of addresses in an erase range has been properly erased in the erasing operation is performed. The address sequence circuit is assembled in the address buffer 400 so as to be linked with the verifying process in a necessary address position. The address sequence process is achieved by the input clock signals CLKa and CLKb. Preferably, the control logic circuit 218 generates the input clock signals CLKa and CLKb. The input clock signal CLKa synchronizes with a reference clock which is internally generated. On the other hand, the input clock signal CLKb can be set so as to be toggled each time embedded series of operations in the address position is finished. As described above, when an internal address change is necessary, that is, when an internal address has to be changed to the subsequent address, the internal address is properly incremented. Although the input clock signals CLKa and CLKb can be generated via a proper circuit configuration, the input clock signal CLKb has to recognize end of embedded series of operations in the address position and is advantageously provided by the control logic circuit 218. In a useful embodiment, the input clock signal CLKb is a complementary signal to the input clock signal CLKa.

Figure 25:
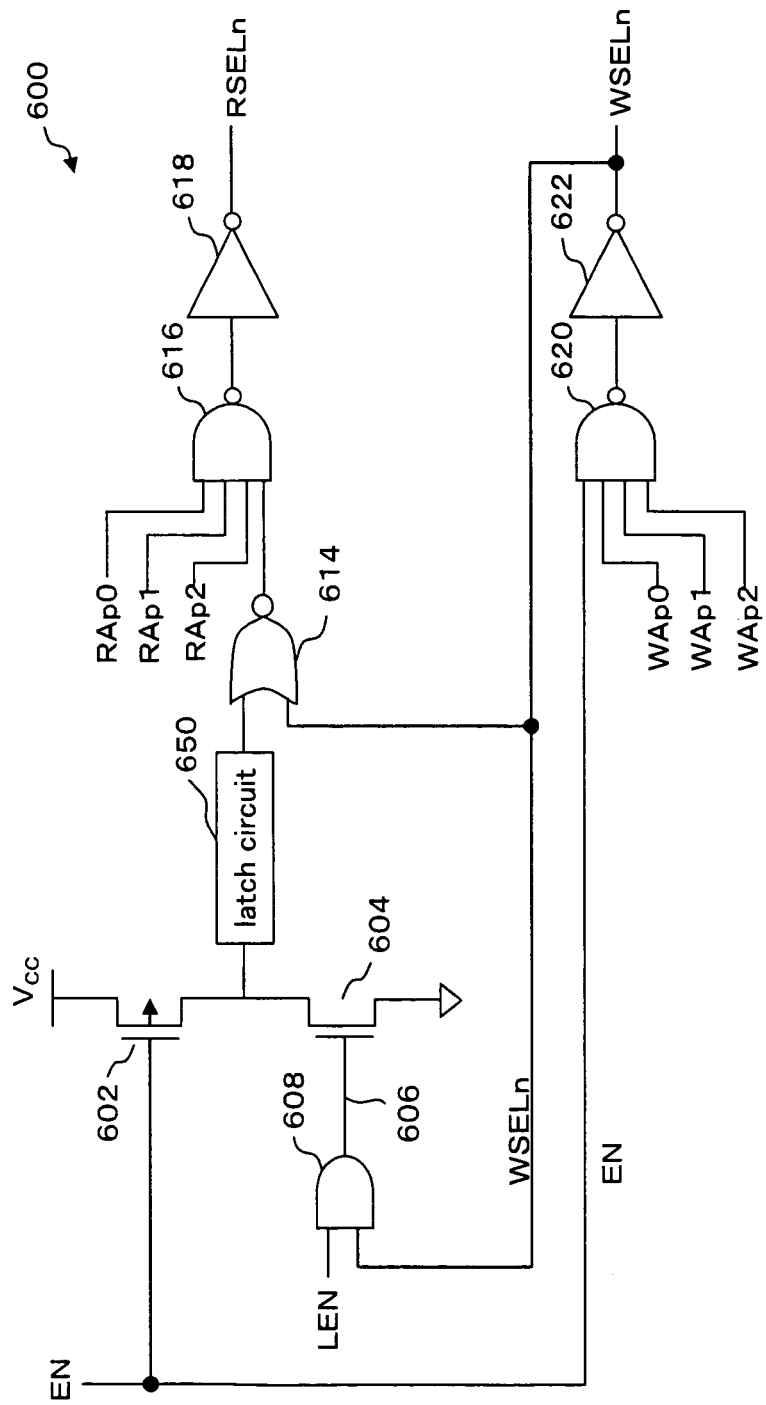
FIG. 25 is a logic circuit diagram showing a read/write operation selection signal generation circuit as a part of a control logic circuit in the semiconductor memory device (eleventh embodiment) of the present invention.

FIG. 25 is a simplified logic circuit diagram of a read/write operation selection signal generation circuit 600 based on the plural-plane simultaneous operation of the inventive device 200. Preferably, the control logic circuit 218 has a series of read/write operation selection signal generation circuits 600 corresponding to the six planes 201 to 206 in a one-to-one correspondence. Generally, when N planes exist, N operation selection signal generation circuits 600 exist. As shown in FIG. 25, the operation selection signal generation circuit 600 is configured by a 2-input AND gate 608, a latch circuit 650, a P-channel MOSFET 602, an N-channel MOSFET 604, a 2-input NOR gate 614, and two 4-input NAND gates 616 and 620 having inverters 618 and 622, respectively. The latch circuit 650 is configured by connecting an input of one of a pair of inverters (not shown) and an output of the other inverter.

An enable signal EN is supplied to the gate of the P-channel MOSFET 602 and an input of the 4-input NAND gate 620. The other three inputs of the 4-input NAND gate 620 are address bit signals WAp0, WAp1 and WAp2 used for plane decoding which will be described later. In the case of six planes, only six combinations out of total eight combinations of inversion values and non-inversion values of the three address bit signals WAp0, WAp1 and WAp2 are used. In the case where a specific plane has capacity twice as large as that of another plane, an operation of making two combinations correspond to the specific plane is performed. In this case, the operation selection signal generation circuit 600 corresponding to the plane uses a 3-input NAND gate in place of the 4-input NAND gate 620. In FIG. 25, the three address bit signals WAp0, WAp1 and WAp2 also include inversion signals. An output of the NAND gate 620 is connected to the input of the inverter 622 and both of the gates substantially function as an AND gate. An output of the inverter 622 is a write selection signal WSELn. The signal WSELn is fed back and input to the AND gate 608 and the NOR gate 614. A latch enable signal LEN is supplied to the other input of the 2-input AND gate 608. An output of the AND gate 608 is a latch enable signal LENn for the n-th plane at a node 606. The N operation selection signal generation circuits 600 generate N read selection signals RSELn, N write selection signals WSELn and N internal signals LENn.

The source of the P-channel MOSFET 602 is connected to the power source voltage Vcc, and the drain of the P-channel MOSFET 602 is connected to the drain of the N-channel MOSFET 604 and the input of the latch circuit 650. The source of the N-channel MOSFET 604 is connected to the ground (ground potential) and the gate of the N-channel MOSFET 604 receives the signal LENn from the output of the AND gate 608 at the node 606. An output of the latch circuit 650 is connected to one of the inputs of the 2-input NOR gate 614.

An output of the NOR gate 614 is connected to an input of the 4-nput NAND gate 616. The other three inputs of the 4-input NAND gate 616 are address bit signals RAp0, RAp1 and RAp2 used for plane decoding which will be described later. In the case of six planes, only six combinations out of total eight combinations of inversion values and non-inversion values of the three address bit signals RAp0, RAp1 and RAp2 are used. In the case where a specific plane has capacity twice as large as that of another plane, an operation of making two combinations correspond to the specific plane is performed. In this case, the operation selection signal generation circuit 600 corresponding to the plane uses a 3-input NAND gate in place of the 4-input NAND gate 616. In FIG. 25, the three address bit signals RAp0, RAp1 and RAp2 also include inversion signals. An output of the NAND gate 616 is connected to the input of the inverter 618 and both of the gates substantially function as an AND gate. An output of the inverter 618 is a read selection signal RSELn.

The operation selection signal generation circuit 600 generates the read selection signal RSELn and the write selection signal WSELn. The read selection signal RSELn and the write selection signal WSELn correspond to the n-th plane. In FIG. 22, the six planes 201 to 206 based on the plural-plane simultaneous operation of the inventive device 200 are shown. Therefore, the six read selection signals RSEL0 to RSEL5 and six write selection signals WSEL0 to WSEL5 exist. The operation selection signal generation circuit 600 is designed so that the read selection signal RSELn becomes the high level or active when reading operation is executed on the plane "n", and the write selection signal WSELn becomes the high level or active when the writing operation (specifically, programming or erasing operation) is executed on the plane "n".

The predetermined number of bits in the read/write address is used to determine a plane to which a memory cell to be read/written belongs. In the case where the number of planes is four, only two bits are necessary to unconditionally designate a plane. When the number of planes is six (or seven or eight) as in this embodiment, three bits are necessary. Generally, for N planes, "y" bits (where y is a natural number satisfying the relation of 2N>2$^y$≧N) are necessary. For each of combinations of y inputs, only one output line becomes the high level or active, and the plane "n" on which the reading or writing operation is to be performed is unconditionally specified by the active output.

Each of the read and write addresses is characterized by having a first part and a second part. Generally, the address of each part is configured by a series of plural address bits. Each part in the read/write address includes information.

The number of bits of each of the parts of the read/write address depends on information to be transmitted by the address of the part. For example, the first part of the read/write address is used to determine a plane to which a memory cell to be read/written belongs, that is, for a plane decoding process. The second part of the read/write address is used to determine the location of a memory cell to be read/written in one plane. Further, information regarding intentional use of an address in the read/write operation is coded in the address input signal 222.

In the inventive device 200 having the 6-plane configuration, N denotes six and can be expressed by three address bits. Specifically, in the embodiment shown in FIG. 22, the first part of the read/write address consists of three bits. A typical bit in a series of read addresses is the read address bit RAh shown in FIG. 24. When the case where the read address has a length of 20 bits is assumed, three bits are used for the plane decoding process and three typical bits are referred to as RAp0, RAp1 and RAp2. The plane decoding bits constructing the first part of the read address are input to the NAND gate 616 shown in FIG. 25 to generate the read selection signal RSELn. Generally, inversion and non-inversion values of the read address bits RAp0, RAp1 and RAp2 representatively shown as RAh are supplied to the N NAND gates 616 to generate N read selection signals. N combinations out of 2$^y$ possible combinations of the inversion and non-inversion values of the read address bits RAp0, RAp1 and RAp2 are used for the plane decoding process.

Similarly, the typical bit of the series of write addresses is the write address bit WAh shown in FIG. 24. Three bits in the write address bits are used for the plane decoding process and the three typical bits are referred to as WAp0, WAp1 and WAp2. The plane decode bit constructing the first part of the write address is input to the NAND gate 620 shown in FIG. 25 to generate the write selection signal WSELn. Generally, inversion and non-inversion values of the write address bits WAp0, WAp1 and WAp2 representatively shown as WAh are supplied to N NAND gates 620 to generate N write selection signals. N combinations out of 2$^y$ possible combinations of the inversion and non-inversion values of the write address bits WAp0, WAp1 and WAp2 are used for the plane decoding process.

The circuit operation in FIG. 25 is mainly performed by three signals in addition to the feedback signal WSELn. The enable signal EN is at the low level in the reading operation and is, preferably, a pulse signal of generating one pulse to start the writing operation. The latch enable signal LEN is at the low level in the reading and programming operations and is, preferably, a pulse signal of generating one pulse to start the erasing operation. The latch enable signal LENn for the n-the plane at the node 606 is made active when the signal WSELn is at the high level and the signal LEN generates a pulse or shifts to the high level. In other words, when the writing operation is activated for the plane "n" and the writing operation is the erasing operation, the signal LENn is made active.

During the reading operation, the enable signal EN is at the low level or inactive. As a result, an output of the NAND gate 620 becomes the high level. Consequently, an output of the inverter 622 becomes the low level and the write selection signal WSELn becomes the low level or inactive. Therefore, the write selection signal WSELn is always at the low level in the reading operation. When the write selection signal WSELn is at the low level, the latch enable signal LENn for the n-the plane at the node 606 is at the low level irrespective of the value of the signal LEN (which is at the low level in the reading operation), and the transistor 604 is in an off state. Since the gate input EN of the P-channel transistor 602 is at the low level, the P-channel transistor 602 is turned on and an input of the latch circuit 650 is increased to the high level. The NOR gate 614 receives an output of the latch circuit 650 and the write selection signal WSELn. Since the output of the latch circuit 650 and the write selection signal WSELn are at the low level, an output of the NOR gate 614 becomes the high level. As a result, a proper combination of the read address bits for decoding the plane "n" is provided together with the high-level output of the NOR gate 614 to the input of the NAND gate 616. As a final result, in the case where the reading operation is executed on the plane "n", the read selection signal RESLn becomes active (high level).

In the programming operation, preferably, the enable signal EN is pulsed once to start the writing operation. Specifically, when the enable signal EN shifts to the high level, an output of the NAND gate 620 becomes the low level, and an output of the inverter 622 becomes the high level. The situation is realized when a proper combination (a combination for outputting a high level) of write address bits for decoding the plane "n" is provided together with the pulsed active enable signal EN to the input of the NAND gate 620. The write selection signal WSELn becomes active or the high level and drives an output of the NOR gate 614 to the low level, the NAND gate 616 becomes the high level, and the read selection signal RSELn becomes the low level or inactive. Therefore, the write selection signal WSELn of the high level forces the read selection signal RSELn to the low level so as not to cause competition of operation modes in one plane. As a final result, in the case where the writing operation, in this embodiment, the programming operation is executed for the plane "n", the write selection signal WSELn becomes active (high level).

In the erasing operation, the enable signal EN is pulsed preferably once to start the writing operation. Specifically, when the enable signal EN shifts to the high level, an output of the NAND gate 620 becomes the low level, and an output of the inverter 622 becomes the high level. The situation is realized when a proper combination (a combination for outputting a high level) of write address bits for decoding the plane "n" is provided together with the pulsed active enable signal EN to the input of the NAND gate 620. After the enable signal EN shifts to the high level, the signal LEN is pulsed. The latch enable signal LENn for the n-the plane at the node 606 becomes active when the signal WSELn is at the high level and the signal LEN is pulsed or shifts to the high level. Specifically, the latch enable signal LENn is active and the N-channel transistor 604 is turned on at the rising edge of the signal LENn of the gate input. An input of the latch circuit 650 is decreased to the ground level, and an output of the latch circuit 650 becomes the high level. Since the signal WSELn is the high level and the output of the latch circuit 650 is at the high level, the NOR gate 614 shifts to the low level and, as a result, the read selection signal RSELn becomes the low level or inactive. Once the plane "n" is selected as an object of the erasing operation, the read selection signal RSELn does not shift to the high level. The latch circuit 650 forces the read selection signal RSELn to the low level until the enable signal EN shifts to the low level and the reading operation is started. The signal LEN is pulsed a plurality of times to select a plurality of sectors to be erased in the plane "n". As a final result, in the case where the writing operation, in this embodiment, the erasing operation is executed for the plane "n", the write selection signal WSELn becomes active (high level).

The enable signal EN and the latch enable signal LEN are generated by the control logic circuit 218 having the state machine.

Figure 26:
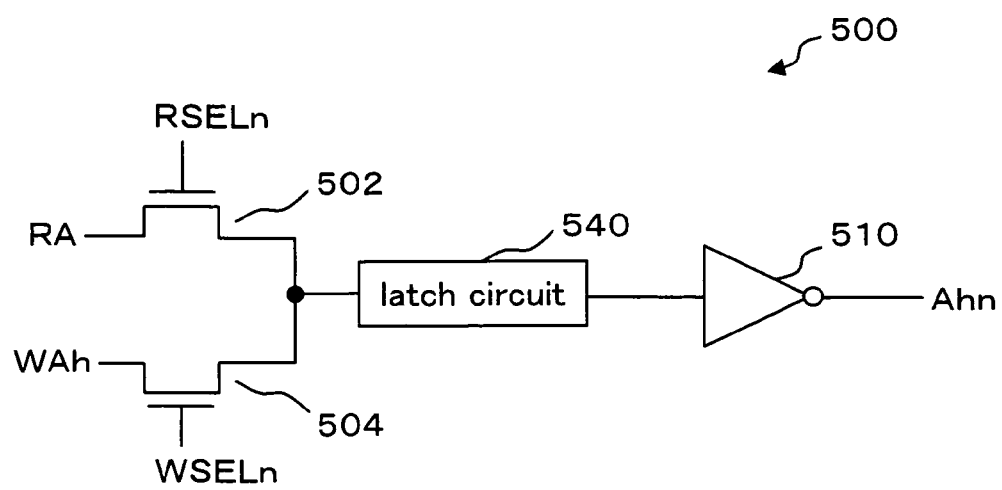
FIG. 26 is a logic circuit diagram showing a first configuration example of an address selection circuit unit as a component of an address selection circuit locally existing in each of a plurality of planes in the semiconductor memory device (eleventh embodiment) of the present invention.

FIG. 26 shows an address selection circuit unit 500 of a first typical example, based on the inventive device 200 capable of simultaneously operating a plurality of planes. Each of the address selection circuits 301 to 306 has a series of address selection circuit units 500. The address selection circuit unit 500 of the first typical example has N-channel transistors 502 and 504, a latch circuit 540 and an inverter 510. The latch circuit 540 is configured by connecting an input of one of a pair of inverters (not shown) and an output of the other inverter. Each address selection circuit unit 500 is configured to receive the read address bit RAh and the write address bit WAh. Generally, when the read address has "q" address bits, "q" RAh values exist. Similarly, when the write address has "q" address bits, "q" WAh values exist. Only read or write address bits necessary to select one or plural memory cells in one plane are provided for the address selection circuit unit 500. The other bits of the read or write address are supplied to the control logic circuit 218 to generate the read selection signal RSELn and the write selection signal WSELn. By the read selection signal RSELn and the write selection signal WSELn, a proper plane for the plural-plane simultaneous reading/writing operation is selected or not selected. In the operation of erasing or programming the plane "n", the write selection signal WSELn is at the high level and the read selection signal RSELn is at the low level. In a specific plane "n", the read selection signal RSELn and the write selection signal WSELn have a complementary relation. Therefore, the transistor 502 is off and the transistor 504 is on (conductive state). As a result, the write address bit WAh is transferred to the latch circuit 540. The write address bit WAh appears in an output of the inverter 510 as an address bit Ahn of the plane "n". Similarly, in the reading operation of the plane "n", the read selection signal RSELn is at the high level, and the write selection signal WSELn is at the low level. The transistor 502 is on (conductive state) and the transistor 504 is off. As a result, the read address bit RAh is transferred to the latch circuit 540. The read address bit RAh appears in an output of the inverter 510 as the address bit Ahn of the plane "n".

Figure 27:
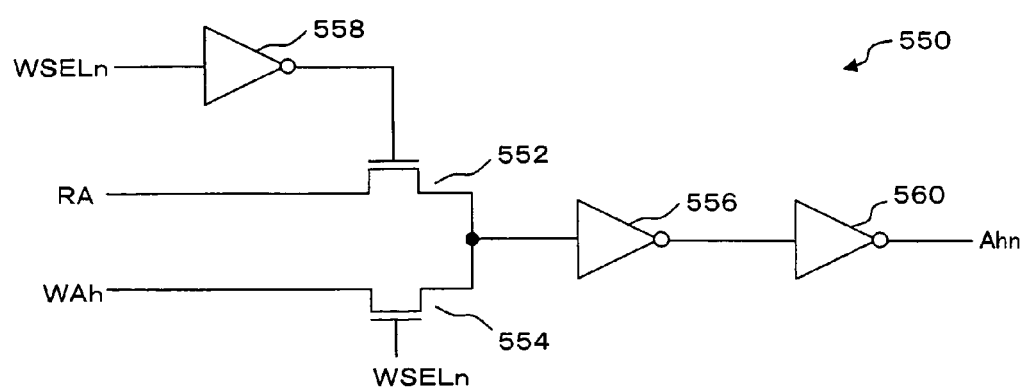
FIG. 27 is a logic circuit diagram showing a second configuration example of an address selection circuit unit as a component of the address selection circuit locally existing in each of the plurality of planes in the semiconductor memory device (eleventh embodiment) of the present invention.

FIG. 27 shows an address selection circuit unit 550 of a second typical example, based on the inventive device 200 capable of simultaneously operating a plurality of planes. Each of the address selection circuits 301 to 306 has a series of address selection circuit units 550. The address selection circuit unit 550 of the second typical example has N-channel transistors 552 and 554 and inverters 556, 558 and 560.

For designing, the address selection circuit unit 550 uses the fact such that the read selection signal RSELn and the write selection signal WSELn have the complementary relation on a specific plane "n". The write selection signal WSELn is supplied to the gate of the transistor 554 to select the write address bit WAh and, on the other hand, a complementary signal (inversion signal) of the write selection signal WSELn is output from the inverter 558 and is supplied to the gate of the transistor 552 to select the read address bit RAh. In place of the latch circuit corresponding to the latch circuit 540 in FIG. 26, one inverter 556 is disposed in front of the inverter 560. Except for this point, the address selection circuit unit 550 operates in a manner similar to the address selection circuit unit 500 in FIG. 26.

As an example, all of the circuit elements shown in FIGS. 22 and 23 are included in a single integrated circuit chip. Address and control inputs to the inventive device 200 depend on the memory capacity and the interface configuration. Therefore, it is understood that the embodiments shown in FIGS. 22 and 23 function also in another interface mounting having another address and control input configuration accompanying a different memory capacity.

In an application of the standard mechanism of the typical example of the inventive device 200 capable of simultaneously operating a plurality of planes, a valid data memory region is configured by storing data and a boot code to one plane and storing a control code to another plane. A control code capable of providing a command sequence for instructing programming or erasure of a data sector in one plane, for example, the plane 2 can reside as an execution code in another plane, for example, the plane 0. While the plane 2 is subjected to programming or erasing, the system can manage executing the code from the plane 0 or another plane to control another system. Similarly, depending on the system configuration, while the CPU executes the code from the first plane, another plane can be subjected to the programming/erasing operation. Preferably, plane switching wait time and the programming/erasing operation for executing reading are not interrupted. Consequently, the read/write cycle time of the CPU can be shortened, the data throughput can be maximized, necessity of adding hardware is eliminated, and the whole system cost can be reduced.

The inventive device 200 is a nonvolatile semiconductor memory device having a higher degree of freedom, designed efficiently, and capable of simultaneously operating a plurality of planes. In the foregoing embodiment, the address designation, address selection, operation control signal, operation control logic and access circuits locally existing on each plane are provided. By a separate structure locally existing on each plane, the function expansion of simultaneous operation of dual planes (two planes) to plural planes (three or more planes) can be easily put into practical use. In the foregoing embodiment, the expansible, very-flexible plural-plane structure capable of simultaneously operating a plurality of planes, that is, capable of performing simultaneous reading/writing is provided.

Further, the inventive device 200 provides a nonvolatile semiconductor memory device capable of simultaneously operating a plurality of planes including the address buffer and the decoding mechanism. During the period of the reading operation on one of N planes, the writing operation can be performed on only arbitrary one of the other N-1 planes. During the period of the writing operation on one of N planes, the reading operation can be performed on only arbitrary one of the other N-1 planes. The address buffer and the decoding mechanism include a control logic circuit, an address selection circuit locally existing on each plane, and an address buffer circuit. The control logic circuit is used to generate N read selection signals each selecting one plane from the N planes for the reading operation and N write selection signals each selecting one plane from the N planes for the writing operation. Each address selection circuit is configured so as to be able to receive one of the N read selection signals and one of the N write selection signals from the control logic circuit. The address buffer circuit is used to simultaneously provide a read address and a write address to access the memory cell array. The first part of each of the read and write addresses is provided for the control logic circuit to generate N read selection signals and N write selection signals. The second part of each of the read and write addresses is provided for each address selection circuit.

One advantage of the inventive device 200 is that the dual-port address buffer system is employed. Both of a read address bit and a write address bit are output simultaneously from the address buffer. Another advantage of the inventive device 200 is that read/write selection signals are provided that respectively corresponded to the N planes and perform selection or non-selection of planes for the reading/writing operation. Yet another advantage of the inventive device 200 is that the circuit for interfacing the sense amplifier circuit locally exists in each plane and can be easily adapted to expansion of the number of planes which can operate simultaneously.

Although the embodiment of the inventive device 200 has been disclosed and described above, the present invention can be variously modified. For example, the P-channel and N-channel transistors may be replaced with each other. In the circuit diagrams used in the foregoing embodiment, specific transistor sizes such as a channel width and a channel length for forming each of the displayed circuits are not shown. The proper sizes are appropriately selected according to design requirements, capabilities and restrictions of an integrated circuit manufacturing process used to realize the inventive device 200 and performances required for a specific device.

In the detailed description of the inventive device 200, in the description of the signal levels, description or expression of "high level", "active" and the like denotes that a digital signal is logically at the high level and corresponds to the logic value "1" in normal binary logic. Similarly, the expression "pulsed" denotes a mode in which a digital signal temporarily shifts to the high level and returns to the original state. Further, the description or expression of "low level", "inactive" and the like denotes that a digital signal is logically at the low level and corresponds to the logic value "0" in normal binary logic.

The terms "external user" and "external source" denote a processor and other devices requesting to access the inventive device 200.

The term "latch" or "latch circuit" denotes a temporary data storing device. The description "to latch" denotes an operation of temporary storing data. Although the example of the latch circuit configured by two inverters has been described in the foregoing embodiment, the latch circuit may be formed by a flip flop circuit such as a delayed flip flop.

Twelfth Embodiment

Figure 28:
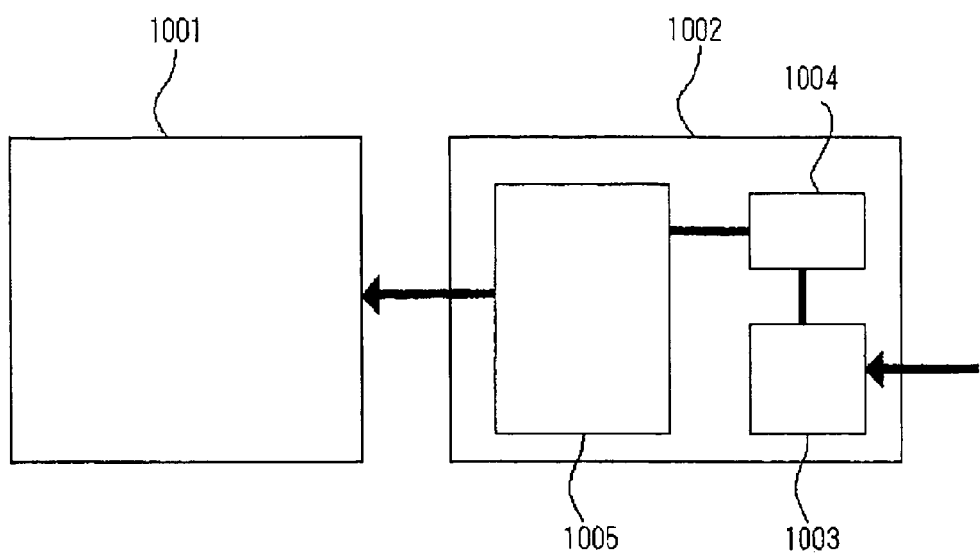
FIG. 28 is a schematic configuration diagram of a liquid crystal display (twelfth embodiment) in which the semiconductor memory device of the present invention is assembled.

As an application example of the semiconductor memory device, for example, as shown in FIG. 28, a rewritable nonvolatile memory for image adjustment of a liquid crystal panel can be mentioned.

A liquid crystal panel 1001 is driven by a liquid crystal driver 1002. In the liquid crystal driver 1002, a nonvolatile memory 1003, an SRAM 1004, and a liquid crystal driver circuit 1005 are provided. The nonvolatile memory 1003 is configured by the memory cell of the present invention, more preferably, the semiconductor memory device of any of the tenth to thirteenth embodiments. The nonvolatile memory 1003 can be rewritten from the outside.

Information stored in the nonvolatile memory 1003 is transferred to the SRAM 1004 at the time of turn-on of the power source of an apparatus. The liquid crystal driver circuit 1005 can read stored information from the SRAM 1004 as necessary. By providing the SRAM, high reading speed of stored information can be achieved.

The liquid crystal driver 1002 may be externally attached to the liquid crystal panel 1001 as shown in FIG. 28 or formed on the liquid crystal panel 1001.

In a liquid crystal panel, tones displayed by applying voltages in multiple grades to pixels are changed. The relation between the given voltage and the displayed tone varies according to products. Consequently, information for correcting variations in each product after completion of the product is stored and correction is made on the basis of the information, thereby enabling the picture qualities of products to be made uniform. It is therefore preferable to mount a rewritable nonvolatile memory for storing correction information. As the nonvolatile memory, it is preferable to use the memory cell of the present invention. Particularly, it is preferable to use the semiconductor memory device of the eleventh embodiment in which memory cells of the present invention are integrated.

By using the memory cell of the present invention as a nonvolatile memory for image adjustment of the liquid crystal panel, a process of simultaneously forming the memory cell and a circuit such as the liquid crystal driver is facilitated. Thus, the manufacturing cost can be reduced.

Thirteenth Embodiment

Figure 29:
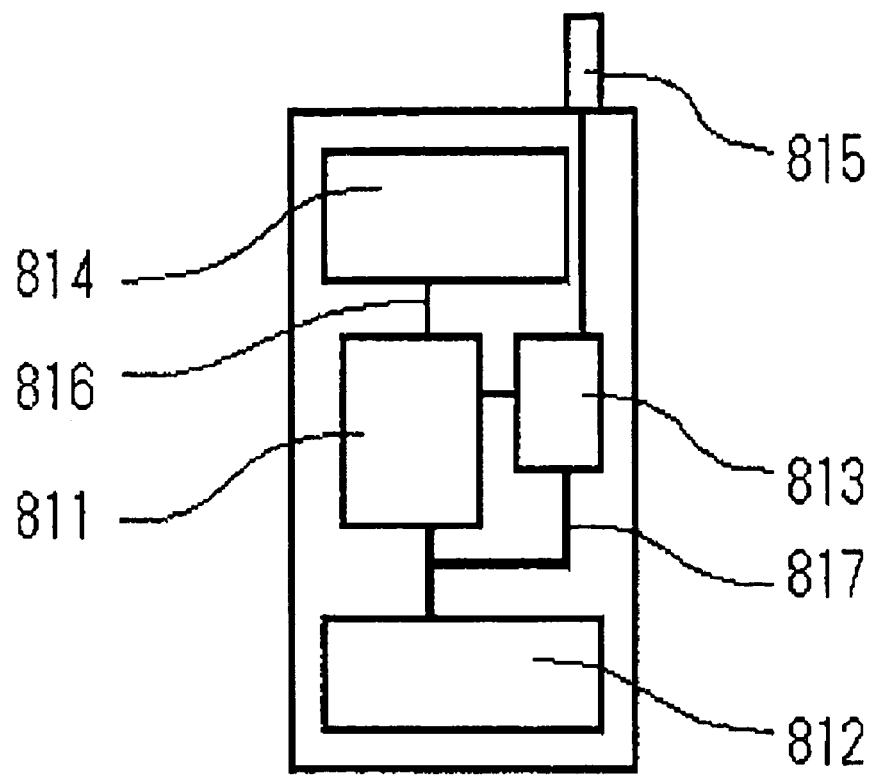
FIG. 29 is a schematic configuration diagram of a portable electronic apparatus (thirteenth embodiment) in which the semiconductor memory device of the present invention is assembled.
Figure 30:
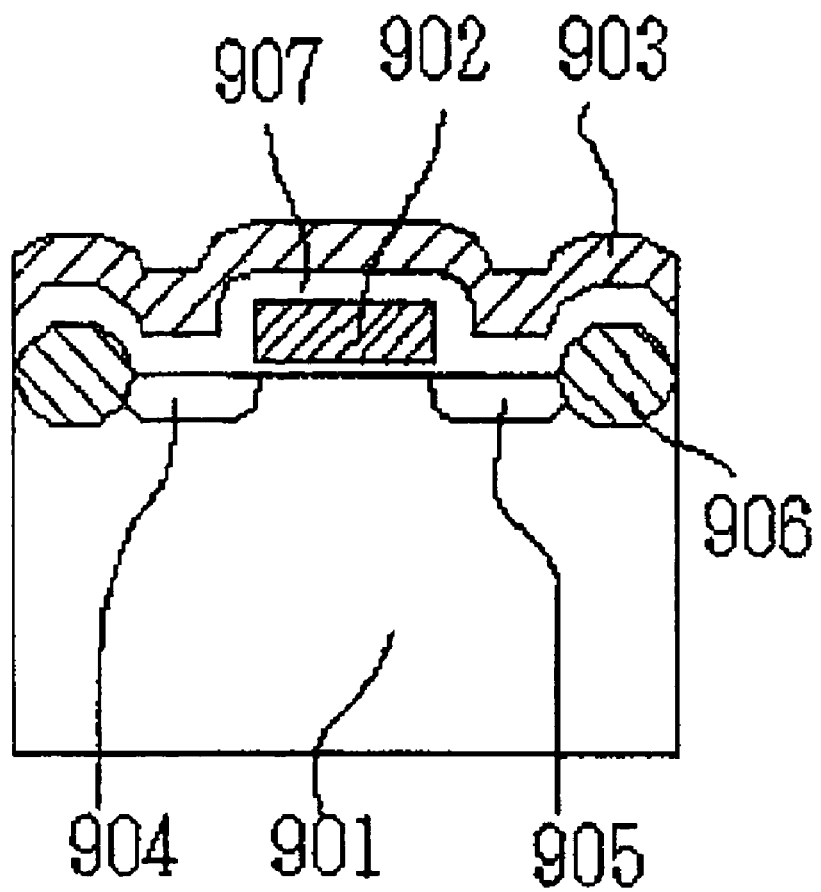
FIG. 30 is a schematic sectional view showing a main part of a conventional flash memory.

FIG. 29 shows a portable telephone as a portable electronic apparatus in which the semiconductor memory device is assembled.

The portable telephone is mainly configured by a control circuit 811, a battery 812, an RF (Radio Frequency) circuit 813, a display part 814, an antenna 815, a signal line 816, a power source line 817 and the like. In the control circuit 811, the semiconductor memory device of the present invention is assembled. The control circuit 811 is preferably an integrated circuit using cells having the same structure as a memory circuit cell and a logic circuit cell as described in the tenth embodiment. It facilitates fabrication of the integrated circuit, and the manufacturing cost of the portable electronic apparatus can be particularly reduced.

By using the semiconductor memory device capable of performing high-speed reading operation and whose process of simultaneously mounting a memory part and a logic circuit part is easy for a portable electronic apparatus, the operation speed of the portable electronic apparatus is increased, and the manufacturing cost can be reduced. Thus, a cheap, high-reliability and high-performance portable electronic apparatus can be obtained.

Since the semiconductor memory device according to the present invention has the address processing mechanism which provides simultaneous execution of reading and writing on the N planes, in a period of the reading operation on one of the N planes, the writing operation can be performed on only arbitrary one of the other N-1 planes and, in a period of the writing operation on one of the N planes, the reading operation can be performed on only arbitrary one of the other N-1 planes. Thus, restrictions on the writing operation during the reading operation period and restrictions on the reading operation during the writing operation period are largely eased, and an application range of the semiconductor memory device is much widened.

In the memory cell, a memory function of the memory functional element and a transistor operation function of the gate insulating film are separated from each other. Consequently, it is possible to suppress the short channel effect by thinning the gate insulating film without deteriorating the memory function.

Further, a value of current flowing between the diffusion regions changes by rewriting more largely than that in the case of an EEPROM. Therefore, it facilitates discrimination between the programming state and the erasing state of the semiconductor memory device, and the reliability can be improved.

Further, the memory cell can be formed by a process which is very compatible with a normal transistor forming process. Therefore, as compared with the case of using a conventional flash memory as a nonvolatile memory cell and configuring the semiconductor memory device by the nonvolatile memory cell and an amplifier which is usually made by a transistor, the number of masks and the number of processes can be dramatically reduced. Consequently, the yield in manufacturing of a chip on which both of the amplifier and the nonvolatile memory cell are formed can be improved, the manufacturing cost is reduced and, accordingly, a very-reliable, cheap semiconductor memory device can be obtained.

In the case where the gate electrodes in a pair of memory cells integrally function as a word line and the memory functional elements in the pair of memory cells are integrally shared on both sides of the gate electrode, wiring for connecting the gate electrodes can be omitted and the packing density of the semiconductor memory device can be improved. It is unnecessary to separate the memory functional elements for each memory cell, so that the manufacturing process can be simplified.

In the case where the memory functional element is formed so that at least a part thereof overlaps with a part of the diffusion region, reading speed of the semiconductor memory device can be increased sufficiently high.

When the memory functional element includes a film having the function of retaining charges and having a surface almost parallel with a surface of the gate insulating film, variations in the memory effect of the memory cell can be reduced and variations in the read current of the semiconductor memory device can be suppressed. Since a characteristic change in the memory cell which is storing information can be reduced, the information retaining characteristic of the semiconductor memory device can be improved.

When the film having the function of retaining charges is disposed almost parallel with a side face of the gate electrode, rewriting speed of the memory cell increases, so that the rewriting operation of the semiconductor memory device can be performed at high speed.

In the case where the memory functional element includes an insulating film for separating between the film having the function of retaining charges and the channel region or the semiconductor layer, and the insulating film is thinner than the gate insulating film and has a thickness of 0.8 nm or more, the voltage in the programming and erasing operations of the semiconductor memory device can be lowered or the programming and erasing operations can be performed at higher speed. Since the memory effect of the memory cell increases, the reading speed of the semiconductor memory device can be increased.

In the case where the memory functional element includes an insulating film for separating between the film having the function of retaining charges and the channel region or the semiconductor layer, and the insulating film is thicker than the gate insulating film and has a thickness of 20 nm or less, the retaining characteristic can be improved without deteriorating the short channel effect of the memory cell. Consequently, even when the packing density of the semiconductor memory device is increased, sufficient retaining characteristic performance can be obtained.

The display of the present invention has the semiconductor memory device. Consequently, the nonvolatile memory cell can be used for storing information for correcting display variations after a display panel is manufactured, and the picture qualities of products of the displays can be made uniform. Moreover, a process of simultaneously forming the memory cell and the logic circuit part is simple, so that the manufacturing cost can be suppressed and a cheap and very-reliable display can be obtained.

Since the electronic apparatus, particularly, the portable electronic apparatus of the present invention has the semiconductor memory device, the process of simultaneously forming the memory part and the logic circuit part becomes easy. The operating speed of the electronic apparatus can be improved, and the manufacturing cost can be reduced. Moreover, the cheap and reliable display can be obtained.

Although the present invention has been described in terms of preferred embodiments, it will be appreciated that various modifications and alterations might be made by those skilled in the art without departing from the spirit and scope of the invention. The invention should therefore be measured in terms of the claims which follow.

What is claimed is:

1. A semiconductor memory device comprising:
   N planes of a memory cell array in which memory cells are arranged in a matrix; and
   an address processing mechanism for providing simultaneous execution of reading and writing on the N planes, wherein
   in the simultaneous execution, in a period of the reading operation on one of the N planes, the writing operation can be performed on only arbitrary one of the other N-1 planes, in a period of the writing operation on one of the N planes, the reading operation can be performed on only arbitrary one of the other N-1 planes,
   the address processing mechanism has: a control logic circuit for generating N read selection signals each selecting one of the N planes for the reading operation and N write selection signals each selecting one of the N planes for the writing operation; an address selection circuit disposed in each of the N planes; and an address buffer circuit for simultaneously providing a write address and a read address in order to access the memory cell array,
   each of the address selection circuits is configured so as to be able to receive one of the N read selection signals and one of the N write selection signals from the control logic circuit,
   a first part of each of the read address and the write address is supplied to the control logic circuit in order to generate the N read selection signals and the N write selection signals, a second part of each of the read address and the write address is supplied to each of the address selection circuits, and
   the memory cell includes a gate electrode formed over a semiconductor layer via a gate insulating film, a channel region disposed below the gate electrode, diffusion regions disposed on both sides of the channel region and having a conductive type opposite to that of the channel region, and memory functional units formed on both sides of the gate electrode and having the function of retaining charges.

2. The semiconductor memory device according to claim 1, further comprising:
   a write operation control circuit disposed in each of the N planes, wherein
   each of the write operation control circuits responds to one of the N write selection signals.

3. The semiconductor memory device according to claim 2, wherein
   the write operation control circuit executes the programming operation.

4. The semiconductor memory device according to claim 2, wherein
   the write operation control circuit executes an erasing operation.

5. The semiconductor memory device according to claim 2, wherein
   the write operation control circuit executes a verifying operation.

6. The semiconductor memory device according to claim 1, further comprising:
   a read data bus disposed for each of the N planes, wherein
   the read data bus is connected to a sense amplifier in response to one of the N read selection signals.

7. The semiconductor memory device according to claim 1, further comprising:
   a read data bus disposed for each of the N planes, wherein
   when one of the N read selection signals indicates reading of the plane for which the read data bus is disposed, the read data bus is switchably connected to the sense amplifier.

8. The semiconductor memory device according to claim 1, further comprising
   a write data bus disposed for each of the N planes, wherein
   the write data bus is connected to a sense amplifier in response to one of the N write selection signals.

9. The semiconductor memory device according to claim 1, wherein
   the memory functional element is formed so that at least a part thereof overlaps with a part of the diffusion region.

10. The semiconductor memory device according to claim 1, wherein
    the memory functional element includes a film having the function of retaining charges, and
    a surface of the film having the function of retaining charges is disposed almost parallel with a surface of the gate insulating film.

11. The semiconductor memory device according to claim 10, wherein
    the film having the function of retaining charges is disposed almost parallel with a side face of the gate electrode.

12. The semiconductor memory device according to claim 10, wherein
    the memory functional element includes an insulating film for separating between the film having the function of retaining charges and the channel region or the semiconductor layer, and
    the insulating film is thinner than the gate insulating film and has a thickness of 0.8 nm or more.

13. The semiconductor memory device according to claim 10, wherein
    the memory functional element includes an insulating film for separating between the film having the function of retaining charges and the channel region or the semiconductor layer, and
    the insulating film is thicker than the gate insulating film and has a thickness of 20 nm or less.

14. A display comprising the semiconductor memory device according to claim 1.

15. A portable electronic apparatus comprising the semiconductor memory device according to claim 1.

* * * * *